(12) United States Patent
Hatanaka et al.

(10) Patent No.: US 9,383,492 B2
(45) Date of Patent: Jul. 5, 2016

(54) ELLIPTICAL POLARIZATION PLATE

(71) Applicant: SUMITOMO CHEMICAL COMPANY, LIMITED, Chuo-ku, Tokyo (JP)

(72) Inventors: Nobuyuki Hatanaka, Osaka (JP); Akira Yokota, Osaka (JP); Tadahiro Kobayashi, Osaka (JP); Mitsutaka Sase, Niihama (JP); Yoshifumi Komatsu, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 148 days.

(21) Appl. No.: 14/454,288

(22) Filed: Aug. 7, 2014

(65) Prior Publication Data

US 2015/0042942 A1    Feb. 12, 2015

(30) Foreign Application Priority Data

| Aug. 9, 2013 | (JP) | 2013-165945 |
| Sep. 10, 2013 | (JP) | 2013-187059 |
| Jan. 31, 2014 | (JP) | 2014-017303 |

(51) Int. Cl.
*G02B 5/30* (2006.01)
*H01L 51/52* (2006.01)

(52) U.S. Cl.
CPC ............. *G02B 5/3016* (2013.01); *G02B 5/305* (2013.01); *G02B 5/3083* (2013.01); *B32B 2307/42* (2013.01); *B32B 2457/20* (2013.01); *H01L 51/5281* (2013.01)

(58) Field of Classification Search
CPC ..... G02F 1/13; G02F 1/13363; G02F 1/1333; G02F 1/133345; G02F 1/133528; G02F 1/133634; G02F 1/1335; G02F 2001/133637; G02F 2001/133531; G02F 2001/133638; G02F 2001/133541; G02F 2202/40; G02F 2413/01; G02F 2201/50; G02B 5/3083; G02B 5/3016; G02B 5/305; G02B 5/30; G02B 1/04; G02B 1/08; G02B 1/11; Y10T 428/1036; Y10T 428/1041; Y10T 428/31507
USPC ........... 349/117, 96, 118, 194, 119, 121, 193, 349/138, 122, 69; 359/489.07, 483.01, 359/489.2, 489.02, 489.01; 428/1.1, 1.31, 428/1.3, 917; 156/324
See application file for complete search history.

(56) References Cited

U.S. PATENT DOCUMENTS

| 5,730,903 A | 3/1998 | Okazaki |
| 6,400,433 B1 | 6/2002 | Arakawa et al. |

(Continued)

FOREIGN PATENT DOCUMENTS

| JP | 50-83482 | 7/1975 |
| JP | 2-113920 A | 4/1990 |

(Continued)

OTHER PUBLICATIONS

Notice of Reasons for Rejection issued Mar. 3, 2015 in corresponding Japanese Patent Application No. 2014-161220 with translation.

(Continued)

*Primary Examiner* — Thoi Duong
(74) *Attorney, Agent, or Firm* — Sughrue Mion, PLLC

(57) ABSTRACT

To provide an elliptical polarization plate excellent in suppression of coloration and light leakage in display. An elliptical polarization plate having a transparent protective film pasted to one surface of a polarizer and an optically anisotropic film pasted to the other surface thereof, wherein, when measured under condition of incident polarization in the film normal direction from the side of the transparent protective film, the visibility corrected single body transmittance is 43.0% or more, the visibility corrected polarization degree is 95.0% or more, the single body hue value a* is −2.0 to 1.0 and the single body hue value b* is −1.0 to 5.0, and the optically anisotropic film satisfies the formulae (1), (2) and (3):

$$Re(450)/Re(550) \leq 1.00 \quad (1)$$

$$1.00 \leq Re(650)/Re(550) \quad (2)$$

$$100 < Re(550) < 160 \quad (3).$$

11 Claims, 6 Drawing Sheets

(56) References Cited

U.S. PATENT DOCUMENTS

| | | | |
|---|---|---|---|
| 6,565,974 B1 | 5/2003 | Uchiyama et al. | |
| 7,602,462 B2 | 10/2009 | Koishi et al. | |
| 8,323,527 B2 | 12/2012 | Adlem et al. | |
| 8,383,212 B2 | 2/2013 | Obata et al. | |
| 8,545,970 B2 | 10/2013 | Doi et al. | |
| 2004/0109114 A1 | 6/2004 | Takeuchi et al. | |
| 2008/0158490 A1* | 7/2008 | Nakayama | B29C 55/08 349/117 |
| 2008/0297703 A1 | 12/2008 | Kawanishi et al. | |
| 2012/0008224 A1 | 1/2012 | Uchida | |
| 2012/0314159 A1 | 12/2012 | Sakai | |

FOREIGN PATENT DOCUMENTS

| | | |
|---|---|---|
| JP | 6-34976 A | 2/1994 |
| JP | 7-30637 A | 1/1995 |
| JP | 7-258170 A | 10/1995 |
| JP | 7-309807 A | 11/1995 |
| JP | 8-231470 A | 9/1996 |
| JP | 10-068816 A | 3/1998 |
| JP | 10-90521 A | 4/1998 |
| JP | 2000-206331 A | 7/2000 |
| JP | 2001-4837 A | 1/2001 |
| JP | 2001-21720 A | 1/2001 |
| JP | 2004-126538 A | 4/2004 |
| JP | 2004-325480 A | 11/2004 |
| JP | 2005-70140 A | 3/2005 |
| JP | 2005-208456 A | 8/2005 |
| JP | 2005-266323 A | 9/2005 |
| JP | 2005-326713 A | 11/2005 |
| JP | 2006-163065 A | 6/2006 |
| JP | 2006-215221 A | 8/2006 |
| JP | 2006-268018 A | 10/2006 |
| JP | 2007-206605 A | 8/2007 |
| JP | 2007-232935 A | 9/2007 |
| JP | 2007-292944 A | 11/2007 |
| JP | 2008-505195 A | 2/2008 |
| JP | 2008-129465 A | 6/2008 |
| JP | 2010-31223 A | 2/2010 |
| JP | 2010-270108 A | 12/2010 |
| JP | 2010-537955 A | 12/2010 |
| JP | 2011-6360 A | 1/2011 |
| JP | 2011-207765 A | 10/2011 |
| JP | 2011-242743 A | 12/2011 |
| JP | 2012-33249 A | 2/2012 |
| JP | 2012-255926 A | 12/2012 |
| WO | 00/26705 A1 | 5/2000 |

OTHER PUBLICATIONS

Communication dated Jun. 30, 2015 from the Japanese Patent Office in counterpart application No. 2014-161220.

"Handbook of Liquid Crystals", Chapter 3.8.6. Network (Fully Cross-Linked), 6.5.1. Liquid Crystal Material, b. Polymerizable Nematic Liquid Crystal Material, edited by Ekisho Binran Henshu linkai, Maruzen, Oct. 30, 2000.

"Liquid Crystal Device Handbook", Chapter 3, 4-3, Chiral Agents for TN and STN, p. 199, edited by Japan Society for the Promotion of Science, 142 Committee, 1989.

* cited by examiner

Fig. 1
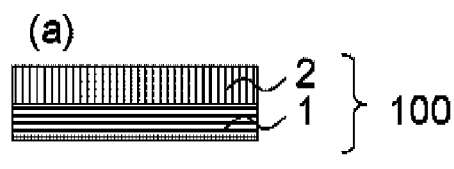
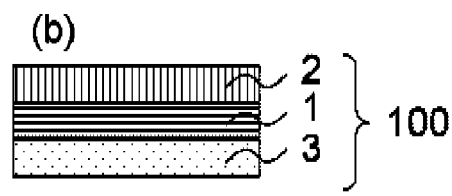
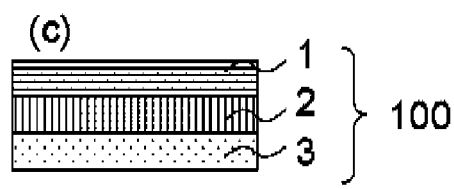
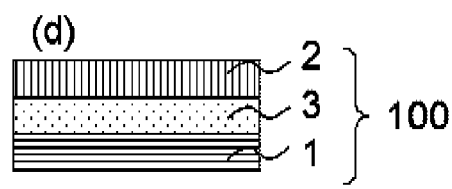
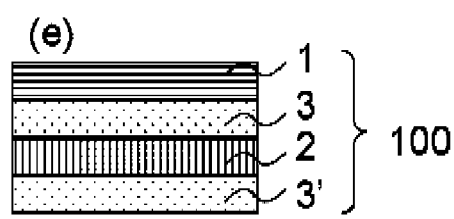
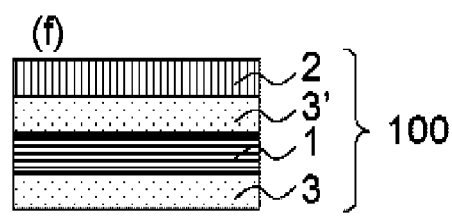
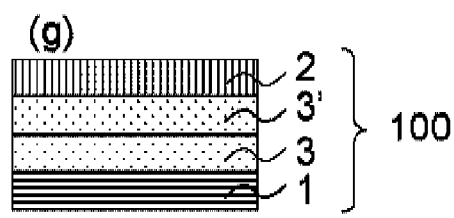

Fig. 6
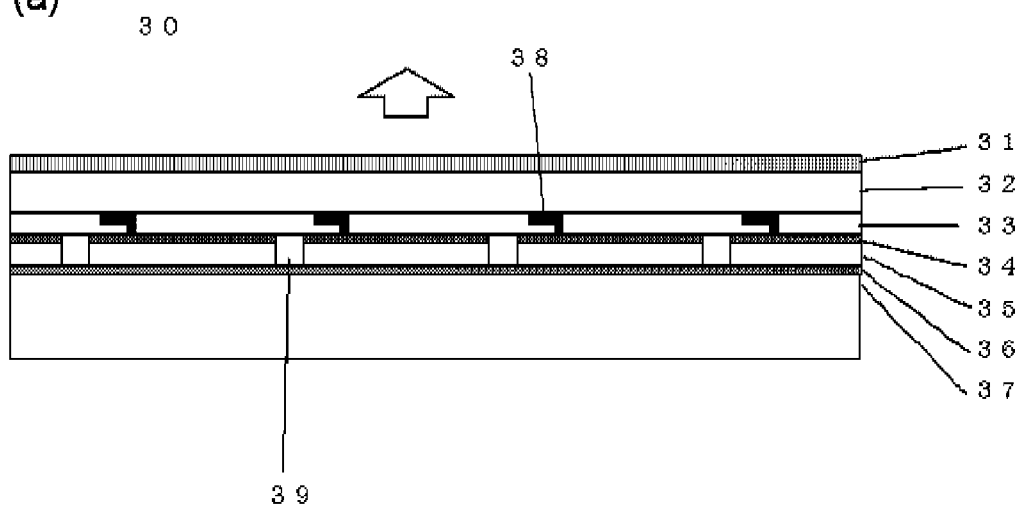
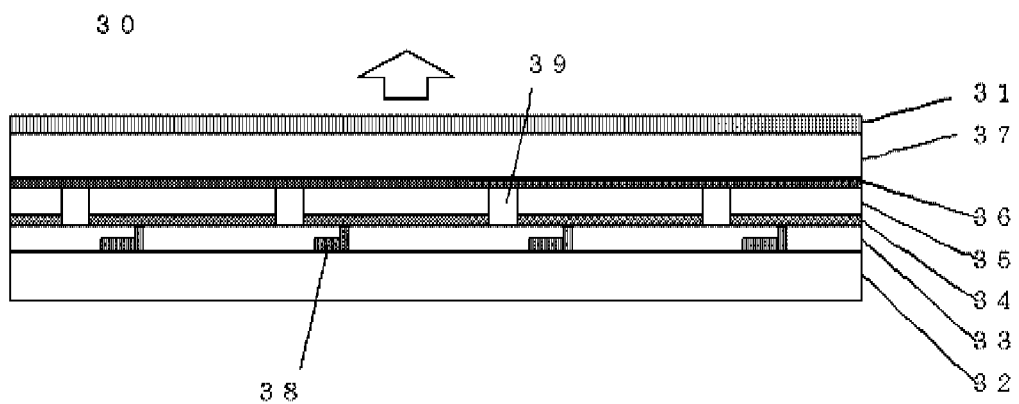

ELLIPTICAL POLARIZATION PLATE

CROSS REFERENCE TO RELATED APPLICATIONS

This application is claiming priority based on Japanese Patent Application Nos. 2013-165945, filed Aug. 9, 2013, 2013-187059, filed Sep. 10, 2013 and 2014-017303, filed Jan. 31, 2014, the contents of all of which are incorporated herein by reference in their entirety.

TECHNICAL FIELD

The present invention relates to an elliptical polarization plate.

BACKGROUND ART

In a flat panel display (FPD), members containing an optical film such as polarization plates, phase difference plates and the like are used. As such an optical film, an optical film produced by coating a composition containing a polymerizable liquid crystal on a base material is known, and it is known that a function as an elliptical polarization plate is obtained by combining with a polarization plate. For example, patent document 1 describes an elliptical polarization plate used for optical compensation of a display.

PRIOR ART DOCUMENT

Patent Document (Patent Document 1) JP-A No. 2007-232935

SUMMARY OF THE INVENTION

Problem to be Solved by the Invention

However, conventional elliptical polarization plates have not been sufficient in an optical compensation property of suppressing coloration and light leakage in display.

Means for Solving the Problem

The present invention includes the following inventions.

[1] An elliptical polarization plate having a transparent protective film pasted to one surface of a polarizer and an optically anisotropic film pasted to the other surface thereof, wherein, when measured under condition of incident polarization in the film normal direction from the side of the transparent protective film, the visibility corrected single body transmittance is 43.0% or more, the visibility corrected polarization degree is 95.0% or more, the single body hue value a* is −2.0 to 1.0, and
the single body hue value b* is −1.0 to 5.0,
and the optically anisotropic film satisfies the formulae (1), (2) and (3):

$$Re(450)/Re(550) \leq 1.00 \tag{1}$$

$$1.00 \leq Re(650)/Re(550) \tag{2}$$

$$100 < Re(550) < 160 \tag{3}$$

(wherein, Re(450) represents the in-plane phase difference value at a wavelength of 450 nm, Re(550) represents the in-plane phase difference value at a wavelength of 550 nm, and Re(650) represents the in-plane phase difference value at a wavelength of 650 nm.).

[2] The elliptical polarization plate according to [1], wherein the optically anisotropic film has a coating layer formed by polymerizing a polymerizable liquid crystal.

[3] The elliptical polarization plate according to [1] or [2], wherein the optically anisotropic film has two coating layers.

[4] The elliptical polarization plate according to any one of [1] to [3], wherein the optically anisotropic film has a coating layer satisfying the following formula (4):

$$nx \approx ny < nz \tag{4}$$

(wherein, nx represents the principal refractive index in a direction parallel to the film plane in an index ellipsoid formed by a phase difference layer. ny represents the refractive index in a direction parallel to the film plane and orthogonally crossing the direction of nx in an index ellipsoid formed by a phase difference layer. nz represents the refractive index in a direction vertical to the film plane in an index ellipsoid formed by a phase difference layer.).

[5] The elliptical polarization plate according to any one of [1] to [4], wherein the optically anisotropic film has three or more coating layers.

[6] The elliptical polarization plate according to any one of [1] to [5], wherein the optically anisotropic film has a coating layer formed by polymerizing a polymerizable liquid crystal on a drawn film.

[7] The elliptical polarization plate according to any one of [2] to [6], wherein the thickness of the coating layer is 5 μm or less.

[8] The elliptical polarization plate according to any one of [4] to [7], wherein the thickness of the coating layer satisfying the formula (4) is 2 μm or less.

[9] A method of producing the elliptical polarization plate according to any one of [11] to [8], wherein a long polarizer, a long transparent protective film and a long optically anisotropic film are pasted continuously.

[10] An organic EL display having the elliptical polarization plate according to any one of [1] to [8].

[11] An organic EL display equipped with touch panel, having the elliptical polarization plate according to any one of [1] to [8].

Effect of the Invention

According to the present invention, an elliptical polarization plate excellent in suppression of coloration and light leakage in display can be provided.

BRIEF EXPLANATION OF DRAWINGS

FIGS. 1(a)-1(g) are each a schematic cross-sectional view of an optically anisotropic film in the present invention.

FIGS. 6(a)-6(b) are each a schematic view of an organic EL display containing an elliptical polarization plate of the present invention.

MODES FOR CARRYING OUT THE INVENTION

Figure 2:
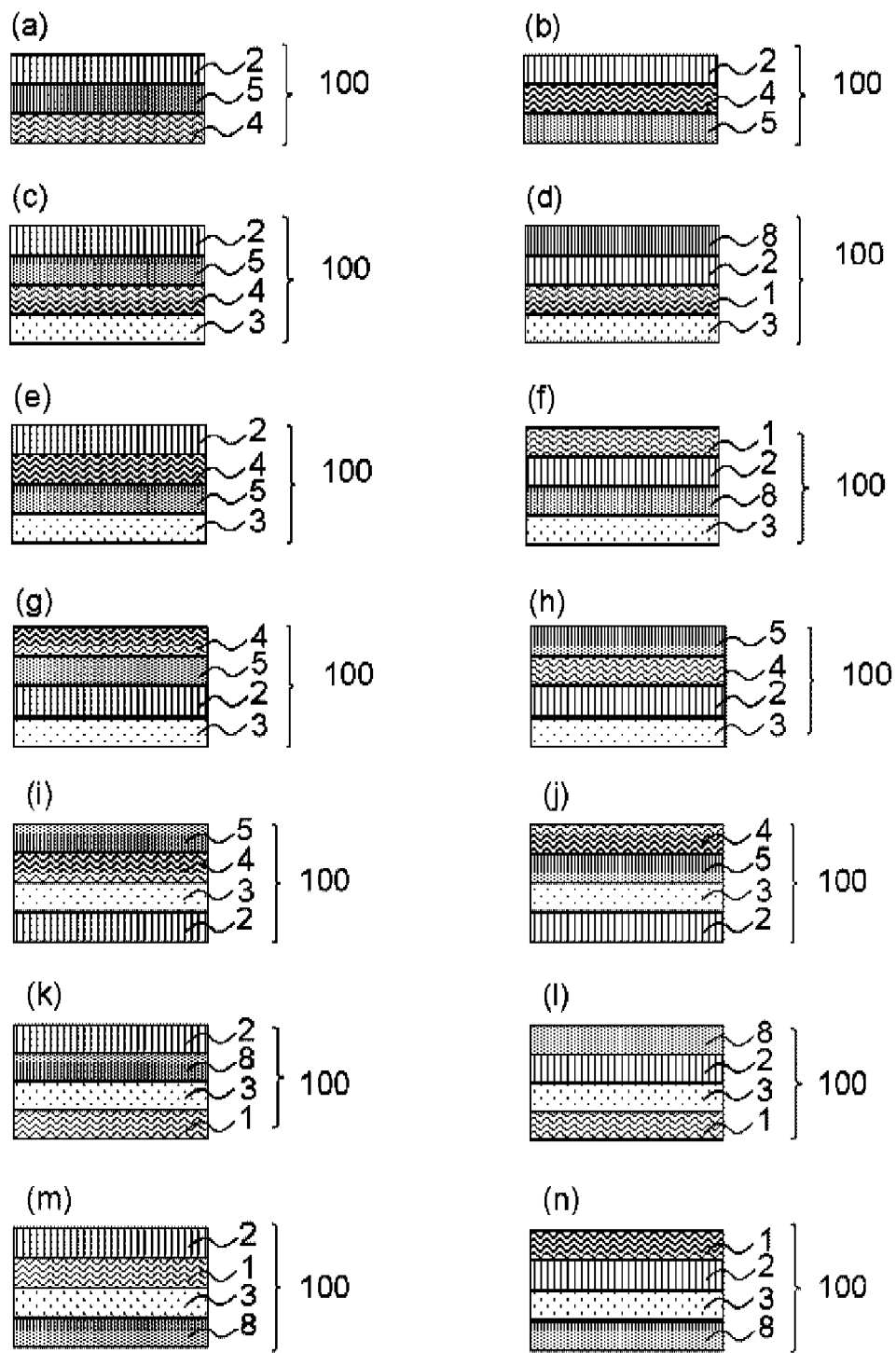
FIGS. 2(a)-2(n) are each a schematic cross-sectional view of an optically anisotropic film in the present invention.

The elliptical polarization plate of the present invention (hereinafter, referred to as the present elliptical polarization plate in some case) is an elliptical polarization plate having a transparent protective film pasted to one surface of a polarizer and an optically anisotropic film pasted to the other surface thereof, wherein, when measured under condition of incident polarization in the film normal direction from the side of the transparent protective film, the visibility corrected single body transmittance is 43.0% or more, the visibility corrected polarization degree is 95.0% or more, the single body hue value a* is −2.0 to 1.0 and the single body hue value b* is −1.0 to 5.0, and the optically anisotropic film satisfies the formulae (1), (2) and (3).

When the visibility corrected single body transmittance, the visibility correoted polarization degree, the single body hue value a* and the single body hue value b* are within the above-described ranges, an elliptical polarization plate excellent in suppression of coloration in white display in displays such as an organic EL display and the like can be obtained.

Here, linear polarization from a prism is rendered incident on the elliptical polarization plate from the side of the transparent protective film, and the visibility corrected single body transmittance, the visibility corrected polarization degree and the single body hues of the elliptical polarization plate can be measured by using a spectrophotometer equipped with integrating sphere. The visibility corrected values denote values obtained by correcting the calculated single body transmittance and polarization degree by two-degree field (C light source) in JISZ8701 and the single body hue means the hue of light penetrating from other surface when natural light is rendered incident on a piece of the elliptical polarization plate, though details thereof are described later.

The visibility corrected single body transmittance, the visibility corrected polarization degree and the single body hue of an elliptical polarization plate are affected by the optical property of a polarizer. The single body hue value a* and the single body hue value b* are affected by the method of dyeing a dichroic pigment and the method of drying in production of a polarizer. The single body hue value a* and the single body hue value b* of a polarizer can be adjusted by changing the ratio of iodine to KI in a dyeing bath in dyeing of a dichroic pigment or regulating the ratio of a I5-PVA complex and a I3-PVA complex by reinforcing drying, and the like. Further, the single body transmittance can be controlled by changing the iodine concentration in PVA dyeing, the dyeing time or the temperature in dyeing.

When the optically anisotropic film is a layer formed by polymerizing a polymerizable liquid crystal, if the layer formed by polymerizing a polymerizable liquid crystal is colored, the values of a* and b* increase. When the optically anisotropic film is formed from a drawn film, if the absorption wavelength of a resin forming the drawn film reaches the visible region, the values of a* and b* increase. That is, for controlling the single body hue, it is advantageous to use the material so that absorption of the polymerizable liquid crystal and a side chain of the resin in the visible region is as low as possible, and to make a control so that transparency is kept also in film formation.

When liquid crystal orientation has a variability and also when interior haze is present, light scattering and depolarization occur, and resultantly, a transmittance property is influenced. Therefore, a transmittance property can be controlled by conducting polymerization under condition wherein fluctuation of a polymerizable liquid crystal is suppressed, or by enhancing orientation of a liquid crystal by adopting a composition not disturbing orientation, and the like Also the visibility corrected polarization degree can be controlled in the same manner as for the transmittance.

<Polarizer>

The polarization plate may advantageously be a film having a polarization function. This film includes a drawn film containing an adsorbed pigment having absorption anisotropy, a film containing as a polarizer a film coated with a pigment having absorption anisotropy, and the like. The pigment having absorption anisotropy includes, for example, dichroic pigments.

The film containing as a polarizer a drawn film containing an adsorbed pigment having absorption anisotropy is usually produced via a step of uniaxially drawing a polyvinyl alcohol resin film, a step of dyeing the polyvinyl alcohol resin film with a dichroic pigment to allow the dichroic pigment to be adsorbed, a step of treating the polyvinyl alcohol resin film containing the adsorbed dichroic pigment with a boric acid aqueous solution and a step of performing washing with water after the treatment with a boric acid aqueous solution. A polarization plate is fabricated by applying a transparent protective film via an adhesive to at least one surface of a polarizer.

The polyvinyl alcohol resin is obtained by saponifying a polyvinyl acetate resin. As the polyvinyl acetate resin, copolymers of vinyl acetate and other monomers copolymerizable with vinyl acetate are used, in addition to polyvinyl acetate as a homopolymer of vinyl acetate. The other monomers copolymerizable with vinyl acetate include, for example, unsaturated carboxylic acids, olefins, vinyl ethers, unsaturated sulfonic acids, acrylamides having an ammonium group, and the like.

The degree of saponification of the polyvinyl alcohol resin is usually about 85 to 100 mol %, preferably 98 mol % or more. The polyvinyl alcohol resin may be modified, and for example, polyvinylformal and polyvinylacetal modified with aldehydes can also be used. The degree of polymerization of the polyvinyl alcohol resin is usually about 1000 to 10000, preferably in the range of 1500 to 5000.

A film formed of such a polyvinyl alcohol resin is used as an original film of a polarizer. The method of forming a film of a polyvinyl alcohol resin is not particularly restricted, and its film formation can be conducted by known methods. The thickness of a polyvinyl alcohol original film can be, for example, about 10 to 150 μm.

Uniaxial drawing of a polyvinyl alcohol resin film can be conducted before dyeing with a dichroic pigment, simultaneously with dyeing or after dyeing. When uniaxial drawing is conducted after dyeing, this uniaxial drawing may be conducted before a boric acid treatment or conducted during a boric acid treatment. Further, it is also possible to perform uniaxial drawing in these several stages. In uniaxial drawing, drawing may be conducted uniaxially between rolls having different circumferential velocities, or drawing may be conducted uniaxially using a hot roll. Uniaxial drawing may be dry drawing in which drawing is conducted in atmospheric air or may be wet drawing in which a polyvinyl alcohol resin film is swollen and drawn under the swollen condition. The drawing magnification is usually about 3 to 8 times.

Dyeing of a polyvinyl alcohol resin film with a dichroic pigment is carried out, for example, by a method of immersing a polyvinyl alcohol resin film in an aqueous solution containing a dichroic pigment. As the dichroic pigment, specifically, iodine and dichroic organic dyes are used. The dichroic organic dye includes dichroic direct dyes composed of a disazo compound such as C.I. DIRECT RED 39 and the like and dichroic direct dyes composed of a compound such as trisazo, tetrakisazo and the like. It is preferable that a polyvinyl alcohol resin film is subjected previously to a treatment of immersing into water before the dyeing treatment.

When iodine is used as the dichroic pigment, a method of immersing a polyvinyl alcohol resin film in an aqueous solution containing iodine and potassium iodide to dye the film is usually adopted. The content of iodine in this aqueous solution is usually about 0.01 to 1 part by mass per 100 parts by mass of water. The content of potassium iodide is usually about 0.5 to 20 parts by mass per 100 parts by mass of water. The temperature of an aqueous solution used for dyeing is usually about 20 to 40° C. The time of immersion into this aqueous solution (dyeing time) is usually about 20 to 1800 seconds.

In contrast, when a dichroic organic dye is used as the dichroic pigment, a method of immersing a polyvinyl alcohol resin film in an aqueous solution containing a water-soluble dichroic dye to dye the film is usually adopted. The content of a dichroic organic dye in this aqueous solution is usually about $1 \times 10^{-4}$ to 10 parts by mass, preferably $1 \times 10^{-3}$ to 1 part by mass, further preferably $1 \times 10^{-3}$ to $1 \times 10^{-2}$ part by mass per 100 parts by mass of water. This aqueous solution may also contain an inorganic salt such as sodium sulfate as a dyeing aid. The temperature of a dichroic dye aqueous solution used for dyeing is usually about 20 to 80° C. The time of immersing into this aqueous solution (dyeing time) is usually about 10 to 1800 seconds.

The boric acid treatment after dyeing with a dichroic pigment can be conducted usually by a method of immersing the dyed polyvinyl alcohol resin film in a boric acid aqueous solution. The content of boric acid in this boric acid aqueous solution is usually about 2 to 15 parts by mass, preferably 5 to 12 parts by mass per 100 parts by mass of water. When iodine is used as the dichroic pigment, it is preferable that this boric acid aqueous solution contains potassium iodide, and in this case, the content of potassium iodide is usually about 0.1 to 15 parts by mass, preferably 5 to 12 parts by mass per 100 parts by mass of water. The time of immersing into a boric acid aqueous solution is usually about 60 to 1200 seconds, preferably 150 to 600 seconds, further preferably 200 to 400 seconds. The temperature of the boric acid treatment is usually 50° C. or more, preferably 50 to 85° C., further preferably 60 to 80° C.

The polyvinyl alcohol resin film after the boric acid treatment is usually treated by washing with water. The water-washing treatment can be conducted, for example, by a method of immersing the polyvinyl alcohol resin film treated with boric acid in water. The temperature of water in the water-washing treatment is usually about 5 to 40° C. The immersing time is usually about 1 to 120 second.

After washing with water, a drying treatment is performed to obtain a polarizer. The drying treatment can be conducted by using, for example, a hot air drier and a far infrared heater. The temperature of the drying treatment is usually about 30 to 100° C., preferably 50 to 80° C. The time of the drying treatment is usually about 60 to 600 seconds, preferably 120 to 600 seconds. By the drying treatment, the moisture percentage of a polarizer is lowered to about practical level. Its moisture percentage is usually about 5 to 20 wt %, preferably 8 to 15 wt %. When the moisture percentage is lower than 5 wt %, flexibility of a polarizer is lost, and a polarizer is damaged or broken after drying in some cases. When the moisture percentage is over 20 wt %, there is a possibility of deterioration of thermal stability of a polarizer.

The thickness of a polarizer obtained by thus subjecting a polyvinyl alcohol resin film to uniaxial drawing, dyeing with a dichroic pigment, a boric acid treatment, washing with water and drying is preferably 5 to 40 μm.

The film coated with a pigment having absorption anisotropy includes films obtained by coating a composition containing a dichroic pigment having liquid crystallinity or a composition containing a dichroic pigment and a polymerizable liquid crystal, and the like. This film preferably has a protective film on one surface or both surfaces thereof. As the protective film, the same materials as the base material described above are mentioned.

With respect to the film coated with a pigment having absorption anisotropy, the smaller thickness is more preferable, however, when too thin, there is a tendency of lowering of strength, leading to poor workability. The thickness of this film is usually 20 μm or less, preferably 5 μm or less, more preferably 0.5 μm or more and 3 μm or less.

The film coated with a pigment having absorption anisotropy includes, specifically, films described in JP-A No. 2012-33249 and the like.

A polarization plate is obtained by laminating a transparent protective film on at least one surface of thus obtained polarizer via an adhesive.

[Optically Anisotropic Film]

The optically anisotropic film in the present invention preferably has optical properties represented by the following formulae (1), (2) and (3).

$$Re(450)/Re(550) \leq 1.00 \tag{1}$$

$$1.00 \leq Re(650)/Re(550) \tag{2}$$

$$100 < Re(550) < 160 \tag{3}$$

In the present specification, Re(450) represents the in-plane phase difference value at a wavelength of 450 nm, Re(550) represents the in-plane phase difference value at a wavelength of 550 nm, and Re(650) represents the in-plane phase difference value at a wavelength of 650 nm.

The present elliptical polarization plate having optical properties represented by the formula (1) and the formula (2) can be obtained by allowing an optically anisotropic film to have optical properties represented by the formula (1) and the formula (2). If the optically anisotropic film has optical properties represented by the formula (1) and the formula (2), a uniform polarization conversion property is obtained for lights of various wavelengths in the visible light range and light leakage of a display such as an organic EL display or the like in black display can be suppressed.

The optically anisotropic film includes, for example, a layer formed by polymerizing a polymerizable liquid crystal and a drawn film. The optical property of an optically anisotropic film can be adjusted by the orientation state of a polymerizable liquid crystal and a drawing method of a drawn film, and in the present invention, it is preferable that the optically anisotropic film is a coating layer formed by polymerizing a polymerizable liquid crystal (hereinafter, referred to as optically anisotropic layer in some cases).

The polymerizable liquid crystal manifesting the formula (1) and the formula (2) includes, for example, polymerizable liquid crystals (A) described later. An optically anisotropic film having optical properties represented by the formula (1) and the formula (2) can be obtained by orienting a polymerizable liquid crystal (A) so that its optical axis is horizontal to the base material plane. Further, an optically anisotropic film having the desired in-plane phase difference value such as, for example, an optical property represented by the formula (3) and the like can be obtained by regulating the thickness of the optically anisotropic film (hereinafter, the optically anisotropic layer satisfying the formulae (1), (2) and (3) is referred to as a first optically anisotropic layer in some cases).

$$100 < Re(550) < 160 \tag{3}$$

The in-plane phase difference value of an optically anisotropic film can be regulated by the thickness of the optically anisotropic film. Since the in-plane phase difference value is determined by the formula (10), it is advantageous to regulate $\Delta n(\lambda)$ and the film thickness d for obtaining the desired in-plane phase difference value ($Re(\lambda)$).

$$Re(\lambda)=d\times\Delta n(\lambda) \quad (10)$$

In the formula, $Re(\lambda)$ represents the in-plane phase difference value at a wavelength of $\lambda$ nm, d represents the film thickness, and $\Delta n(\lambda)$ represents the birefringence at a wavelength of $\lambda$ nm.

The birefringence $\Delta n(\lambda)$ is obtained by measuring the in-plane phase difference value and dividing the measured value by the thickness of an optically anisotropic film. The specific measuring method is shown in examples, and on this occasion, the substantial property of an optically anisotropic film can be measured by measuring one formed on a base material having itself no in-plane phase difference such as a glass base plate.

<Layer Formed by Polymerizing Polymerizable Liquid Crystal>

In the present invention, orientation of the optical axis of a polymerizable liquid crystal horizontally to the base material plane is defined as horizontal orientation, and orientation of the optical axis of a polymerizable liquid crystal vertical to the base material plane is defined as vertical orientation. The optical axis denotes a direction in which the cross-section of an index ellipsoid formed by orientation of a polymerizable liquid crystal cut in a direction orthogonally crossing the optical axis is circle, namely a direction in which refractive indices in three directions are all equivalent.

The polymerizable liquid crystal includes rod-shaped polymerizable liquid crystals and disk-shaped polymerizable liquid crystals.

When the rod-shaped polymerizable liquid crystal is oriented horizontally to or oriented vertically to a base material, the optical axis of the polymerizable liquid crystal coincides with the direction of the long axis of the polymerizable liquid crystal.

When the disk-shaped polymerizable liquid crystal is oriented, the optical axis of the polymerizable liquid crystal exists in a direction orthogonally crossing the disk surface of the polymerizable liquid crystal.

For the layer formed by polymerizing a polymerizable liquid crystal to manifest in-plane phase difference, it is advantageous that a polymerizable liquid crystal is oriented to a suitable direction. When the polymerizable liquid crystal is in the form of a rod, in-plane phase difference is manifested by orienting the optical axis of the polymerizable liquid crystal horizontally to the base material plane, and in this case, the direction of the optical axis and the direction of the slow axis coincide with each other. When the polymerizable liquid crystal is in the form of a disk, in-plane phase difference is manifested by orienting the optical axis of the polymerizable liquid crystal horizontally to the base material plane, and in this case, the optical axis and the slow axis cross orthogonally. The orientation state of a polymerizable liquid crystal can be adjusted by a combination of the oriented film and the polymerizable liquid crystal.

In the present invention, refractive indices in three directions in an index ellipsoid formed by orientation of a polymerizable liquid crystal or drawing of a film are represented by nx, ny and nz. nx represents the principal refractive index in a direction parallel to the film plane in an index ellipsoid formed by an optically anisotropic film. ny represents the refractive index in a direction parallel to the film plane and orthogonally crossing the direction of nx in an index ellipsoid formed by an optically anisotropic film. nz represents the refractive index in a direction vertical to the film plane in an index ellipsoid formed by an optically anisotropic film.

When the optical axis of a rod-shaped polymerizable liquid crystal is oriented horizontally to the base material plane, the refractive index correlation of the resultant optically anisotropic layer is nx>ny≈nz (positive A plate) and the axis of the direction of nx in an index ellipsoid and the slow axis thereof coincide with each other.

When the optical axis of a disk-shaped polymerizable liquid crystal is oriented horizontally to the base material plane, the refractive index correlation of the resultant optically anisotropic layer is nx<ny≈nz (negative A plate) and the axis of the direction of ny in an index ellipsoid and the slow axis thereof coincide with each other.

<Polymerizable Liquid Crystal>

The polymerizable liquid crystal is a compound having a polymerizable group and having liquid crystallinity. The polymerizable group denotes a group correlated with a polymerization reaction, and is preferably a photopolymerizable group. Here, the photopolymerizable group denotes a group capable of being correlated with a polymerization reaction owing to an active radical, an acid and the like generated from a photopolymerization initiator described later. The polymerizable group includes a vinyl group, a vinyloxy group, a 1-chlorovinyl group, an isopropenyl group, a 4-vinylphenyl group, an acryloyloxy group, a methacryloyloxy group, an oxiranyl group, an oxetanyl group and the like. Of them, an acryloyloxy group, a methacryloyloxy group, a vinyloxy group, an oxiranyl group and an oxetanyl group are preferable, and an acryloyloxy group is more preferable. The crystallinity of the polymerizable liquid crystal may be thermotropic or lyotropic, and the thermotropic liquid crystal may be, if classified depending on the degree of order, a nematic liquid crystal or a smectic liquid crystal.

The rod-shaped polymerizable liquid crystal includes, for example, compounds represented by the following formula (A) (hereinafter, referred to as polymerizable liquid crystal (A) in some cases) and compounds containing a group represented by the following formula (X) (hereinafter, referred to as polymerizable liquid crystal (B) in some cases).

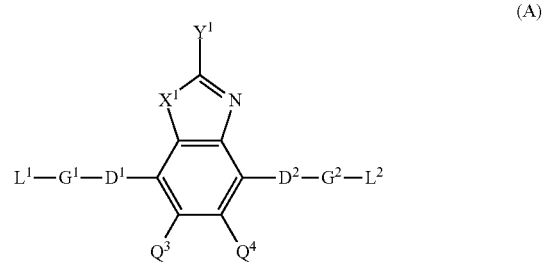

(A)

[in the formula (A), $X^1$ represents an oxygen atom, a sulfur atom or $NR^1$—$R^1$ represents a hydrogen atom or an alkyl group having 1 to 4 carbon atoms.

$Y^1$ represents a mono-valent aromatic hydrocarbon group having 6 to 12 carbon atoms and optionally carrying a substituent or a mono-valent aromatic heterocyclic group having 3 to 12 carbon atoms and optionally carrying a substituent.

$Q^3$ and $Q^4$ represent each independently a hydrogen atom, a mono-valent aliphatic hydrocarbon group having 1 to 20 carbon atoms and optionally carrying a substituent, a mono-valent alicyclic hydrocarbon group having 3 to 20 carbon atoms, a mono-valent aromatic hydrocarbon group having 6 to 20 carbon atoms and optionally carrying a substituent, a halogen atom, a cyano group, a nitro group, —$NR^2R^3$ or $SR^2$, alternatively $Q^3$ and $Q^4$ are mutually bonded to form an aromatic ring or an aromatic hetero ring together with a carbon atom to which they are attached. $R^2$ and $R^3$ represent each independently a hydrogen atom or an alkyl group having 1 to 6 carbon atoms.

$D^1$ and $D^2$ represent each independently a single bond, —C(=O)—O—, —C(=S)—O—, —$CR^4R^5$—, —$CR^4R^5$—$CR^6R^7$—, —O—$CR^4R^5$—, —$CR^4R^5$—O—$CR^6R^7$—, —CO—O—$CR^4R^5$—, —O—CO—$CR^4R^5$—, —$CR^4R^5$—O—CO—$CR^6R^7$—, —$CR^4R^5$—CO—O—$CR^6R^7$— or $NR^4$—$CR^5R^6$— or CO—$NR^4$—.

$R^4$, $R^5$, $R^6$ and $R^7$ represent each independently a hydrogen atom, a fluorine atom or an alkyl group having 1 to 4 carbon atoms.

$G^1$ and $G^2$ represent each independently a di-valent alicyclic hydrocarbon group having 5 to 8 carbon atoms, a methylene group constituting the alicyclic hydrocarbon group may be replaced by an oxygen atom, a sulfur atom or NH—, and a methine group constituting the alicyclic hydrocarbon group may be replaced by a tertiary nitrogen atom.

$L^1$ and $L^2$ represent each independently a mono-valent organic group, and at least one of $L^1$ and $L^2$ has a polymerizable group.]

In the polymerizable liquid crystal (A), $L^1$ is preferably a group represented by the formula (A1), and $L^2$ is preferably a group represented by the formula (A2).

P1-F1-(B1-A1)$k$-E1-         (A1)

P2-F2-(B2-A2)$l$-E2-         (A2)

[in the formula (A1) and the formula (A2),

B1, B2, E1 and E2 represent each independently —$CR^4R^5$—, —$CH_2$—$CH_3$—, —O—, —S—, —CO—O—, —O—CO—O—, —CS—O—, —O—CS—O—, —CO—$NR^1$—, —O—$CH_2$—, —S—$CH_2$— or a single bond.

A1 and A2 represent each independently a di-valent alicyclic hydrocarbon group having 5 to 8 carbon atoms or a di-valent aromatic hydrocarbon group having 6 to 18 carbon atoms, a methylene group constituting the alicyclic hydrocarbon group may be replaced by an oxygen atom, a sulfur atom or NH—, and a methine group constituting the alicyolic hydrocarbon group may be replaced by a tertiary nitrogen atom.

k and l represent each independently an integer of 0 to 3.

F1 and F2 represent a di-valent aliphatic hydrocarbon group having 1 to 12 carbon atoms.

P1 represents a polymerizable group.

P2 represents a hydrogen atom or a polymerizable group.

$R^4$ and $R^5$ represent each independently a hydrogen atom, a fluorine atom or an alkyl group having 1 to 4 carbon atoms.]

The preferable polymerizable liquid crystal (A) includes compounds described in Japanese Patent Application National Publication No. 2011-207765.

P11-B11-E11-B12-A11-B13-         (X)

[in the formula (X), P11 represents a polymerizable group.

A11 represents a di-valent alicyclic hydrocarbon group or a di-valent aromatic hydrocarbon group. A hydrogen atom contained in the di-valent alicyclic hydrocarbon group and the di-valent aromatic hydrocarbon group may be substituted by a halogen atom, an alkyl group having 1 to 6 carbon atoms, an alkoxy group having 1 to 6 carbon atoms, a cyano group or a nitro group, and a hydrogen atom contained in the alkyl group having 1 to 6 carbon atoms and the alkoxy group having 1 to 6 carbon atoms may be substituted by a fluorine atom.

B11 represents —O—, —S—, —CO—O—, —O—CO—, —O—CO—O—, —CO—$NR^{16}$—, —$NR^{16}$—CO—, —CO—, —CS— or a single bond. $R^{16}$ represents a hydrogen atom or an alkyl group having 1 to 6 carbon atoms.

B12 and B13 represent each independently —C≡C—, —CH=CH—, —$CH_2$—$CH_2$—, —O—, —S—, —C(=O)—, —C(=O)—O—, —O—C(=O)—, —O—C(=O)—O—, —CH=N—, —N=CH—, —N=N—, —C(=O)—$NR^{16}$—, —$NR^{16}$—C(=O)—, —$OCH_2$—, —$OCF_2$—, —$CH_2O$—, —$CF_2O$—, —CH=CH—C(=O)—O—, —O—C(=O)—CH=CH— or a single bond.

E11 represents an alkanediyl group having 1 to 12 carbon atoms, a hydrogen atom contained in the alkanediyl group may be substituted by an alkoxy group having 1 to 5 carbon atoms, and a hydrogen atom contained in the alkoxy group may be substituted by a halogen atom. —$CH_2$— constituting the alkanediyl group may be replaced by —O— or CO—.]

The number of carbon atoms of the aromatic hydrocarbon group and the alicyclic hydrocarbon group represented by A11 is preferably in the range of 3 to 18, more preferably in the range of 5 to 12, particularly preferably 5 or 6. All is preferably a cyclohexane-1,4-diyl group or a 1,4-phenylene group.

E11 is preferably a linear alkanediyl group having 1 to 12 carbon atoms. —$CH_2$— constituting the alkanediyl group may be replaced by —O—.

Specifically listed are linear alkanediyl groups having 1 to 12 carbon atoms such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group and the like; —$CH_2$—$CH_2$—O—$CH_2$—$CH_2$—, —$CH_2$—$CH_2$—O—$CH_2$—$CH_2$—O—$CH_2$—$CH_2$— and $CH_2$—$CH_2$—O—$CH_2$—$CH_2$—O—$CH_2$—$CH_2$—, and the like.

B11 is preferably —O—, —S—, —CO—O— or —O—CO—, and of them, —CO—O— is more preferable.

B12 and B13 preferably represent each independently —O—, —S—, —C(=O)—, —C(=O)—O—, —O—C(=O)— or —O—C(=O)—O—, and of them, —O— or —O—C(=O)—O— is more preferable.

The polymerizable group represented by P11 is preferably a radical polymerizable group or a cation polymerizable group because of high polymerization reactivity, particularly, high photopolymerization reactivity, and the polymerizable group includes preferably groups represented by the following formulae (P-11) to (P-15) since handling thereof is easy, and additionally, production itself of a liquid crystal compound is also easy.

(P-11)

(P-12)

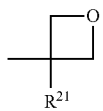
(P-13)

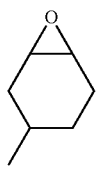
(P-14)

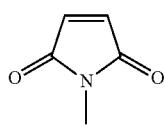
(P-15)

[in the formulae (P-11) to (P-15), $R^{17}$ to $R^{21}$ represent each independently an alkyl group having 1 to 6 carbon atoms or a hydrogen atom.]

Specific examples of the group represented by the formulae (P-11) to (P-15) include groups represented by the following formulae (P-16) to (P-20).

(P-16)

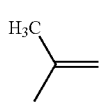
(P-17)

(P-18)

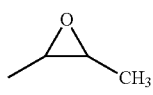
(P-19)

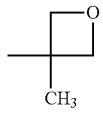
(P-20)

P11 is preferably a group represented by the formulae (P-14) to (P-20), and a vinyl group, a p-stilbene, an epoxy group or an oxetanyl group is more preferable.

It is further preferable that the group represented by P11-B11- is an acryloyloxy group or a methacryloyloxy group.

By orienting a polymerizable liquid crystal (A) so that its optical axis is horizontal to the base material plane, an optically anisotropic layer showing reciprocal wavelength dispersibility and having optical properties represented by the formula (1) and the formula (2) can be obtained in the form of a single layer.

The polymerizable liquid crystal (B) includes compounds represented by the formula (I), the formula (II), the formula (III), the formula (IV), the formula (V) or the formula (VI).

P11-B11-E11-B12-A11-B13-A12-B14-A13-B15-
A14-B16-E12-B17-P12   (I)

P11-B11-E11-B12-A11-B13-A12-B14-A13-B15-
E12-B17-P12   (II)

P11-B11-E11-B12-A11-B13-A12-B14-A13-B15-
E12-B17-P12   (III)

P11-B11-E11-B12-A11-B13-A12-B14-A13-F11   (IV)

P11-B11-E11-B12-A11-B13-A12-B14-E12-B17-P12   (V)

P11-B11-E11-B12-A11-B13-A12-F11   (VI)

(wherein,

A12 to A14 are each independently as defined for A11, B14 to B16 are each independently as defined for B12, B17 is as defined for B11, and E12 is as defined for E11.

F11 represents a hydrogen atom, an alkyl group having 1 to 13 carbon atoms, an alkoxy group having 1 to 13 carbon atoms, a cyano group, a nitro group, a trifluoromethyl group, a dimethylamino group, a hydroxy group, a methylol group, a formyl group, a sulfo group (—SO$_3$H), a carboxy group, an alkoxycarbonyl group having 1 to 10 carbon atoms or a halogen atom, and —CH$_2$-constituting the alkyl group and the alkoxy group may be replaced by —O—.)

Specific examples of the polymerizable liquid crystal (B) include compounds having a polymerizable group among compounds described in "3.8.6 Network (perfect cross-linked);" And "6.5.1 Liquid Crystal Material b. Polymerizable nematic liquid crystal material" of Liquid Crystal Handbook (Liquid Crystal Handbook Editorial Committee, ed., published on Oct. 30, 2000 by Maruzen), and polymerizable liquid crystals described in JP-A No. 2010-31223, JP-A No. 2010-270108, JP-A No. 2011-6360 and JP-A No. 2011-207765.

Specific examples of the polymerizable liquid crystal (B) include compounds represented by the following formulae (I-1) to (I-4), formulae (II-1) to (II-4), formulae (III-1) to (III-26), formulae (IV-1) to (IV-26), formulae (V-1) to (V-2) and formulae (VI-1) to (VI-6). In the following formulae, k1 and k2 represent each independently an integer of 2 to 12. These polymerizable liquid crystals (B) are preferable from the standpoint of easiness of synthesis thereof or easy availability.

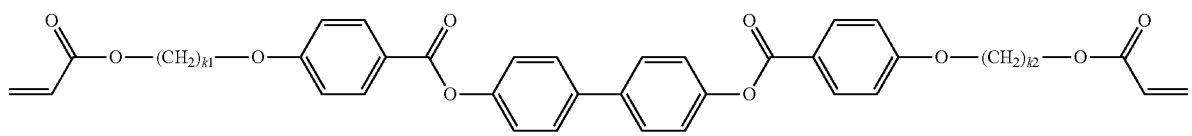
(I-1)

-continued
(I-2)
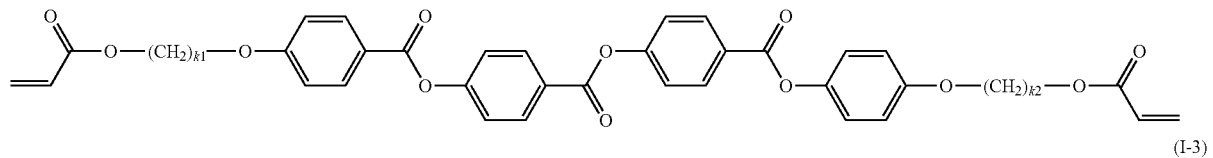
(I-3)
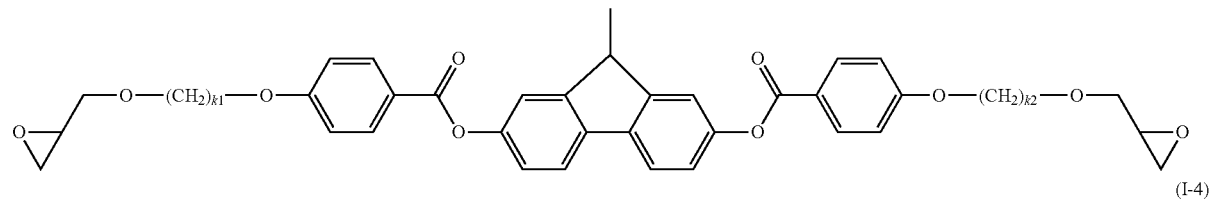
(I-4)
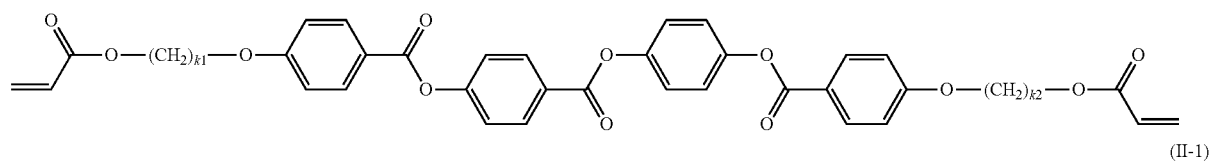
(II-1)
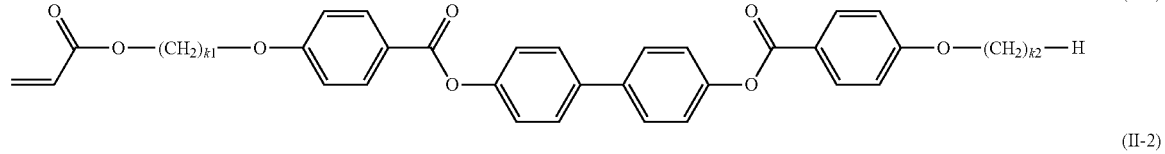
(II-2)
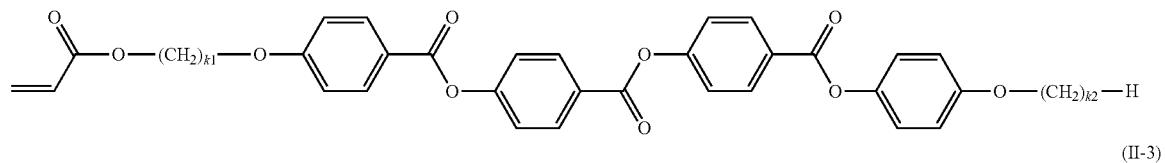
(II-3)
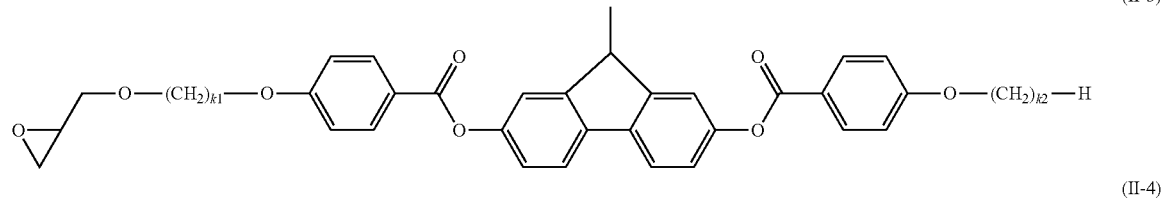
(II-4)
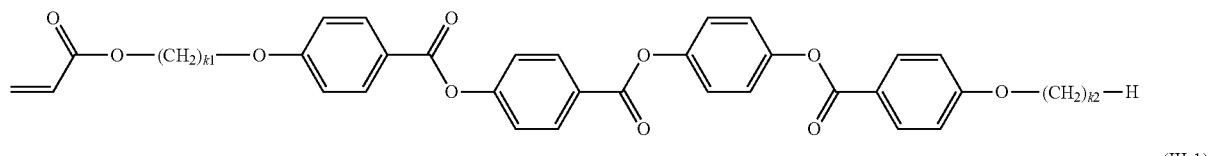
(III-1)
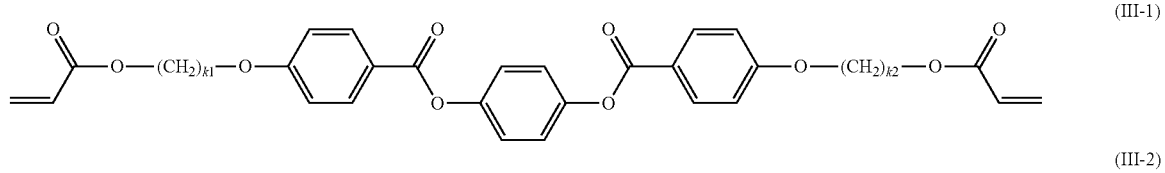
(III-2)
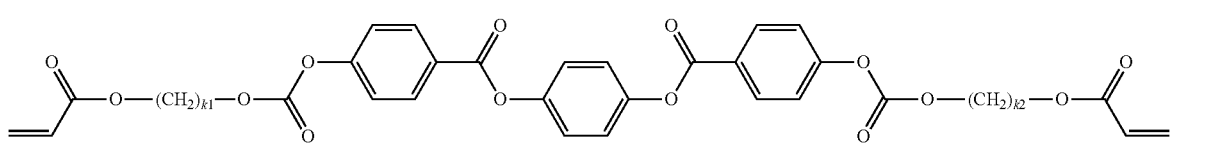
(III-3)
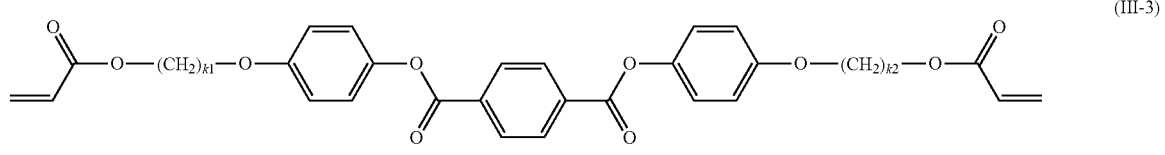

-continued
(III-4)
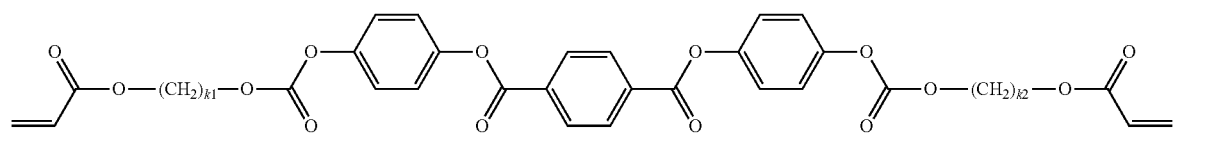
(III-5)
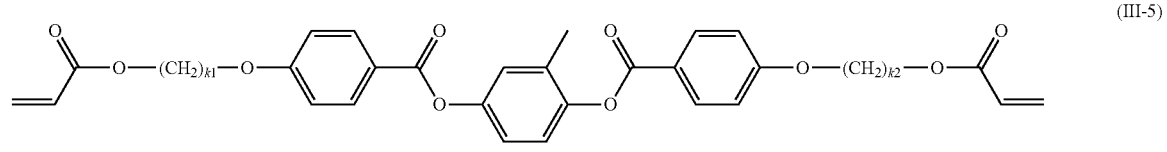
(III-6)
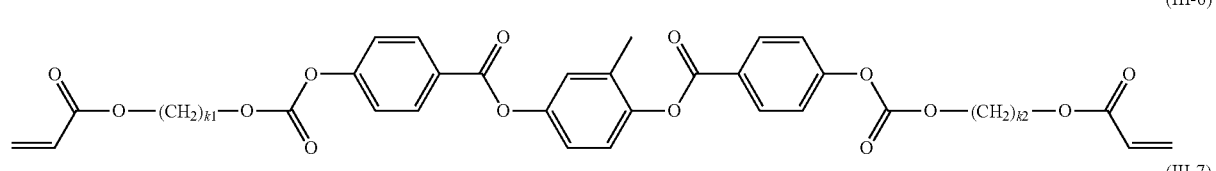
(III-7)
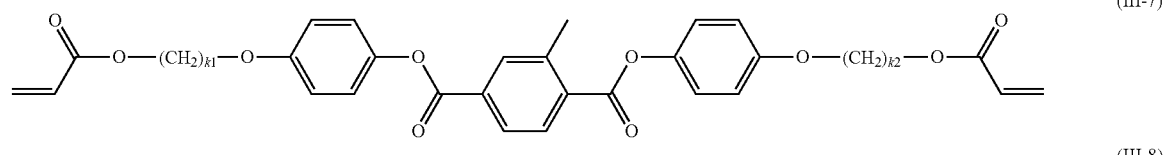
(III-8)
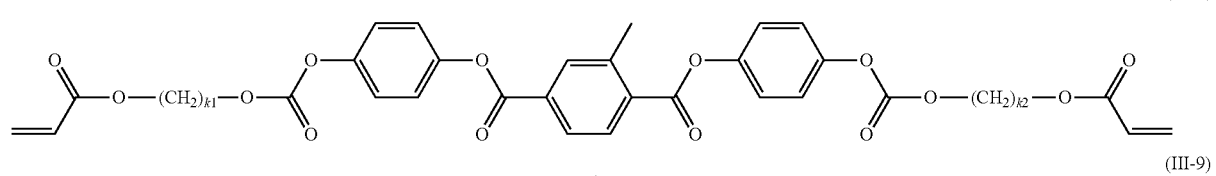
(III-9)
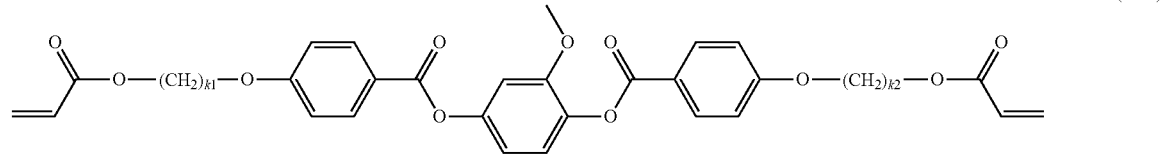
(III-10)
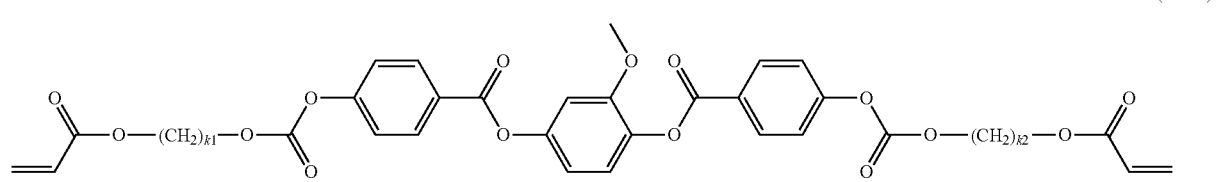
(III-11)
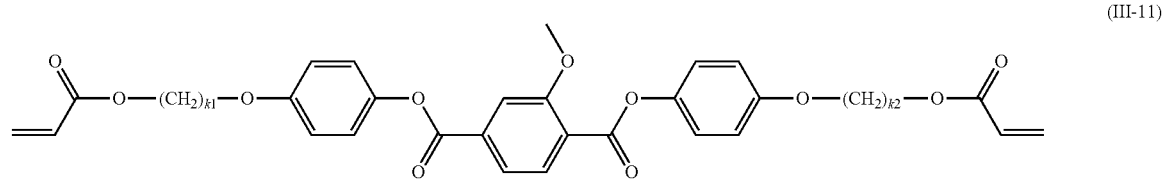
(III-12)
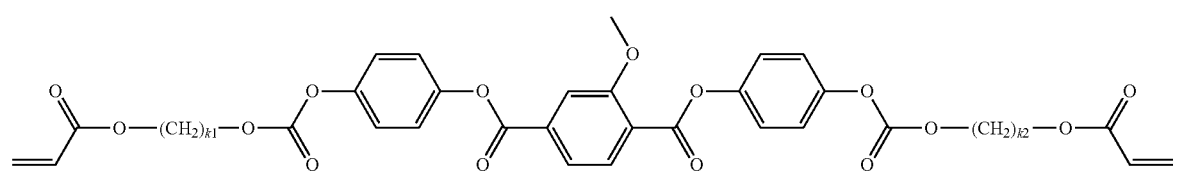

-continued
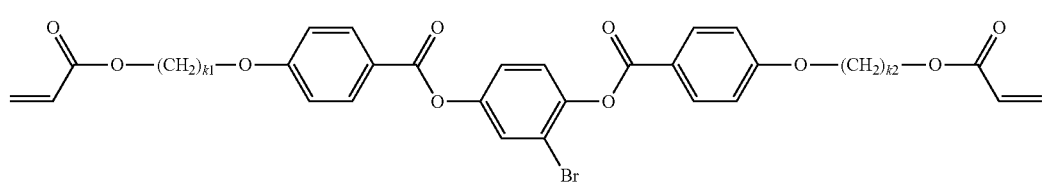
(III-13)
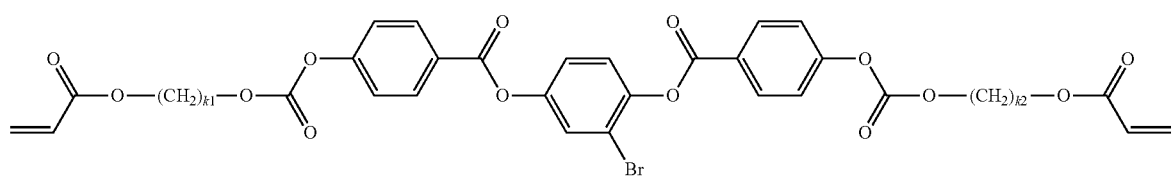
(III-14)
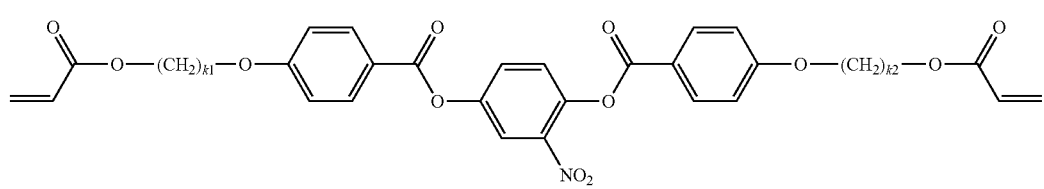
(III-15)
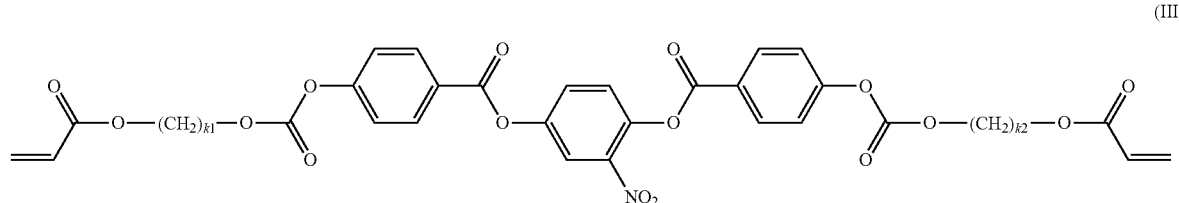
(III-16)
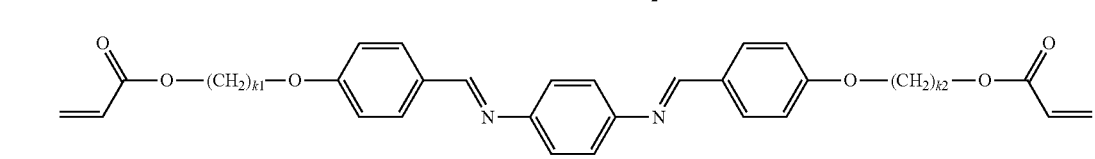
(III-17)
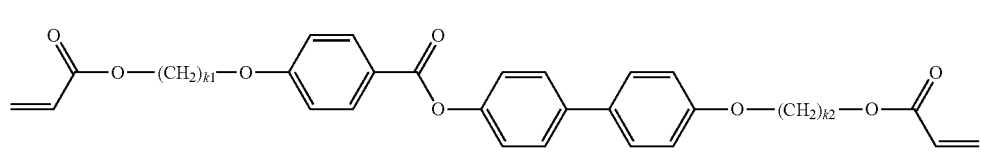
(III-18)
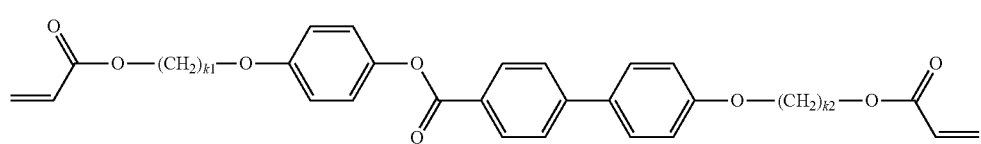
(III-19)
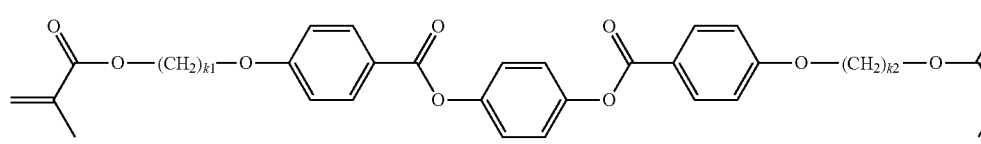
(III-20)
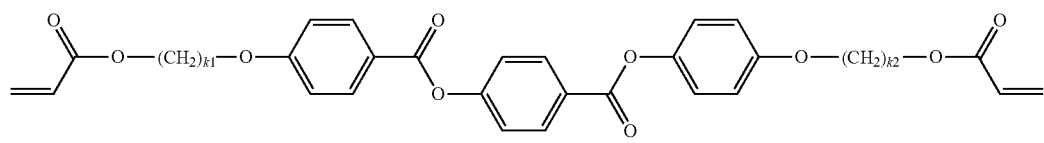
(III-21)
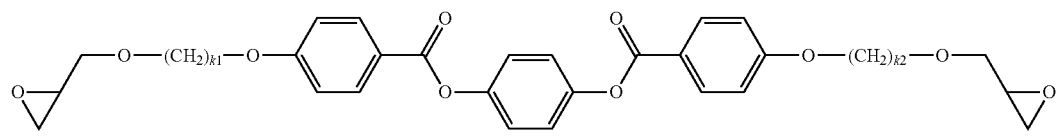
(III-22)

-continued
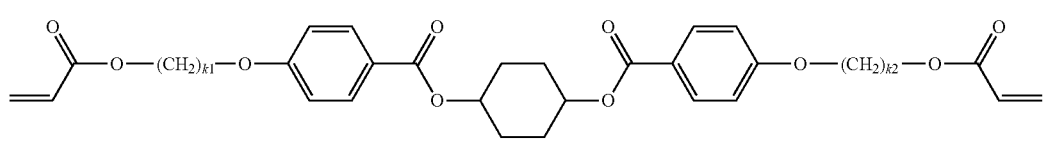 (III-23)
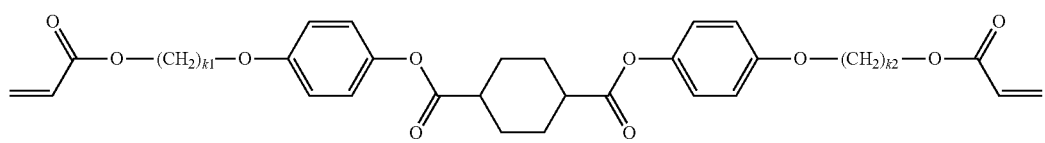 (III-24)
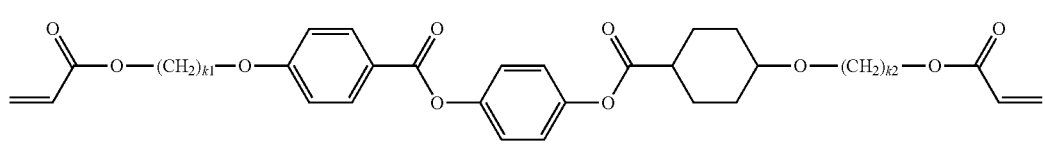 (III-25)
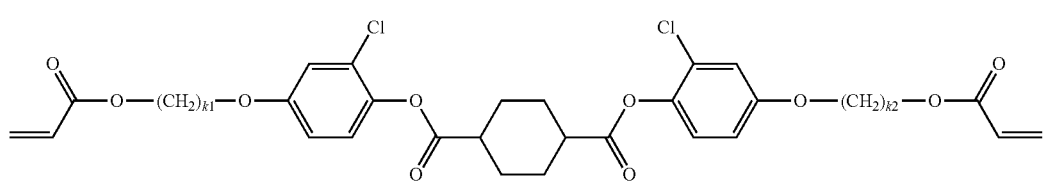 (III-26)
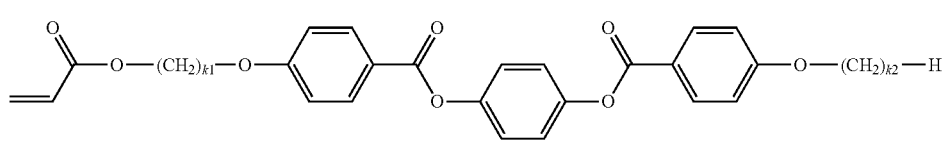 (IV-1)
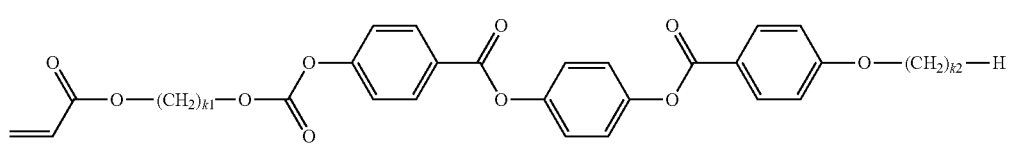 (IV-2)
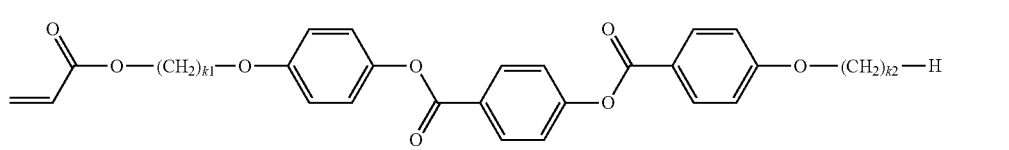 (IV-3)
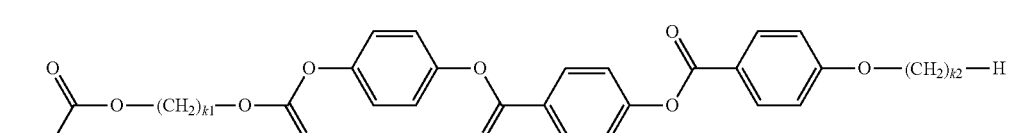 (IV-4)
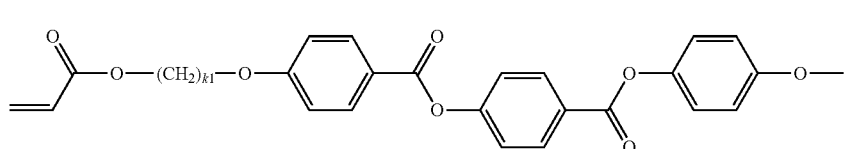 (IV-5)
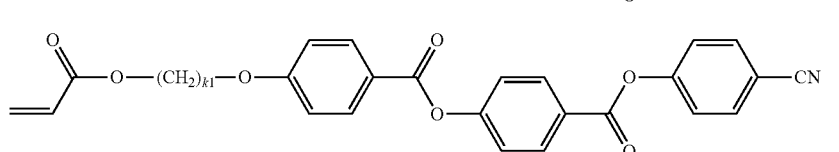 (IV-6)
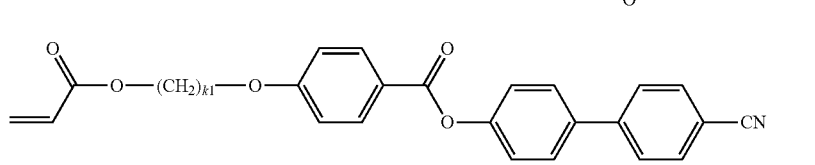 (IV-7)

-continued
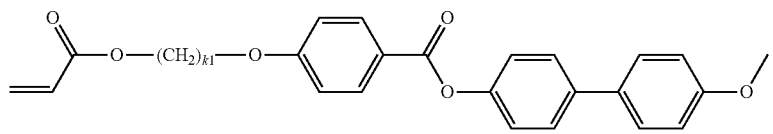
(IV-8)
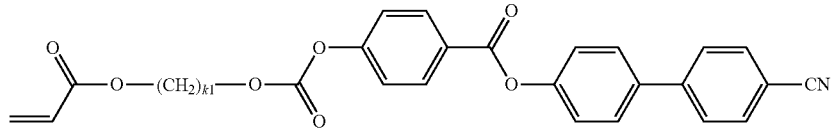
(IV-9)
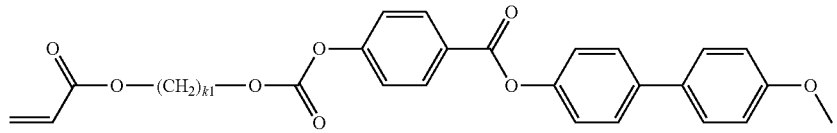
(IV-10)
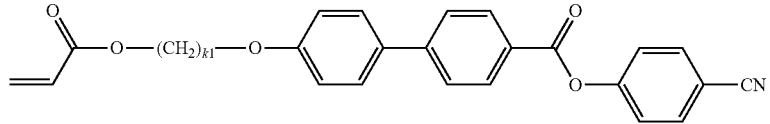
(IV-11)
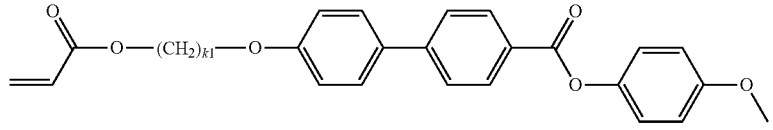
(IV-12)
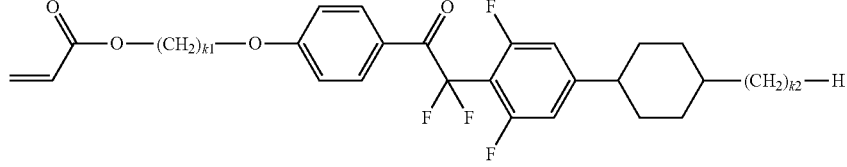
(IV-13)
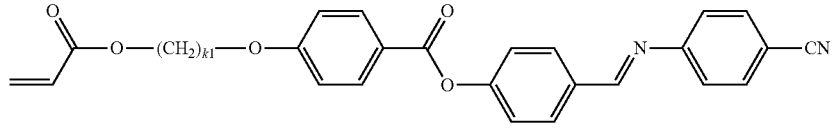
(IV-14)
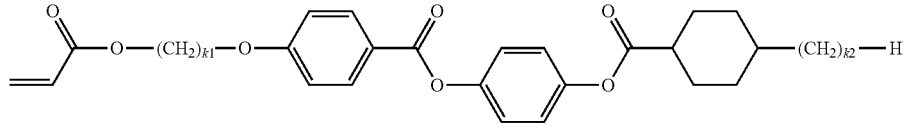
(IV-15)
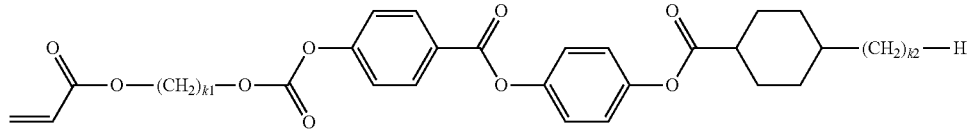
(IV-16)
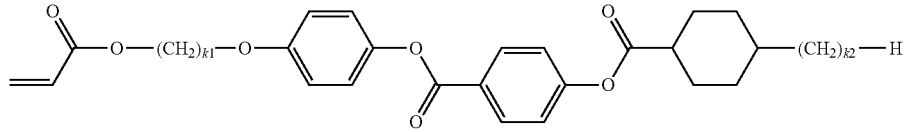
(IV-17)
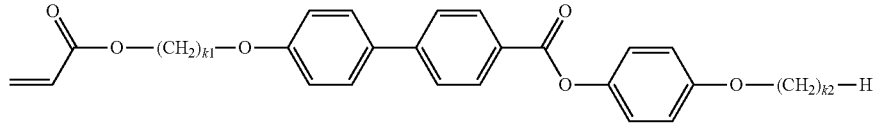
(IV-18)

-continued
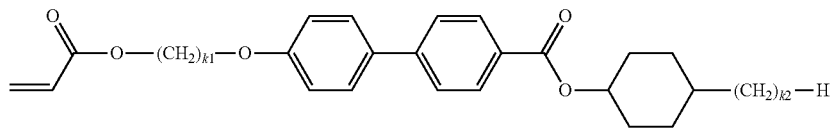
(IV-19)
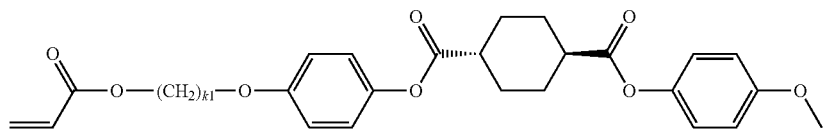
(IV-20)
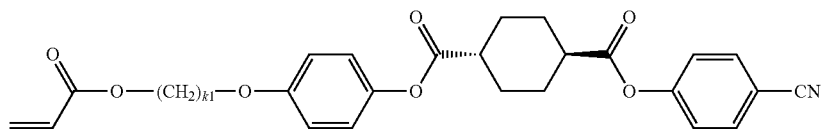
(IV-21)
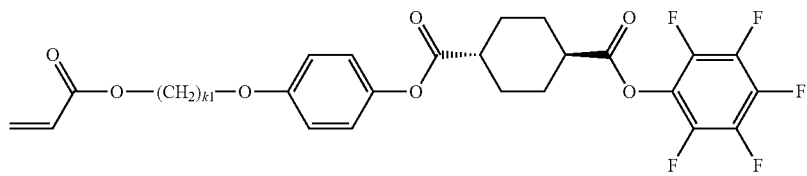
(IV-22)
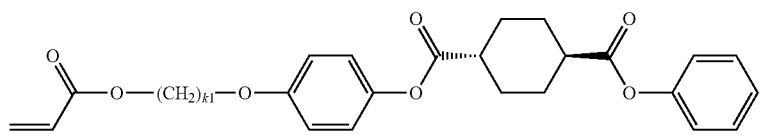
(IV-23)
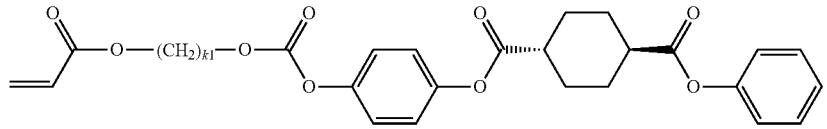
(IV-24)
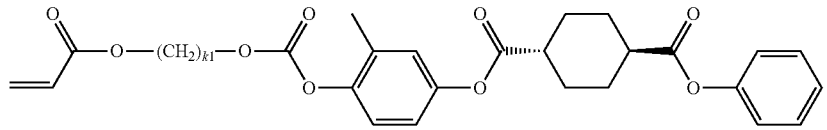
(IV-25)
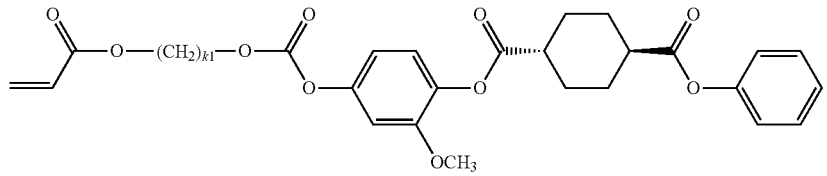
(IV-26)
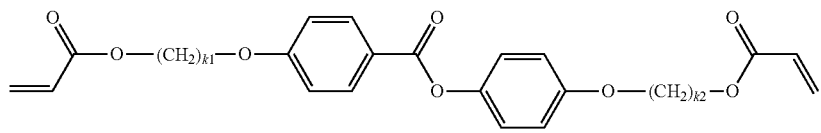
(V-1)
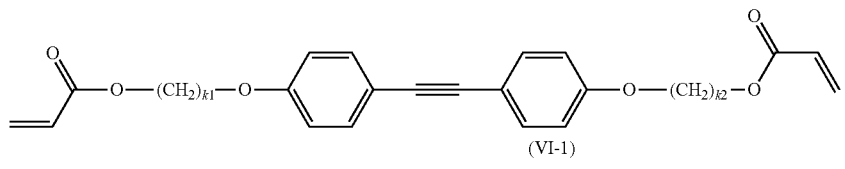
(V-2)
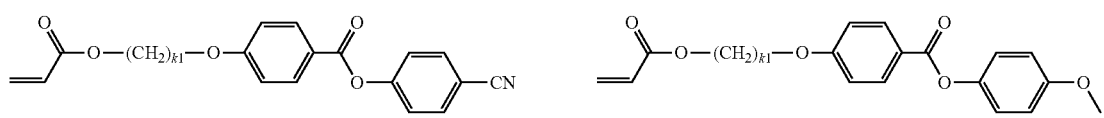
(VI-1) (VI-2)

-continued

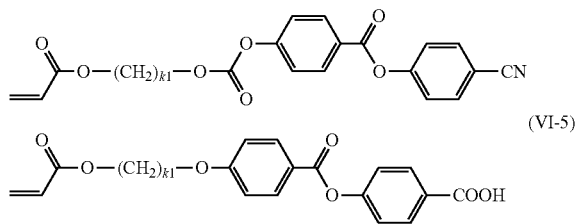
(VI-3)

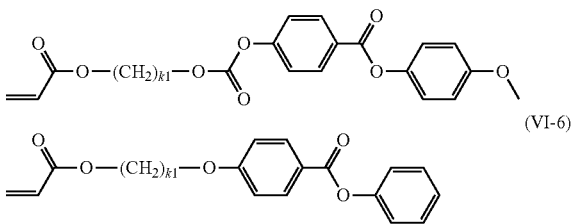
(VI-4)

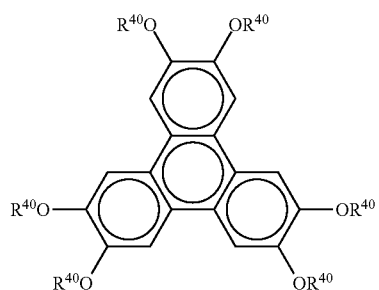
(VI-5)

(VI-6)

The disk-shaped polymerizable liquid crystal includes, for example, compounds containing a group represented by the formula (W) (hereinafter, referred to as polymerizable liquid crystal (C) in some cases).

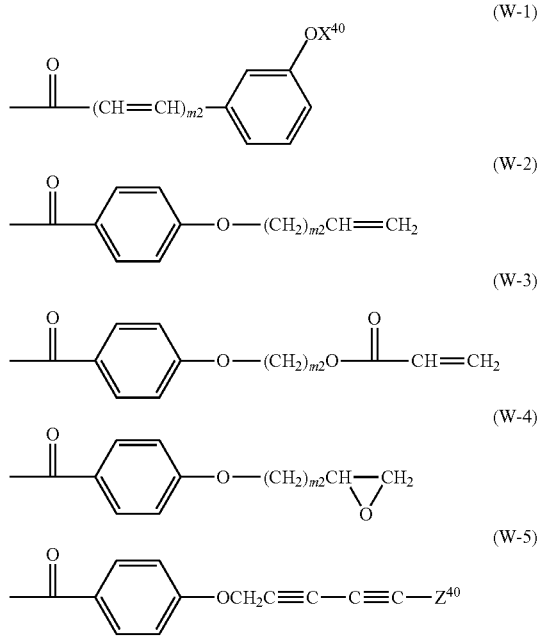

[in the formula (W), $R^{40}$ represents the following formula (W-1) to formula (W-5).

(W-1)

(W-2)

(W-3)

(W-4)

(W-5)

$X^{40}$ and $Z^{40}$ represent an alkanediyl group having 1 to 12 carbon atoms, a hydrogen atom contained in the alkanediyl group may be substituted by an alkoxy group having 1 to 5 carbon atoms, and a hydrogen atom contained in the alkoxy group may be substituted by a halogen atom. —$CH_2$— constituting the alkanediyl group may be replaced by —O— or CO—.

Specific examples of the polymerizable liquid crystal (C) include compounds described in "6.5.1 Liquid Crystal Material b. Polymerizable nematic liquid crystal material FIG. 6.21" of Liquid Crystal Handbook (Liquid Crystal Handbook Editorial Committee, ed., published on Oct. 30, 2000 by Maruzen), and polymerizable liquid crystals described in JP-A No. 7-258170, JP-A No. 7-30637, JP-A No. 7-309807 and JP-A No. 8-231470.

It is preferable that the above-described layer formed by polymerizing a polymerizable liquid crystal is formed on a base material. The above-described base material is usually a transparent base material. The transparent base material denotes a base material having transparency allowing transmission of light, especially visible light, and the transparency is a property giving a transmittance of 804 or more for light beams ranging from a wavelength of 380 nm to 780 nm. The transparent base material includes, specifically, transparent resin base materials. The resin constituting the transparent resin base material includes polyolefins such as polyethylene, polypropylene and the like; cyclic olefin resins such as norbornene polymers and the like; polyvinyl alcohol; polyethylene terephthalate; polymethacrylates; polyacrylates; cellulose esters such as triacetylcellulose, diacetylcellulose, cellulose acetate propionate and the like; polyethylene naphthalate; polycarbonates; polysulfones; polyether sulfones; polyether ketones; polyphenylene sulfide and polyphenylene oxide. Preferable from the standpoint of easy availability and transparency are polyethylene terephthalate, polymethacrylates, cellulose esters, cyclic olefin resins or polycarbonates.

The cellulose ester is obtained by esterifying part or all of hydroxyl groups contained in cellulose, and available easily from the market. Also the cellulose ester base material is available easily from the market. The commercially available cellulose ester base material includes, for example, "Fujitack (registered trademark) film" (FUJIFILM Corporation); "KC8UX2M", "KC8UY" and "KC4UY" (Konica Minolta Opto Products Co., Ltd.) and the like.

The polymethacrylates and the polyacrylates (hereinafter, polymethacrylates and polyacrylates are referred to collectively as (meth)acrylic resins in some cases) are available easily from the market.

The (meth)acrylic resin includes, for example, homopolymers of alkyl methacrylates or alkyl acrylates, copolymers of alkyl methacrylates and alkyl acrylates, and the like. The alkyl methacrylate includes, specifically, methyl methacrylate, ethyl methacrylate, propyl methacrylate and the like, and the alkyl acrylate includes, specifically, methyl acrylate, ethyl acrylate, propyl acrylate and the like, respectively. As the (meth)acrylic resin, those commercially marketed as generalpurpose (meth)acrylic resin can be used. As the (meth)acrylic resin, those called an impact-resistant (meth)acrylic resin may be used.

For further improvement in mechanical strength, it is also preferable that rubber particles are contained in a (meth) acrylic resin. The rubber particles are preferably acrylic rubber particles. Here, the acrylic rubber particles are particles having rubber elasticity obtained by polymerizing an acrylic monomer containing as the main component an alkyl acrylate such as butyl acrylate and 2-ethylhexyl acrylate in the presence of a poly-functional monomer. The acrylic rubber particle may be composed of a single layer formed with such particles having rubber elasticity, or a multi-layered structure having at least one rubber elastic layer. The acrylic rubber particles having a multi-layered structure include those in which particles having rubber elasticity as described above are contained as the nucleus and its periphery is covered with a hard alkyl methacrylate polymer, those in which a hard alkyl methacrylate polymer is contained as the nucleus and its periphery is covered with an acrylic polymer having rubber elasticity as described above, those in which the periphery of a hard nucleus is covered with a rubber elastic acrylic polymer and its periphery is further covered with a hard alkyl methacrylate polymer, and the like. The rubber particles formed with an elastic layer have its average diameter usually in the range of about 50 nm to 400 nm.

The content of rubber particles in a (meth)acrylic resin is usually about 5 to 50 parts by mass with respect to 100 parts by mass of the (meth)acrylic resin. Since a (meth)acrylic resin and acrylic rubber particles are commercially marketed in the state of a mixture of them, commercially available products thereof can be used. Examples of commercially available products of a (meth)acrylic resin containing blended acrylic rubber particles include "HT55X" and "Tekunoroi S001" marketed from Sumitomo Chemical Co., Ltd., and the like. "Tekunoroi S001" is marketed in the form of a film.

The cyclic olefin resin is available easily from the market. The commercially available cyclic olefin resin includes "Topas" (registered trademark) [Ticona (Germany)], "ARTON" (registered trademark) [JSR Corporation], "ZEONOR" (registered trademark) [ZEON Corporation], "ZEONEX" (registered trademark) [ZEON Corporation] and "APEL" (registered trademark) [Mitsui Chemicals, Inc.]. Such a cyclic olefin resin can be processed by known means such as, for example, a solvent casting method, a melt extrusion method and the like, to obtain a base material. Commercially available cyclic olefin resin base materials can also be used. The commercially available cyclic olefin resin base material includes "Esushina" (registered trademark) [Sekisui Chemical Co., Ltd.], "SCA40"(registered trademark) [Sekisui Chemical Co., Ltd.], "ZEONOR FILM" (registered trademark) [Optes Co., Ltd.] and "ARTON FILM" (registered trademark) [JSR Corporation].

When the cyclic olefin resin is a copolymer of a cyclic olefin and a linear olefin or an aromatic compound having a vinyl group, the content proportion of constituent units derived from the cyclic olefin is usually 50 mol % or less, preferably in the range of 15 to 50 mol % with respect to all constituent units of the copolymer. The linear olefin includes ethylene and propylene, and the aromatic compound having a vinyl group includes styrene, α-methylstyrene and alkyl-substituted styrene. When the cyclic olefin resin is a ternary copolymer composed of a cyclic olefin, a linear olefin and an aromatic compound having a vinyl group, the content proportion of constituent units derived from the linear olefin is usually 5 to 80 mol % with respect to all constituent units of the copolymer, and the content proportion of constituent units derived from the aromatic compound having a vinyl group is usually 5 to 80 mol % with respect to all constituent units of the copolymer. Such a ternary compound has a merit that the use amount of an expensive cyclic olefin can be relatively reduced in its production.

As the base material forming an optically anisotropic layer, a base material showing small phase difference is preferable. The base material showing small phase difference includes cellulose ester films having no phase difference such as ZEROTAC (registered trademark) (Konica Minolta Opto Products Co., Ltd.), Z TAC (Fujifilm Corporation) and the like. Further, an undrawn cyclic olefin resin base material is also preferable.

Furthermore, the surface of a base material on which an orientation film described later and an optically anisotropic layer are not formed may be subjected to a hard coat treatment, an antistatic treatment and the like. Additives such as an ultraviolet absorber and the like may be contained in a range not affecting the performance.

When the thickness of a base material is too small, strength lowers and workability tends to be poor, therefore, the thickness is usually 5 to 300 μm, preferably 10 to 200 μm.

[Polymerizable Liquid Crystal Composition]

The layer formed by polymerizing a polymerizable liquid crystal (optically anisotropic layer) is usually formed by coating a composition containing at least one polymerizable liquid crystal (hereinafter, referred to as polymerizable liquid crystal composition in some cases) on a base material, an orientation film, a protective film or an optically anisotropic layer, and polymerizing the polymerizable liquid crystal in the resulting coated film.

The polymerizable liquid crystal composition usually contains a solvent, and more preferable as the solvent is a solvent which can dissolve a polymerizable liquid crystal and is inactive for the polymerization reaction of the polymerizable liquid crystal.

The solvent includes, specifically, alcohol solvents such as methanol, ethanol, ethylene glycol, isopropyl alcohol, propylene glycol, methylcellosolve, butylcellosolve, propylene glycol monomethyl ether, phenol and the like; ester solvents such as ethyl acetate, butyl acetate and the like; ketone solvents such as acetone, methyl ethyl ketone, cyclopentanone, cyclohexanone, cycloheptanone, methyl amyl ketone, methyl isobutyl ketone, N-methyl-2-pyrrolidinone and the like; nonchlorinated aliphatic hydrocarbon solvents such as pentane, hexane, heptane and the like; nonchlorinated aromatic hydrocarbon solvents such as toluene, xylene and the like, nitrile solvents such as acetonitrile and the like; ether solvents such as propylene glycol monomethyl ether, tetrahydrofuran, dimethoxyethane and the like, and chlorinated hydrocarbon solvents such as chloroform, chlorobenzene and the like. These other solvents may be used singly or in combination.

The content of a solvent in a polymerizable liquid crystal composition is preferably 10 parts by mass to 10000 parts by mass, more preferably 50 parts by mass to 5000 parts by mass with respect to 100 parts by mass of the solid content. The solid content means the sum of components of a polymerizable liquid crystal composition excluding a solvent.

Coating of a polymerizable liquid crystal composition is usually carried out by known methods such as coating methods such as a spin coating method, an extrusion method, a gravure coating method, a die coating method, a slit coating method, a bar coating method, an applicator method and the like, and printing methods such as a flexo method and the like. After coating, a dry coat is formed usually by removing a solvent under conditions wherein a polymerizable liquid crystal contained in the resultant coated film does not polymerize. The drying method includes a natural drying method, a ventilation drying method, heat drying and a reduced-pressure drying method.

<Orientation Film>

The orientation film in the present invention has orientation controlling force of orienting a polymerizable liquid crystal to a desired direction.

It is preferable that the orientation film has solvent resistance with which the film is not dissolved in coating of a polymerizable liquid crystal composition and has heat resistance in a heat treatment for removal of a solvent and orientation of a polymerizable liquid crystal. Such an orientation film includes an orientation film containing an orienting polymer, a photo-orientation film, and a groove orientation film having irregular patterns and a plurality of grooves formed for orientation on the surface.

The orienting polymer includes polyamides and gelatins having an amide bond in the molecule, polyimides having an imide bond in the molecule and polyamic acids as hydrolysates thereof, polyvinyl alcohol, alkyl-modified polyvinyl alcohol, polyacrylamide, polyoxazole, polyethyleneimine, polystyrene, polyvinylpyrrolidone, polyacrylic acid and polyacrylates. Of them, polyvinyl alcohol is preferable. It is also permissible to use two or more orienting polymers in combination.

The orientation film containing an orienting polymer is usually obtained by coating a composition containing an orienting polymer dissolved in a solvent (hereinafter, referred to as orienting polymer composition in some cases) on a base material and removing the solvent, or coating an orienting polymer composition on a base material, removing the solvent and rubbing the composition (rubbing method).

The above-described solvent includes, water, alcohol solvents such as methanol, ethanol, ethylene glycol, isopropyl alcohol, propylene glycol, methylcellosolve, butylcellosolve, propylene glycol monomethyl ether and the like, ester solvents such as ethyl acetate, butyl acetate, ethylene glycol methylether acetate, γ-butyrolactone, propylene glycol methyl ether acetate, ethyl lactate and the like, ketone solvents such as acetone, methyl ethyl ketone, cyclopentanone, cyclohexanone, methyl amyl ketone, methyl isobutyl ketone and the like, aliphatic hydrocarbon solvents such as pentane, hexane, heptane and the like, aromatic hydrocarbon solvents such as toluene, xylene and the like, nitrile solvents such as acetonitrile and the like, ether solvents such as tetrahydrofuran, dimethoxyethane and the like, and chlorinated hydrocarbon solvents such as chloroform, chlorobenzene and the like. These solvents may be used singly or two or more of them may be used in combination.

The concentration of an orienting polymer in an orienting polymer composition may be in a range wherein the orienting polymer material can be dissolved completely in a solvent, and it is preferably 0.1 to 20%, further preferably about 0.1 to 10% in terms of the solid content with respect to the solution.

As the orienting polymer composition, a commercially available orientation film material may be used as it is. The commercially available orientation film material includes SUNEVER (registered trademark, manufactured by Nissan Chemical Industries, Ltd.), OPTOMER (registered trademark, manufactured by JSR Corporation), and the like.

The method of coating an orienting polymer composition on a base material includes known methods such as coating methods such as a spin coating method, an extrusion method, a gravure coating method, a die coating method, a slit coating method, a bar coating method, an applicator method and the like, printing methods such as a flexo method and the like. When the optically anisotropic film in the present invention is produced by a continuous production method of Roll to Roll mode described later, a gravure coating method, a die coating method or a printing method such as a flexo method or the like is usually adopted in the coating method.

The method of removing a solvent contained in an orienting polymer composition includes a natural drying method, a ventilation drying method, heat drying and a reduced-pressure drying method, and the like.

To endow an orientation film with orientation controlling force, rubbing can be conducted (rubbing method) if necessary.

For endowing orientation controlling force by the rubbing method, there is a method in which a film of an orienting polymer formed on the surface of a base material by coating an orienting polymer composition on the base material and annealing this is made to contact with a rubbing roll which is rotating and carrying rubbing cloth wound thereon.

To endow an orientation film with orientation controlling force, photo-orientation can be conducted (photo-orientation method) if necessary.

The photo-orientation film is obtained usually by coating a composition containing a solvent and a polymer or monomer having a photo-reactive group (hereinafter, referred to as "photo-orientation film forming composition" in some cases) on a base material, and irradiating the composition with light (preferably, polarized UV). The photo-orientation film is more preferable since the direction of orientation controlling force can be controlled arbitrarily by selecting the polarization direction of light used for irradiation.

The photo-reactive group denotes a group generating liquid crystal orienting ability by light irradiation. The photo-reactive group includes, specifically, groups correlated with photo-reactions acting as an origin of liquid crystal orienting ability such as an isomerization reaction, a dimerization reaction, a photo-crosslinking reaction, a photo-decomposition reaction and the like or with induction of orientation of molecules generated by light irradiation. Of them, groups correlated with a dimerization reaction or a photo-crosslinking reaction are preferable because of excellent orientation. As the photo-reactive group, groups having an unsaturated bond, especially a double bond are preferable, and groups having at least one selected from the group consisting of a carbon-carbon double bond (C=C bond), a carbon-nitrogen double bond (C=N bond), a nitrogen-nitrogen double bond (N=N bond) and a carbon-oxygen double bond (C=O bond) are particularly preferable.

The photo-reactive group having a C=C bond includes a vinyl group, a polyene group, a stilbene group, a stilbazole group, a stilbazolium group, a chalcone group and a cinnamoyl group. The photo-reactive group having a C=N bond includes groups having a structure of an aromatic Schiff base, an aromatic hydrazone and the like. The photo-reactive group having a N=N bond includes an azobenzene group, an azonaphthalene group, an aromatic heterocyclic azo group, a bisazo group, a formazan group, and groups having an azoxybenzene structure. The photo-reactive group having a C=O bond includes a benzophenone group, a coumarin group, an anthraquinone group and a maleimide group. These groups may have a substituent such as an alkyl group, an alkoxy group, an aryl group, an aryloxy group, a cyano group, an alkoxycarbonyl group, a hydroxyl group, a sulfonic group, a halogenated alkyl group and the like.

Of them, photo-reactive groups correlated with a photo-dimerization reaction are preferable, and a cinnamoyl group and a chalcone group are preferable since the polarization irradiance level necessary for photo-orientation is relatively small and a photo-orientation film excellent in thermal stability and temporal stability is easily obtained. As the polymer having a photo-reactive group, those having a cinnamoyl group so that the end of a side chain of the polymer has a cinnamic acid structure.

A photo-orientation induction layer can be formed on a base material by coating a photo-orientation film forming composition on the base material. The solvent contained in the composition includes the same solvents as one contained in the above-described orienting polymer composition, and can be appropriately selected depending on the solubility of a polymer or monomer having a photo-reactive group.

The content of a polymer or monomer having a photo-reactive group in a photo-orientation film forming composition can be appropriately adjusted depending on the kind of the polymer or monomer and the thickness of the intended photo-orientation film, and is preferably at least 0.2% by mass, more preferably in the range of 0.3 to 10% by mass. The photo-orientation film forming composition may contain a photosensitizer and a polymer material such as polyvinyl alcohol, polyimide or the like in a range wherein the property of a photo-orientation film is not remarkably lost.

The method of coating a photo-orientation film forming composition on a base material includes the same methods as the method of coating an orienting polymer composition on a base material. The method of removing a solvent from a coated photo-orientation film forming composition includes, for example, the same methods as the method of removing a solvent from an orienting polymer composition.

Irradiation with polarization may be carried out by a mode in which a solvent is removed from a photo-orientation film forming composition coated on a base material and the composition is irradiated directly with polarization UV or a mode in which the base material side is irradiated with polarization and the polarization is allowed to transmit, and the composition is irradiated with the transmitted polarization. It is particularly preferable that this polarization is substantially parallel light. The wavelength of polarization used for irradiation is preferably in a range wherein a photo-reactive group of a polymer or monomer having a photo-reactive group can absorb optical energy. Specifically, UV (ultraviolet) having a wavelength in the range of 250 to 400 nm is particularly preferable. The light source used for the polarization irradiation includes a xenon lamp, a high pressure mercury lamp, an extra high pressure mercury lamp, a metal halide lamp, ultraviolet laser such as KrF, ArF and the like, and a high pressure mercury lamp, an extra high pressure mercury lamp and a metal halide lamp are more preferable. These lamps are preferable since they provide high emission intensity of ultraviolet having a wavelength of 313 nm. By delivering light from the above-described light source via a suitable polarizer, irradiation with polarization UV is made possible. As the polarizer, use is made of a polarization filter, a polarization prism such as Glan Thompson, Glan Taylor and the like, and a wire grid type polarizer.

If masking is performed in conducting rubbing or polarization irradiation, several regions having different liquid crystal orientation directions (pattern) can also be formed.

The groove orientation film is a film in which liquid crystal orientation is obtained by irregular patterns or a plurality of grooves on the surface of the film. H. V. Kennel et al. report a fact that if liquid crystal molecules are placed on a base material having a plurality of linear grooves arranged at regular intervals, liquid crystal molecules are oriented to a direction along the grooves (Physical Review A24 (5), p. 2713, 1981).

Specific examples for obtaining a groove orientation film includes a method in which the surface of a photo-sensitive polyimide is exposed via an exposure mask having periodically patterned slits, then, development and rinse treatments are conducted to remove unnecessary polyimide films, thereby forming irregular patterns, a method in which an UV curable resin layer is formed on a plate-shaped master having grooves on the surface, and the resin layer is transferred onto a base material film before curing, a method in which a base material film having an UV curable resin layer formed thereon is conveyed, and a roll-shaped master having a plurality of grooves is pressed to the surface of the UV curable resin layer to form irregularity before performing curing, and the like, and methods described in JP-A No. 6-34976 and JP-A No. 2011-242743 can be used.

Of the above-described methods, the method of pressing a roll-shaped master having a plurality of grooves to the surface of an UV curable resin layer to form irregularity before performing curing is preferable. As the roll-shaped master, stainless (SUS) steel can be used from the standpoint of durability.

As the UV curable resin, a polymer of a mono-functional acrylate, a polymer of a poly-functional acrylate or a polymer of a mixture of them can be used.

The mono-functional acrylate is a compound having in the molecule one group (hereinafter, referred to as (meth)acryloyloxy group in some cases) selected from the group consisting of an acryloyloxy group ($CH_2$=CH—COO—) and a methacryloyloxy group ($CH_2$=C($CH_3$)—COO—).

The mono-functional acrylate having one (meth)acryloyloxy group includes alkyl(meth)acrylates having 4 to 16 carbon atoms, β-carboxyalkyl(meth)acrylates having 2 to 14 carbon atoms, alkylated phenyl(meth)acrylates having 2 to 14 carbon atoms, methoxypolyethylene glycol(meth)acrylate, phenoxy polyethylene glycol(meth)acrylate and isobonyl (meth)acrylate, and the like.

The poly-functional acrylate is usually a compound having in the molecule two to six (meth)acryloyloxy groups.

As the bi-functional acrylate having two (meth)acryloyloxy groups, 1,3-butanediol di(meth)acrylate; 1,3-butanediol (meth)acrylate; 1,6-hexanediol di(meth)acrylate; ethylene glycol di(meth)acrylate; diethylene glycol di(meth)acrylate; neopentyl glycol di(meth)acrylate; triethylene glycol di(meth)acrylate; tetraethylene glycol di(meth)acrylate; polyethylene glycol diacrylate; bis(acryloyloxyethyl) ether of bisphenol A; ethoxylated bisphenol A di(meth)acrylate; propoxylated neopentyl glycol di(meth)acrylate; ethoxylated neopentyl glycol di(meth)acrylate and 3-methylpentanediol di(meth)acrylate, and the like are exemplified.

The poly-functional acrylate having three to six (meth) acryloyloxy groups includes, trimethylolpropane tri(meth)acrylate; pentaerythritol tri (meth)acrylate; tri(2-hydroxyethyl) isocyanurate tri(meth) acrylate; ethoxylated trimethylolpropane tri(meth)acrylate; propoxylated trimethylolpropane tri(meth)acrylate; pentaerythritol tetra(meth)acrylate; dipentaerythritol penta (meth)acrylate; dipentaerythritol hexa(meth)acrylate; tripentaerythritol tetra(meth)acrylate; tripentaerythritol penta (meth)acrylate; tripentaerythritol hexa(meth)acrylate; tripentaerythritol hepta(meth)acrylate; tripentaerythritol octa (meth)acrylate;

a reaction product of pentaerythritol tri(meth)acrylate with an acid anhydride; a reaction product of dipentaerythritol penta(meth)acrylate with an acid anhydride;

a reaction product of tripentaerythritol hepta(meth)acrylate with an acid anhydride;

caprolactone-modified trimethylolpropane tri(meth)acrylate; caprolactone-modified pentaerythritol tri(meth)acrylate; caprolactone-modified tris(2-hydroxyethyl) isocyanurate tri(meth)acrylate; caprolactone-modified pentaerythritol tetra(meth)acrylate; caprolactone-modified dipentaerythritol penta(meth)acrylate; caprolactone-modified dipentaerythritol hexa(meth)acrylate; caprolactone-modified tripentaerythritol tetra(meth)acrylate; caprolactone-modified tripentaerythritol penta(meth)acrylate; caprolactone-modified tripentaerythritol hexa(meth)acrylate; caprolactone-modified tripentaerythritol hepta(meth)acrylate; caprolactone-modified tripentaerythritol octa(meth)acrylate; a reaction product of caprolactone-modified pentaerythritol tri(meth)acrylate with an acid anhydride; a reaction product of caprolactone-modified dipentaerythritol penta(meth)acrylate with an acid anhydride, and a reaction product of caprolactone-modified tripentaerythritol hepta(meth)acrylate with an acid anhydride, and the like. In specific examples of the poly-functional acrylate listed here, the (meth)acrylate denotes acrylate or methacrylate. The caprolactone-modified means that a ring-opened body of caprolactone or a ring open polymerized body thereof is introduced between an alcohol-derived portion and a (meth)acryloyloxy group of a (meth)acrylate compound.

As the poly-functional acrylate, commercially available products can also be used.

Such commercially available products include A-DOD-N, A-HD-N, A-NOD-N, APG-100, APG-200, APG-400, A-GLY-9E, A-GLY-20E, A-TMM-3, A-TMPT, AD-TMP, ATM-35E, A-TMMT, A-9550, A-DPH, HD-N, NOD-N, NPG, TMPT (manufactured by Shin Nakamura Chemical Co., Ltd.); "ARONIX M-220", same brand "M-325", same brand "M-240", same brand "M-270", same brand "M-309", same brand "M-310", same brand "M-321", same brand "M-350", same brand "M-360", same brand "M-305", same brand "M-306", same brand "M-450", same brand "M-451", same brand "M-408", same brand "M-400", same brand "M-402", same brand "M-403", same brand "M-404", same brand "M-405", same brand "M-406"(manufactured by Toagosei Co., Ltd.), "EBECRYL11", same brand "145", same brand "150", same brand "40", same brand "140", same brand "180", DPGDA, HDDA, TPGDA, HPNDA, PETIA, PETRA, TMPTA, TMPEOTA, DPHA, EBECRYL series (manufactured by Daicel-Cytec Company, Ltd.), and the like.

Regarding irregularity of a groove orientation film, the width of a convex portion is preferably 0.05 to 5 µm, the width of a concave portion is preferably 0.1 to 5 µm, the depth of irregularity is 2 µm or less, preferably 0.01 to 1 µm or less. Within this range, liquid crystal orientation revealing little disordered orientation can be obtained.

The thickness of an orientation film is usually in the range of 10 nm to 10000 nm, preferably in the range of 10 nm to 1000 nm, more preferably 500 nm or less, further preferably in the range of 10 nm to 500 nm.

Liquid crystal orientation of a polymerizable liquid crystal is regulated by the nature of an orientation film and a polymerizable liquid crystal.

For example, if an orientation film is a material manifesting horizontal orientation controlling force as orientation controlling force, a polymerizable liquid crystal can form horizontal orientation or hybrid orientation, while if it is a material manifesting vertical orientation controlling force, a polymerizable liquid crystal can form vertical orientation or inclined orientation.

When an orientation film is formed of an orienting polymer, orientation controlling force can be arbitrarily controlled by surface state and rubbing condition, while when an orientation film is formed of a photo-orienting polymer, orientation controlling force can be arbitrarily controlled by polarization irradiation condition and the like. Liquid crystal orientation can also be controlled by selecting physical properties such as surface tension, liquid crystallinity and the like of a polymerizable liquid crystal.

Polymerization of a polymerizable liquid crystal can be conducted by a known method of polymerizing a compound having a polymerizable functional group. Heat polymerization and photo-polymerization are specifically mentioned, and photo-polymerization is preferable from the standpoint of easiness of polymerization. When a polymerizable liquid crystal is polymerized by photo-polymerization, it is preferable that a polymerizable liquid crystal composition containing a photopolymerization initiator is coated and dried to obtain a dry coat, and a polymerizable liquid crystal in the coat is converted into liquid crystal phase state, then, photopolymerization is performed while keeping the liquid crystal state.

Photo-polymerization is carried out usually by irradiating a dry coat with light. Light used for irradiation is appropriately selected depending on the kind of a photopolymerization initiator contained in a dry coat, the kind of a polymerizable liquid crystal (particularly, the kind of a photopolymerizable group in a polymerizable liquid crystal) and its amount, and includes, specifically, light selected from the group consisting of visible light, ultraviolet light and laser light, and an active electron beam. Of them, ultraviolet light is preferable since progress of a polymerization reaction can be easily controlled and apparatuses widely used in the art as a photopolymerization apparatus can be used, and it is preferable to select the kind of a polymerizable liquid crystal and a photopolymerization initiator so that photopolymerization can occur with ultraviolet light. It is also possible to control the polymerization temperature by irradiating a dry coat with light while cooling with a suitable cooling means, in polymerization. When polymerization of a polymerizable liquid crystal is carried out at lower temperature by adoption of such a cooling means, an optically anisotropic layer can be suitably formed, even if a base material of relatively low heat resistance is used. A patterned optically anisotropic layer can also be obtained by conducting masking or development in photopolymerization.

The polymerizable liquid crystal composition may contain a reactive additive.

As the reactive additive, those having a carbon-carbon unsaturated bond and an active hydrogen reactive group in the molecule are preferable. "Active hydrogen reactive group" herein referred to denotes a group showing reactivity with a group having active hydrogen such as a carboxyl group (—COOH), a hydroxyl group (—OH), an amino group (—NH$_2$) and the like, and a glycidyl group, an oxazoline group, a carbodiimide group, an aziridine group, an imide group, an isocyanate group, a thioisocyanate group, a maleic anhydride group and the like are typical examples thereof. The number of each of a carbon-carbon unsaturated bond and an active hydrogen reactive group in a reactive additive is usually 1 to 20, preferably 1 to 10.

It is preferable that at least two active hydrogen reactive groups are present in a reactive additive, and in this case, a plurality of active hydrogen reactive groups may be the same or different.

The carbon-carbon unsaturated bond in a reactive additive may be a carbon-carbon double bond or a carbon-carbon triple bond, or a combination thereof, and preferable is a carbon-carbon double bond. Particularly, it is preferable for a reactive additive to contain a carbon-carbon unsaturated bond in the form of a vinyl group and/or a (meth)acryl group. Further, it is preferable that the active hydrogen reactive group is at least one selected from the group consisting of an epoxy group, a glycidyl group and an isocyanate group, and reactive additives having an acryl group and an isocyanate group are particularly preferable.

Specific examples of the reactive additive include compounds having a (meth)acryl group and an epoxy group such as methacryloxy glycidyl ether, acryloxy glycidyl ether and the like; compounds having a (meth)acryl group and an oxetane group such as oxetane acrylate, oxetane methacrylate and the like; compounds having a (meth)acryl group and a lactone group such as lactone acrylate, lactone methacrylate and the like; compounds having a vinyl group and an oxazoline group such as vinyloxazoline, isopropenyloxazoline and the like; oligomers of compounds having a (meth)acryl group and an isocyanate group such as isocyanatomethyl acrylate, isocyanatomethyl methacrylate, 2-isocyanatoethyl acrylate and 2-isocyanatoethyl methacrylate and the like. Further listed are compounds having a vinyl group or vinylene group and an acid anhydride such as methacrylic anhydride, acrylic anhydride, maleic anhydride, vinylmaleic anhydride and the like. Of them, methacryloxy glycidyl ether, acryloxy glycidyl ether, isocyanatomethyl acrylate, isocyanatomethyl methacrylate, vinyloxazoline, 2-isocyanatoethyl acrylate, 2-isocyanatoethyl methacrylate and the above-described oligomers are preferable, isocyanatomethyl acrylate, 2-isocyanatoethyl acrylate and the above-described oligomers are particularly preferable.

Specifically, compounds represented by the following formula (Y) are preferable.

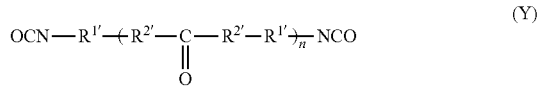

[In the formula (Y), n represents an integer of 1 to 10, $R^{1'}$ represents a di-valent aliphatic or alicyclic hydrocarbon group having 2 to 20 carbon atoms, or a di-valent aromatic hydrocarbon group having 5 to 20 carbon atoms. One of two $R^{2'}$ in each repeating unit is —NH— and the other is a group represented by >N—C(=O)—$R^{3'}$. $R^{3'}$ represents a hydroxyl group or a group having a carbon-carbon unsaturated bond.

At least one of $R^{3'}$ in the formula (Y) is a group having a carbon-carbon unsaturated bond.]

Of reactive additives represented by the above-described formula (Y), compounds represented by the following formula (YY) (hereinafter, referred to as compound (YY) in some cases) are particularly preferable (n represents the same meaning as described above).

As the compound (YY), commercially available products can be used as they are or, if necessary, purified before use. The commercially available product includes, for example, Laromer (registered trademark) LR-9000 (manufactured by BASF).

When the polymerizable liquid crystal composition contains a reactive additive, its content is usually 0.1 part by mass to 30 parts by mass, preferably 0.1 part by mass to 5 parts by mass with respect to 100 parts by mass of a polymerizable liquid crystal.

It is preferable that the polymerizable liquid crystal composition contains at least one leveling agent. The leveling agent has a function of adjusting flowability of a polymerizable liquid crystal composition and making a coated film obtained by coating a polymerizable liquid crystal composition more even, and includes, specifically, surfactants. As the leveling agent, at least one selected from the group consisting of leveling agents containing a polyacrylate compound as the main component and leveling agents containing a fluorine atom-containing compound as the main component is preferable.

The leveling agent containing a polyacrylate compound as the main component includes "BYK-350", "BYK-352", "BYK-353", "BYK-354", "BYK-355", "BYK-358N", "BYK-361N", "BYK-300", "BYK-381" and "BYK-392" [BYK Chemie].

The leveling agent containing a fluorine atom-containing compound as the main component includes "MEGAFAC (registered trademark) R-08", same brand "R-30", same brand "R-90", same brand "F-410", same brand "F-411", same brand "F-443", same brand "F-445", same brand "F-470", same brand "F-471", same brand "F-477", same brand "F-479", same brand "F-482" and same brand "F-483" [DIC Corporation]; "Surflon (registered trademark) S-381", same brand "S-382", same brand "S-383", same brand "S-393", same brand "SC-101", same brand "SC-105", "KH-40" and "SA-100"[AGC Seimi Chemical Co., Ltd.]; "E1830", "E5844" [Daikin Fine Chemical Laboratory, Ltd.]; "EFTOP EF301", "EFTOP EF303", "EFTOP EF351" and "EFTOP EF352" [Mitsubishi Materials Electronic Chemicals Co., Ltd.].

When the polymerizable liquid crystal composition contains a leveling agent, its content is preferably 0.01 part by mass or more and 5 parts by mass or less, more preferably 0.05 parts by mass or more and 5 parts by mass or less, further preferably 0.05 parts by mass or more and 3 parts by mass or less with respect to 100 parts by mass of a polymerizable liquid crystal. When the content of a leveling agent is in the

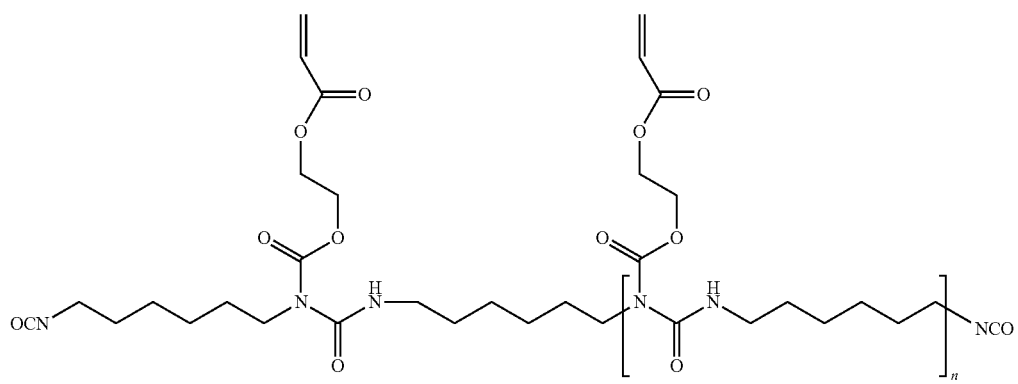

above-described range, horizontal orientation of a polymerizable liquid crystal is easy and the resultant polarization layer tends to be more even. When the content of a leveling agent with respect to a polymerizable liquid crystal is in the above-described range, there is a tendency that unevenness is scarcely generated in the resultant optically anisotropic layer.

It is preferable that the polymerizable liquid crystal composition contains at least one polymerization initiator. The polymerization initiator is a compound capable of initiating a polymerization reaction of a polymerizable liquid crystal, and a photopolymerization initiator is preferable since a polymerization reaction can be initiated at lower temperature condition. Specifically, photopolymerization initiators capable of generating an active radical or an acid by the action of light are mentioned, and of them, photopolymerization initiators generating a radical by the action of light are preferable.

The polymerization initiator includes a benzoin compound, a benzophenone compound, an alkylphenone compound, an acylphosphine oxide compound, a triazine compound, an iodonium salt and a sulfonium salt.

The benzoin compound includes benzoin, benzoin methyl ether, benzoin ethyl ether, benzoin isopropyl ether and benzoin isobutyl ether.

The benzophenone compound includes benzophenone, methyl o-benzoylbenzoate, 4-phenylbenzophenone, 4-benzoyl-4'-methyl diphenyl sulfide, 3,3',4,4'-tetra(tert-butylperoxycarbonyl)benzophenone and 2,4,6-trimethylbenzophenone.

The alkylphenone compound includes oligomers of diethoxyacetophenone,
2-methyl-2-morpholino-1-(4-methylthiophenyl)propan-1-one,
2-benzyl-2-dimethylamino-1-(4-morpholinophenyl)butan-1-one,
2-hydroxy-2-methyl-1-phenylpropan-1-one,
1,2-diphenyl-2,2-dimethoxyethan-1-one,
2-hydroxy-2-methyl-1[4-(2-hydroxyethoxy)phenyl]propan-1-one,
1-hydroxycyclohexyl phenyl ketone and
2-hydroxy-2-methyl-1[4-(1-methylvinyl)phenyl]propan-1-one.

The acylphosphine oxide compound includes
2,4,6-trimethylbenzoyl diphenylphosphine oxide and
bis(2,4,6-trimethylbenzoyl)phenylphosphine oxide.

The triazine compound includes
2,4-bis(trichloromethyl)-6-(4-methoxyphenyl)-1,3,5-triazine,
2,4-bis(trichloromethyl)-6-(4-methoxynaphthyl)-1,3,5-triazine,
2,4-bis(trichloromethyl)-6-(4-methoxystyryl)-1,3,5-triazine,
2,4-bis(trichloromethyl)-6-[2-(5-methylfuran-2-yl)ethenyl]-1,3,5-triazine,
2,4-bis(trichloromethyl)-6-[2-(furan-2-yl)ethenyl]-1,3,5-triazine,
2,4-bis(trichloromethyl)-6-[2-(4-diethylamino-2-methylphenyl)ethenyl]-1,3,5-triazine and
2,4-bis(trichloromethyl)-6-[2-(3,4-dimethoxyphenyl)ethenyl]-1,3,5-triazine.

As the polymerization initiator, commercially available products can be used. The commercially available polymerization initiator includes "Irgacure (registered trademark) 907", "Irgacure (registered trademark) 184", "Irgacure (registered trademark) 651", "Irgacure (registered trademark) 819", "Irgacure (registered trademark) 250", "Irgacure (registered trademark) 369" (Ciba Japan K.K.); "SEIKUOL (registered trademark) BZ", "SEIKUOL (registered trademark) Z", "SEIKUOL (registered trademark) BEE" (Seiko Chemical Co., Ltd.); "Kayacure (registered trademark) BP100" (Nippon Kayaku Co., Ltd.); "Kayacure (registered trademark) UVI-6992" (The Dow Chemical Company); "ADEKA OPTOMERSP-152", "ADEKA OPTOMERSP-170" (ADEKA Corporation); "TAZ-A", "TAZ-PP" (Nippon Siebel Hegner Ltd.); and "TAZ-104" (Sanwa Chemical Co., Ltd.).

When the polymerizable liquid crystal composition contains a polymerization initiator, its content can be appropriately adjusted depending on the kind of a polymerizable liquid crystal contained in the composition and its amount, and is preferably 0.1 to 30 parts by mass, more preferably 0.5 to 10 parts by mass, further preferably 0.5 to 8 parts by mass with respect to 100 parts by mass of a polymerizable liquid crystal. When the content of a polymerization initiator is in this range, the composition can be polymerized without disturbing orientation of a polymerizable liquid crystal.

When the polymerizable liquid crystal composition contains a photopolymerization initiator, the composition may further contain a photosensitizer. The photosensitizer includes xanthone compounds such as xanthone, thioxanthone and the like (for example, 2,4-diethylthioxanthone, 2-isopropylthioxanthone, and the like); anthracene compounds such as anthracene, alkoxy group-containing anthracene (for example, dibutoxyanthracene, etc.) and the like; phenothiazine and rubrene.

When the polymerizable liquid crystal composition contains a photopolymerization initiator and a photosensitizer, a polymerization reaction of a polymerizable liquid crystal contained in the composition can be more promoted. The use amount of a photosensitizer can be appropriately adjusted depending on the kind of a photopolymerization initiator and a polymerizable liquid crystal and its amount, and is preferably 0.1 to 30 parts by mass, more preferably 0.5 to 10 parts by mass, further preferably 0.5 to 8 parts by mass with respect to 100 parts by mass of a polymerizable liquid crystal.

To progress a polymerization reaction of a polymerizable liquid crystal more stably, the polymerizable liquid crystal composition may contain a suitable amount of a polymerization inhibitor, and by this, the degree of progress of a polymerization reaction of a polymerizable liquid crystal can be easily controlled.

The polymerization inhibitor includes radical scavengers such as hydroquinone, alkoxy group-containing hydroquinone, alkoxy group-containing catechol (for example, butylcatechol, etc.), pyrogallol, 2,2,6,6-tetramethyl-1-piperidinyloxy radical and the like; thiophenols; β-naphthylamines and β-naphthols.

When the polymerizable liquid crystal composition contains a polymerization inhibitor, its content can be appropriately adjusted depending on the kind of a polymerizable liquid crystal and its amount, and the use amount of a photosensitizer, and the like, and is preferably 0.1 to 30 parts by mass, more preferably 0.5 to 10 parts by mass, further preferably 0.5 to 8 parts by mass with respect to 100 parts by mass of a polymerizable liquid crystal. When the content of a polymerization inhibitor is in this range, the composition can be polymerized without disturbing orientation of a polymerizable liquid crystal.

The optically anisotropic film contained in the present elliptical polarization plate is a coating layer formed by polymerizing a polymerizable liquid crystal, and may also be composed of two coating layers.

The case of the optically anisotropic film composed of two coating layers includes a case obtained by combining a layer A having optical properties represented by the formulae (5), (7) and (8) and a layer B having optical properties represented by the formulae (6), (7) and (8) in a specific slow axis relationship, or a case obtained by combining a layer having optical properties represented by the formulae (1) to (3) and a layer having an optical property represented by the formula (4) described later, and the like.

$$100 < Re(550) < 160 \quad (5)$$

$$200 < Re(550) < 320 \quad (6)$$

$$Re(450)/Re(550) \geq 1.00 \quad (7)$$

$$1.00 \geq Re(650)/Re(550) \quad (8)$$

When the optically anisotropic layer has optical properties represented by the formula (7) and the formula (8), such an optically anisotropic film is preferably a coating layer formed by polymerizing a polymerizable liquid crystal (B).

The layer A is preferably a coating layer formed by polymerizing a polymerizable liquid crystal (B). The layer B is preferably a coating layer formed by polymerizing a polymerizable liquid crystal (C).

The method of combining a layer having optical properties represented by the formulae (5), (7) and (8) with a layer having optical properties represented by the formulae (6), (7) and (8) in a specific slow axial relationship includes well-known methods. The well-known methods are not limited to lamination of a coating layer formed by polymerizing a polymerizable liquid crystal.

For example, JP-A No. 10-68816 and JP-A No. 10-90521 disclose a phase difference film obtained by laminating two polymer films showing anisotropy. For example, JP-A No. 2001-4837, JP-A No. 2001-21720 and JP-A No. 2000-206331 disclose a phase difference film having at least two optically anisotropic films each composed of a liquid crystal compound. It is also possible that one of these two optically anisotropic films is a polymer film and the other is an optically anisotropic film composed of a liquid crystal compound.

The present elliptical polarization plate may contain an optically anisotropic film composed of a coating layer satisfying the following formula (4)

$$nx \approx ny < nz \quad (4)$$

That the optically anisotropic layer satisfies the formula (4) means manifestation of phase difference in the thickness direction. For the layer formed by polymerizing a polymerizable liquid crystal to manifest phase difference in the thickness direction, it is advantageous to orient the polymerizable liquid crystal in a suitable direction. In the present invention, manifestation of phase difference in the thickness direction is defined as indicating a property under which Rth (phase difference value in thickness direction) is negative in the formula (20). Rth can be calculated from the phase difference value (R40) measured with inclining an in-plane fast axis at an angle of 40° as an inclined axis and from the in-plane phase difference value (Re). That is, Rth can be calculated by determining nx, ny and nz according to the following formulae (21) to (23) from Re, $R_{40}$, d (thickness of optically anisotropic film) and n0 (average refractive index of optically anisotropic film) and substituting them into the formula (20).

$$Rth = [(nx+ny)/2 - nz] \times d \quad (20)$$

$$Re = (nx-ny) \times d \quad (21)$$

$$R_{40} = (nx-ny') \times d/\cos(\phi) \quad (22)$$

$$(nx+ny+nz)/3 = n0 \quad (23)$$

Here, $$\phi = \sin^{-1}[\sin(40°)/n0]$$

$$ny' = ny \times nz/[ny^2 \times \sin^2(\phi) + nz^2 \times \cos^2(\phi)]^{1/2}$$

nx, ny and nz are as defined above.

When the polymerizable liquid crystal is in the form of a rod, phase difference in the thickness direction is manifested by orienting the optical axis of the polymerizable liquid crystal vertically to the base material plane. When the polymerizable liquid crystal is in the form of a disk, phase difference in the thickness direction is manifested by orienting the optical axis of the polymerizable liquid crystal horizontally to the base material plane. In the case of a disk-shaped polymerizable liquid crystal, the optical axis of the polymerizable liquid crystal is parallel to the base material plane, therefore, when Re is determined, the thickness is fixed, thus Rth is unambiguously determined, while in the case of a rod-shaped polymerizable liquid crystal, the optical axis of the polymerizable liquid crystal is vertical to the base material plane, therefore, Rth can be controlled without changing Re by regulating the thickness of the optically anisotropic film.

When the optical axis of a rod-shaped polymerizable liquid crystal is oriented vertically to the base material plane, the refractive index correlation of the resultant optically anisotropic film is nx≈ny<nz (positive C plate), and the axis of the direction of nz in an index ellipsoid and the slow axis direction thereof coincide with each other.

When the optical axis of a disk-shaped polymerizable liquid crystal is oriented parallel to the base material plane, the refractive index correlation of the resultant optically anisotropic film is nx<ny≈nz (negative A plate), and the axis of the direction of ny in an index ellipsoid and the slow axis direction thereof coincide with each other.

The in-plane phase difference value Re(550) of the optically anisotropic layer satisfying the formula (4) (hereinafter, referred to as positive layer C in some cases) is usually in the range of 0 to 10 nm, preferably in the range of 0 to 5 nm. The phase difference value Rth in the thickness direction is usually in the range of −10 to −300 nm, preferably in the range of −20 to −200 nm. Such in-plane phase difference value Re(550) and phase difference value Rth in the thickness direction can be can be controlled by the same method as for the above-described optically anisotropic layer.

The positive layer C is preferably a coating layer formed by polymerizing at least one polymerizable liquid crystal. More preferably, it is a coating layer formed by polymerizing a polymerizable liquid crystal (B).

The present elliptical polarization plate may have an optically anisotropic film composed of three or more coating layers. For example, it is obtained by laminating a layer B having optical properties represented by the formulae (6), (7) and (8) on a layer A having optical properties represented by the formulae (5), (7) and (8) in a specific slow axis relationship, and further laminating a positive layer C.

The lamination order of a layer A, a layer B and a positive layer C is not particularly restricted excepting the slow axis relationship of a layer A and a layer B, and it is possible to laminate them in any order.

It is permissible that a layer A is formed via or not via an orientation film on a base material, a layer B is formed via or not via an orientation film on the layer A, and a positive layer C is formed via or not via an orientation film on the layer B.

It is permissible that a layer B is formed via or not via an orientation film on a base material, a layer A is formed via or not via an orientation film on the layer B, and a positive layer C is formed via or not via an orientation film on the layer A.

It is permissible that a positive layer C is formed via or not via an orientation film on a base material, a layer A is formed via or not via an orientation film on the positive layer C, and a layer B is formed via or not via an orientation film on the layer A.

It is permissible that a positive layer C is formed via or not via an orientation film on a base material, a layer B is formed via or not via an orientation film on the positive layer C, and a layer A is formed via or not via an orientation film on the layer C.

It is permissible that a layer A is formed via or not via an orientation film on one surface of a base material, a layer B is formed via or not via an orientation film on the layer A, and a positive layer C is formed via or not via an orientation film on the other surface of a base material It is permissible that a layer B is formed via or not via an orientation film on one surface of a base material, a layer A is formed via or not via an orientation film on the layer B, and a positive layer C is formed via or not via an orientation film on the other surface of a base material When a layer B is formed via or not via an orientation film on a layer A or when a layer A is formed via or not via an orientation film on a layer B, a protective layer may be present between the layer A and the layer B. When a layer A is formed via or not via an orientation film on a positive layer C, when a layer A is formed via or not via an orientation film on a positive layer C, when a positive layer C is formed via or not via an orientation film on a layer A or when a positive layer C is formed via or not via an orientation film on a layer B, a protective layer may be present between the positive layer C and the layer A or layer B.

<Protective Layer>

It is preferable that the protective layer is usually formed of a protective layer forming composition containing a solvent and a water-soluble polymer such as acrylic oligomers or polymers composed of poly-functional acrylate (methacrylate), urethane acrylate, polyester acrylate, epoxy acrylate and the like; polyvinyl alcohol, ethylene-vinyl alcohol copolymer, polyvinylpyrrolidone, starches, methylcellulose, carboxymethylcellulose, sodium alginate and the like.

The solvent contained in a protective layer forming composition includes the same solvents as described above, and of them, at least one solvent selected from the group consisting of water, alcohol solvents and ether solvents is preferable since a layer forming a protective layer is not dissolved therein. The alcohol solvent includes methanol, ethanol, butanol, ethylene glycol, isopropyl alcohol, propylene glycol, ethylene glycolmethyl ether, ethylene glycolbutyl ether and propylene glycol monomethyl ether. The ether solvent includes ethylene glycol monomethyl ether acetate and propylene glycol monomethyl ether acetate. Of them, ethanol, isopropyl alcohol, propylene glycol monomethyl ether and propylene glycol monomethyl ether acetate are preferable.

The thickness of the protective layer is usually 20 µm or less. The thickness of the protective layer is preferably 0.5 µm or more and 10 µm or less, more preferably 1 µm or more and 5 µm or less. The thickness of the protective layer can be determined usually by measurement with an interference thickness meter, a laser microscope or a contact-type thickness meter.

The present elliptical polarization plate may have an optically anisotropic film containing a coating layer formed by polymerizing a polymerizable liquid crystal on a drawn film.

<Drawn Film>

The drawn film is usually obtained by drawing a base material. In a method of drawing a base material, for example, a roll carrying a base material wound on the roll (wound body) is prepared, the base material is continuously wound off from such a wound body, and the base material wound off is conveyed to a heating furnace. The set temperature of a heating furnace is in the range from the approximate glass transition temperature (° C.) of the base material to [glass transition temperature+100] (° C.), preferably in the range from the approximate glass transition temperature (° C.) of the base material to [glass transition temperature+50] (° C.). In the heating furnace, a uniaxial or biaxial hot drawing treatment is conducted while controlling the conveying direction and tension and making inclination at any angle, in performing drawing to the traveling direction of the base material or to a direction orthogonally crossing the traveling direction. The drawing magnification is usually 1.1 to 6 times, preferably 1.1 to 3.5 times.

The method of drawing in an oblique direction is not particularly restricted providing that the orientation axis can be continuously inclined at desired angle, and a known drawing method can be adopted. Such a drawing method includes, for example, methods described in JP-A No. 50-83482 and JP-A No. 2-113920. When a film is endowed with a phase difference nature by performing drawing, the thickness after drawing is determined by the thickness before drawing and drawing magnification.

The drawn film having phase difference in the thickness direction includes, for example, drawn films having refractive index correlation of nx<ny<nz described in JP-A No. 2008-129465 and known multi-layered extruded films. Even the film having refractive index correlation of nx<ny<nz can obtain the same effect as in the case of nx≈ny<nz since nz is relatively larger.

The slow axis direction of a drawn film varies depending on a drawing method, and the slow axis and the optical axis are determined depending on its drawing method such as uniaxial, biaxial or diagonal drawing and the like.

The in-plane phase difference value of a drawn film and the phase difference value in the thickness direction thereof can be regulated by $\Delta n(\lambda)$ and film thickness d as in the case with the layer formed by polymerizing a polymerizable liquid crystal.

The above-described drawn film obtained by drawing a polymer film having a specific structure and having optical properties represented by the formula (1) and the formula (2) includes, for example, commercially available drawn films composed of a polycarbonate resin, specifically, "PURE-ACE (registered trademark) WR" (manufactured by Teijin Limited) and the like.

The thickness of the drawn film is usually 300 µm or less, preferably 5 µm or more and 100 µm or less, more preferably 10 µm or more and 50 µm or less. When optically anisotropic film is an optically anisotropic layer formed by polymerizing a polymerizable liquid crystal, its thickness is usually 20 µm or less, preferably 5 µm or less, more preferably 0.5 µm or more and 5 m or less. The thickness of the optically anisotropic layer can be determined by measurement with an interference thickness meter, a laser microscope or a contact-type thickness meter.

When the layer A is a drawn film, its thickness is usually 150 µm or less, preferably 5 µm or more and 100 µm or less, more preferably 10 µm or more and 50 µm or less. When the layer A is an optically anisotropic layer formed by polymerizing a polymerizable liquid crystal, its thickness is usually 10 µm or less, preferably 5 µm or less, more preferably 0.5 µm or more and 2 µm or less. The thickness of the layer A can be determined by the same method as for the optically anisotropic layer.

When the layer B is a drawn film, its thickness is usually 150 μm or less, preferably 5 μm or more and 100 μm or less, more preferably 10 μm or more and 50 μm or less. When the layer B is an optically anisotropic layer formed by polymerizing a polymerizable liquid crystal, its thickness is usually 20 μm or less, preferably 10 μm or less, more preferably 0.5 μm or more and 5 μm or less. The thickness of the layer B can be determined by the same method as for the optically anisotropic layer.

When the positive layer C is a drawn film, its thickness is usually 300 μm or less, preferably 5 μm or more and 100 μm or less, more preferably 10 μm or more and 50 μm or less. When the positive layer C is a layer formed by polymerizing a polymerizable liquid crystal, its thickness is usually 10 μm or less, preferably 5 μm or less, more preferably 0.3 μm or more and 3 μm or less. The thickness of the positive layer C can be determined by the same method as for the above-described optically anisotropic layer.

Next, the method of continuously producing an optically anisotropic film will be illustrated. Such suitable methods for continuously producing and optically anisotropic film include a method according to the Roll to Roll mode. A method of producing an optically anisotropic film formed by polymerizing a polymerizable liquid crystal will be described here, however, an optically anisotropic film composed of a drawn film may be used instead of the optically anisotropic film formed by polymerizing a polymerizable liquid crystal, and in this case, "polymerizable liquid crystal composition is coated" in the following production step may be replaced by "drawn film is laminated".

Production methods having typical constitutions are exemplified below, and other constitutions may be carried out according to the following production methods.

In certain methods,
(1) a step of preparing a roll carrying a base material wound on a winding core,
(2) a step of continuously delivering the base material from the roll,
(3) a step of continuously forming an orientation film on the base material,
(4) a step of coating a polymerizable liquid crystal composition on the orientation film, and continuously forming a first optically anisotropic layer,
(5) a step of continuously forming a protective layer on the first optically anisotropic layer obtained in the above-described (4),
(6) a step of continuously forming an orientation film on the protective layer obtained in the above-described step (5),
(7) a step of coating a polymerizable liquid crystal composition on the orientation film obtained in the above-described (6), and continuously forming a positive layer C,
(8) a step of winding the optical film obtained continuously on a second winding core to obtain a second roll are conducted in series. The steps (3), (5) and (6) may be omitted if necessary, and in this case, "on the orientation film" in the step (4) is replaced by "on the base material", "the protective layer obtained in the above-described (5)" in the step (6) is replaced by"the first optically anisotropic layer", and "the orientation film obtained in the above-described (6)" in the step (7) is replaced by "the first optically anisotropic layer" or "the protective layer obtained in the above-described (5)". For suppressing wrinkle and curl in conveyance, a protective film may be pasted in conveying a film in each step.

Further,
(1a) a step of preparing a roll carrying a base material wound on a winding core,
(2a) a step of continuously delivering the base material from the roll,
(3a) a step of continuously forming an orientation film on the base material,
(4a) a step of coating a polymerizable liquid crystal composition on the orientation film, and continuously forming a positive layer C,
(5a) a step of continuously forming a protective layer on the positive layer C obtained in the above-described (4a),
(6a) a step of continuously forming an orientation film on the protective layer obtained in the above-described step (5a),
(7a) a step of coating a polymerizable liquid crystal composition on the orientation film obtained in the above-described (6a), and continuously forming a first optically anisotropic layer,
(8a) a step of winding the optically anisotropic film obtained continuously on a winding core, to obtain a second roll are conducted in series in certain methods. The steps (3a), (5a) and (6a) may be omitted if necessary, and in this case, "on the orientation film" in the step (4a) is replaced by "on the base material", "the protective layer obtained in the above-described (5a)" in the step (6a) is replaced by "the positive layer C", and "the orientation film obtained in the above-described (6a)" in the step (7a) is replaced by "the positive layer C" or "the protective layer obtained in the above-described (5a)". For suppressing wrinkle and curl in conveyance, a protective film may be pasted in conveying a film in each step.

Further,
(1b) a step of preparing a roll carrying a base material wound on a winding core,
(2b) a step of continuously delivering the base material from the roll,
(3b) a step of continuously forming an orientation film on the base material,
(4b) a step of coating a polymerizable liquid crystal composition on the orientation film, and continuously forming a first optically anisotropic layer,
(5b) a step of continuously forming an orientation film on the surface of a base material opposite to the first optically anisotropic layer obtained in the above-described (4b),
(6b) a step of coating a polymerizable liquid crystal composition on the orientation film obtained in the above-described (5b), and continuously forming the positive layer C,
(7b) a step of winding the optically anisotropic film obtained continuously on a second winding core, to obtain a second roll are conducted in series in certain methods. The steps (3b) and (5b) may be omitted if necessary, and in this case, "on the orientation film" in the step (4b) is replaced by "on the base material", and "on the orientation film obtained in the above-described (5b)" in the step (6b) is replaced by "the surface of a base material opposite to the first optically anisotropic layer obtained in the above-described (4b)". For suppressing wrinkle and curl in conveyance, a protective film may be pasted in conveying a film in each step.

Further,
(1c) a step of preparing a roll carrying a transparent base material wound on a winding core,
(2c) a step of continuously delivering the transparent base material from the roll,
(3c) a step of continuously forming an orientation film on the transparent base material, (4c) a step of coating a polymerizable liquid crystal composition on the orientation film, and continuously forming the positive layer C, (5c) a step of continuously forming an orientation film on the surface of a base material opposite to the positive layer C obtained in the above-described (4c), (6c) a step of coating a polymerizable liquid crystal composition on the orientation film obtained in the above-described (5c), and continuously forming a first optically anisotropic film, (7c) a step of winding the optical film obtained continuously on a second winding core to obtain a second roll are conducted in series in certain methods. The steps (3c) and (5c) may be omitted if necessary, and in this case, "on the orientation film" in the step (4c) is replaced by "on the base material", and "on the orientation film obtained in the above-described (5c)" in the step (6c) is replaced by "the surface of a base material opposite to the optically anisotropic layer satisfying the formula (4) obtained in the above-described (4c)". For suppressing wrinkle and curl in conveyance, a protective film may be pasted in conveying a film in each step.

Further, (1d) a step of preparing a roll carrying a base material wound on a winding core, (2d) a step of continuously delivering the base material from the roll, (3d) a step of continuously forming an orientation film on the base material, (4d) a step of coating a polymerizable liquid crystal composition on the orientation film to continuously form a layer A, (5d) a step of continuously forming a protective layer on the layer A obtained in the above-described step (4d), (6d) a step of continuously forming an orientation film on the protective layer obtained in the above-described step (5d), (7d) a step of coating a polymerizable liquid crystal composition on the orientation film obtained in the above-described step (6d) to continuously form a layer B, (8d) a step of continuously forming a protective layer on the layer B obtained in the above-described step (7d), (9d) a step of continuously forming an orientation film on the protective layer obtained in the above-described step (8d), (10d) a step of coating a polymerizable liquid crystal composition on the orientation film obtained in the above-described (9d), and continuously forming the positive layer C, (11d) a step of winding the optically anisotropic film obtained continuously on a second winding core, to obtained a second roll are conducted in series in certain methods. The steps (3d), (5d), (6d), (8d) and (9d) may be omitted if necessary, and in this case, "on the orientation film" in the step (4d) is replaced by "on the base material", "the protective layer obtained in the above-described (5d)" in the step (6d) is replaced by "the layer A", "the orientation film obtained by the above-described (6d)" in the step (7d) is replaced by "the layer A" or "the protective layer obtained in the above-described (5d)", "the protective layer obtained in the above-described (8d)" in the step (9d) is replaced by "the layer B", and "the orientation film obtained in the above-described (9d)" in the step (10d) is replaced by "the layer B" or "the protective layer obtained in the above-described (9d)". For suppressing wrinkle and curl in conveyance, a protective film may be pasted in conveying a film in each step.

<Adhesive>

The adhesive includes, for example, a sticky agent, an aqueous adhesive and an active energy ray curable adhesive.

The sticky agent is obtained, in general, by radical-polymerizing an acrylic monomer mixture containing a (meth)acrylate as the main component and containing a small amount of a (meth)acryl monomer having a functional group, in the presence of a polymerization initiator, and acrylic sticky agents containing an acrylic resin having a glass transition temperature Tg of 0° C. or lower and a cross-linking agent are preferably used.

Of (meth)acrylates, alkyl acrylates are preferable, and particularly, n-butyl acrylate, 2-methoxyethyl acrylate and ethoxymethyl acrylate are preferable.

The (meth)acryl monomer having a functional group as another monomer component constituting an acrylic resin is a compound having in the molecule one (meth)acryloyl group as an olefinic double bond and having in the same molecule a polar functional group such as a hydroxyl group, a carboxyl group, an amide group, an amino group or an epoxy group. Of them, preferable are acryl monomers in which the acryloyl group is an olefinic double bond. As examples of such an acryl monomer having a functional group, 2-hydroxyethyl acrylate is preferable as one having a hydroxyl group, and acrylic acid is preferable as one having a carboxyl group.

The acryl monomer mixture as a raw material of an acrylic resin may further contain a monomer (hereinafter, referred to as "third monomer" in some cases) other than (meth)acrylates and (meth)acryl monomers having a functional group described above. Examples thereof include monomers having in the molecule one olefinic double bond and at least one aromatic ring, styrenic monomers, (meth)acrylates having in the molecule an alicyclic structure, vinyl monomers, monomers having in the molecule a plurality of (meth)acryloyl groups, and the like.

Especially, the monomers having in the molecule one olefinic double bond and at least one aromatic ring are one of preferable examples. Of them, 2-phenoxyethyl(meth)acrylate, 2-(2-phenoxyethoxy)ethyl(meth)acrylate, (meth)acrylate of ethylene oxide-modified nonylphenol, 2-(o-phenylphenoxy)ethyl(meth)acrylate are preferable, and of them, 2-phenoxyethyl acrylate is further preferable.

The monomers (third monomer) other than (meth)acrylates and (meth)acryl monomers having a functional group may be used each singly, or different kinds of them may be used in combination. Structural units derived from these third monomers can be present in an amount of usually in the range of 0 to 20 wt %, preferably 0 to 10 wt % based on the whole acrylic resin.

It is preferable that the acrylic resin constituting an acrylic sticky agent has a standard polystyrene-equivalent weight-average molecular weight Mw according to gel permeation chromatography (GPC) of 1000000 to 2000000. It is preferable that this weight-average molecular weight Mw is 1000000 or more since adhesiveness under high temperature and high humidity is improved, a possibility of generating floating and peeling between a sticky agent layer and a glass base plate constituting a liquid crystal cell tends to decreases, and additionally, a rework property tends to improve. It is preferable that the above-described weight-average molecular weight Mw of an acrylic resin is 2000000 or less since even if the size of a polarization plate varies, the sticky agent layer follows the size variation, thus, light absence and color unevenness of a display tend to be suppressed. Further, it is preferable that the molecular weight distribution represented by the ratio Mw/Mn of the weight-average molecular weight Mw to the number-average molecular weight Mn is in the range of 3 to 7.

The acrylic resin contained in an acrylic sticky agent can be constituted only of a resin having relatively high molecular weight as described above, however, it can also be constituted of a mixture of the resin with other acrylic resin. Examples of the acrylic resin which can be mixed include those containing as the main component a structural unit derived from a (meth) acrylate represented by the above-described formula (I) and having a weight-average molecular weight of 50000 to 300000, and the like.

The above-described acrylic resin constituting an acrylic sticky agent can be produced by various known methods such as, for example, a solution polymerization method, an emulsion polymerization method, a bulk polymerization method, a suspension polymerization method and the like. In the production of this acrylic resin, a polymerization initiator is usually used. The polymerization initiator includes azo compounds, organic peroxides, inorganic peroxides, redox initiators using a peroxide and a reducing agent together, and the like. Of them, 2,2'-azobisisobutyronitrile, benzoyl peroxide, ammonium persulfate and the like are preferably used. The polymerization initiator is used usually in a proportion of about 0.001 to 5 parts by mass with respect to 100 parts by mass of the total amount of monomers as a raw material of an acrylic resin.

Thus obtainable acrylic resin is blended with a cross-linking agent to obtain a sticky agent. The cross-linking agent is a compound having in the molecule at least two functional groups cross-linkable with a structural unit derived from a monomer having a polar functional group in an acrylic resin, and examples thereof include isocyanate compounds, epoxy compounds, metal chelate compounds, aziridine compounds and the like.

Of these cross-linking agents, isocyanate compounds are preferably used. The isocyanate compound can be used in the form of a compound having in the molecule at least two isocyanato groups (—NCO) by itself, and additionally, in the form of an adduct obtained by reacting it with a polyol, a dimer thereof, a trimer thereof, and the like. Specific examples thereof include tolylene diisocyanate, an adduct obtained by reacting tolylene diisocyanate with a polyol, a dimer of tolylene diisocyanate, a trimer of tolylene diisocyanate, hexamethylene diisocyanate, an adduct obtained by reacting hexamethylene diisocyanate with a polyol, a dimer of hexamethylene diisocyanate, a trimer of hexamethylene diisocyanate, and the like.

The cross-linking agent is blended usually in a proportion of about 0.01 to 5 parts by mass with respect to 100 parts by mass of an acrylic resin, and preferably blended in a proportion of especially 0.1 to 5 parts by mass, further 0.2 to 3 parts by mass. When the blending amount of the cross-linking agent with respect to 100 parts by mass of the acrylic resin is 0.01 part by mass or more, especially 0.1 part by mass or more, durability of a sticky agent layer tends to improve.

The sticky agent can also be blended with other components if necessary. The blendable other components include conductive fine particles such as metal fine particles, metal oxide fine particles or fine particles coated with a metal and the like, ion conductive compositions, ionic compounds having an organic cation or anion, silane coupling agents, cross-linking catalysts, weathering stabilizers, tackifiers, plasticizers, softening agents, dyes, pigments, inorganic fillers, resins other than the above-described acrylic resins, light diffusible fine particles such as organic beads, and the like. Further, it is also useful that the sticky agent is blended with an ultraviolet curable compound, a sticky agent layer is formed, then, cured by irradiating with ultraviolet, to give a harder sticky agent layer.

These components constituting a sticky agent are usually dissolved in a suitable solvent such as ethyl acetate and the like and used as a sticky agent composition. A sticky agent layer is obtained by coating the sticky agent composition on a suitable base material and drying this. Though there are some components undissolvable in a solvent, it may be permissible that these are dispersed in the system.

As the method of forming a sticky agent layer on the present optical film, there are adopted, for example, a method in which a peeling film is used as a base material, the above-described sticky agent composition is coated to form a sticky agent layer, and the resultant sticky agent layer is transferred onto the surface of the present optical film, a method in which the above-described sticky agent composition is coated directly on the surface of the present optical film to form a sticky agent layer, and the like. It is also possible that a sticky agent layer is formed on one peeling film, then, another peeling film is further pasted on this sticky agent layer, to give a double-sided separator type sticky agent sheet. Such a double-sided separator type sticky agent sheet is pasted on the present optical film after peeing one peeling film in necessary time. Commercially available products of the double-sided separator type sticky agent sheet include, for example, non-carrier sticky agent films and non-carrier sticky agent sheets marketed from Lintec Corporation and Nitto Denko Corporation.

The peeling film can be, for example, one in which a film made of various resins such as polyethylene terephthalate, polybutylene terephthalate, polycarbonate, polyarylate, polypropylene or polyethylene is used as a base material, and the bonding plane to a sticky agent layer of this base material is subjected to a releasing treatment such as a silicone treatment. Such a peeling film is called also a separate film or a separator.

The thickness of a sticky agent layer is preferably 5 to 50 µm, more preferably 5 to 30 µm. When the thickness of a sticky agent layer is 30 µm or less, adhesiveness under high temperature and high humidity is improved, a possibility of generating floating and peeling between a display and a sticky agent layer tends to decreases, and a rework property tends to improve. When the thickness is 5 µm or more, even if the size of a polarization plate pasted on this varies, the sticky agent layer follows the size variation, thus, durability against size variation is improved.

The aqueous adhesive is generally a composition using a polyvinyl alcohol resin or urethane resin as the main component and in which a cross-linking agent or curable compound such as isocyanate compounds and epoxy compounds is blended for improving adhesiveness.

In the case of use of a polyvinyl alcohol resin as the main component of an aqueous adhesive, modified polyvinyl alcohol resins such as a carboxyl group-modified polyvinyl alcohol, an acetoacetyl group-modified polyvinyl alcohol, a methylol group-modified polyvinyl alcohol and an amino group-modified polyvinyl alcohol may be used in addition to partially saponified polyvinyl alcohols and perfectly saponified polyvinyl alcohols. An aqueous solution of such a polyvinyl alcohol resin is used as the aqueous adhesive, and the concentration of the polyvinyl alcohol resin in the aqueous adhesive is usually 1 to 10 parts by mass, preferably 1 to 5 parts by mass with respect to 100 parts by mass of water.

The aqueous adhesive composed of an aqueous solution of a polyvinyl alcohol resin can be blended with a curable compound such as a poly-valent aldehyde, a water-soluble epoxy resin, a melamine compound, a zirconia-based compound and a zinc compound for improving adhesiveness as described above. Examples of the water-soluble epoxy resin include water-soluble polyamideepoxy resins obtained by reacting epichlorohydrin with a polyamidepolyamine obtained by a reaction of a polyalkylenepolyamine such as diethylenetriamine and triethylenetetramine and a dicarboxylic acid such as adipic acid. Commercially available products of such polyamideepoxy resins include "Sumirez Resin 650" and "Sumirez Resin 675" marketed from Sumika Chemtex Co., Ltd., "WS-525" marketed from Nippon PMC Corporation, and the like. When the water-soluble epoxy resin is blended, its addition amount is usually about 1 to 100 parts by mass, preferably 1 to 50 parts by mass with respect to 100 parts by mass of a polyvinyl alcohol resin.

In the case of use of a urethane resin as the main component of an aqueous adhesive, it is effective to use a polyester ionomer type urethane resin as the main component of an aqueous adhesive. The polyester ionomer type urethane resin referred to here is a urethane resin having a polyester skeleton and containing a small amount of an ionic component (hydrophilic component) introduced therein. Such an ionomer type urethane resin can be used as an aqueous adhesive since it is emulsified directly in water to give an emulsion without using an emulsifier. In the case of use of the polyester ionomer type urethane resin, it is effective to blend a water-soluble epoxy compound as a cross-linking agent. To use the polyester ionomer type urethane resin as an adhesive for a polarization plate is described, for example, in JP-A No. 2005-70140 and JP-A No. 2005-208456.

These components constituting an aqueous adhesive are usually used in the state of dissolution in water. An adhesive layer is obtained by coating an aqueous adhesive on a suitable base material and drying this. Components undissolvable in water may be in the state of dispersion in the system.

The method of forming the above-described adhesive layer on the present optical film includes a method of coating the above-described adhesive composition directly on the surface of the present optical film to form an adhesive layer, and the like. The thickness of the above-described adhesive layer is usually about 0.001 to 5 μm, preferably 0.01 μm or more and preferably 2 μm or less, further preferably 1 μm or less. When the adhesive layer is too thick, the appearance of a polarization plate tends to be poor.

For example, if an aqueous adhesive is injected between a polarization plate and an optically anisotropic film and then a thermal cross-linking reaction is progressed while evaporating water by heating, both the bodies can be endowed with sufficient adhesiveness.

The active energy ray curable adhesive may be one which cures by undergoing irradiation with active energy ray and can adhere a polarization plate and an optically anisotropic film at strength sufficient for practical use. Examples thereof include a cation polymerizable active energy ray curable adhesive containing an epoxy compound and a cation polymerization initiator, a radical polymerizable active energy ray curable adhesive containing an acrylic curing component and a radical polymerization initiator, an active energy ray curable adhesive containing both a cation polymerizable curing component such as an epoxy compound and a radical polymerizable curing component such as an acrylic compound and blended with a cation polymerization initiator and a radical polymerization initiator, an electron beam curable adhesive which cures by irradiating an active energy ray curable adhesive containing no initiator with an electron beam, and the like. Preferable is a radical polymerizable active energy ray curable adhesive containing an acrylic curing component and a radical polymerization initiator. Further, a cation polymerizable active energy ray curable adhesive containing an epoxy compound and a cation polymerization initiator, which can be used substantially with no solvent, is preferable.

An active energy ray curable adhesive which is a cation polymerizable epoxy compound, liquid itself at room temperature and has suitable flowability even in the absence of a solvent, for which one giving suitable curing adhesion strength is selected, and which is blended with a cation polymerization initiator suitable for this is capable of omitting a drying equipment usually necessary in a step of adhering a polarizer with a transparent protective film in a polarization plate production equipment. It is also possible to promote the curing speed and improve the production speed by irradiation with suitable active energy dose.

The epoxy compound used in such an adhesive can be, for example, a glycidyl etherified compound of an aromatic compound or linear compound having a hydroxyl group, a glycidyl aminated compound of a compound having an amino group, an epoxide of a linear compound having a C—C double bond, an alicyclic epoxy compound in which a glycidyloxy group or an epoxyethyl group is bonded to a saturated carbocycle directly or via an alkylene or an epoxy group is bonded to a saturated carbocycle directly, and the like. The epoxy compounds may be used each singly or different several kinds of them may be used in combination. Of them, an alicyclic epoxy compound is preferably used because of excellent cation polymerizability.

The glycidyl etherified compound of an aromatic compound or linear compound having a hydroxyl group can be produced, for example, by a method of addition-condensing epichlorohydrin to a hydroxyl group of the aromatic compound or linear compound under basic condition. Such a glycidyl etherified compound of an aromatic compound or linear compound having a hydroxyl group includes diglycidyl ether of bisphenols, polycyclic aromatic epoxy resins, diglycidyl ether of an alkylene glycol or polyalkylene glycol, and the like.

The diglycidyl ether of bisphenols includes, for example, a glycidyl etherified compound of bisphenol A and its oligomer, a glycidyl etherified compound of bisphenol F and its oligomer, a glycidyl etherified compound of 3,3',5,5'-tetramethyl-4,4'-biphenol and its oligomer, and the like.

The polycyclic aromatic epoxy resin includes, for example, a glycidyl etherified compound of a phenol novolak resin, a glycidyl etherified compound of a cresol novolak resin, a glycidyl etherified compound of a phenol aralkyl resin, a glycidyl etherified compound of a naphthol aralkyl resin, a glycidyl etherified compound of a phenol dicyclopentadiene resin, and the like. Further, a glycidyl etherified compound of trisphenols and its oligomer, and the like, are also included in the polycyclic aromatic epoxy resin.

The diglycidyl ether of an alkylene glycol or polyalkylene glycol includes, for example, a glycidyl etherified compound of ethylene glycol, a glycidyl etherified compound of diethylene glycol, a glycidyl etherified compound of 1,4-butanediol, a glycidyl etherified compound of 1,6-hexanediol, and the like.

The glycidyl aminated compound of a compound having an amino group can be produced, for example, by a method of addition-condensing epichlorohydrin to an amino group of a compound under basic condition. The compound having an amino group may have a hydroxyl group simultaneously. Such a glycidyl aminated compound of a compound having an amino group includes a glycidyl aminated compound of 1,3-phenylenediamine and its oligomer, a glycidyl aminated compound of 1,4-phenylenediamine and its oligomer, a glycidyl aminated compound and glycidyl etherified compound of 3-aminophenol and its oligomer, a glycidyl aminated compound and glycidyl etherified compound of 4-aminophenol and its oligomer, and the like.

The epoxide of a linear compound having a C—C double bond can be produced by a method of epoxidizing a C—C double bond of a linear compound using a peroxide under basic condition. The linear compound having a C—C double bond includes butadiene, polybutadiene, isoprene, pentadiene, hexadiene and the like. Terpenes having a double bond can also be used as an epoxidation raw material, and linalool is mentioned as an acyclic monoterpene. The peroxide used in epoxidation can be, for example, hydrogen peroxide, peracetic acid, tert-butyl hydroperoxide or the like.

The alicyclic epoxy compound in which a glycidyloxy group or epoxyethyl group is bonded to a saturated carbocycle directly or via an alkylene can be a glycidyl etherified compound of a hydrogenated polyhydroxy compound obtained by hydrogenating an aromatic ring of an aromatic compound having a hydroxyl group typified by bisphenols mentioned above, a glycidyl etherified compound of a cycloalkane compound having a hydroxyl group, an epoxide of a cycloalkane compound having a vinyl group, or the like.

As the epoxide explained above, commercially available products can be obtained easily, and examples thereof include "jER" series marketed from Mitsubishi Chemical Corporation, "EPICLON" marketed from DIC CORPORATION, "EPOTOTO (registered trademark)" marketed from Tote Kasei Co., Ltd., "ADEKA RESIN (registered trademark)" marketed from ADEKA Corporation, "DENACOL (registered trademark)" marketed from Nagase Chemtex Corporation, "DOWEPOXY" marketed from The Dow Chemical Company, "TEPIC (registered trademark)" marketed from Nissan Chemical Industries, Ltd., and the like, each being a trade name.

By contrast, the alicyclic epoxy compound in which an epoxy group is bonded to a saturated carbocycle directly can be produced, for example, by a method of epoxidizing a C—C double bond of a non-aromatic cyclic compound having a C—C double bond in the ring using a peroxide under basic condition. The non-aromatic cyclic compound having a C—C double bond in the ring includes, for example, a compound having a cyclopentene ring, a compound having a cyclohexene ring, a polycyclic compound in which at least two carbon atoms are further bonded to a cyclopentene ring or cyclohexene ring to form an additional ring, and the like. The non-aromatic cyclic compound having a C—C double bond in the ring may have a C—C double bond outside the ring. Examples of the non-aromatic cyclic compound having a C—C double bond in the ring include cyclohexene, 4-vinylcyclohexene, limonene and α-pinene as a monocyclic monoterpene, and the like.

The alicyclic epoxy compound in which an epoxy group is bonded directly to a saturated carbocycle may also be a compound in which at least two alicyclic structures having an epoxy group bonded directly to the ring as described above are formed in the molecule via a suitable linking group. The linking group referred to here includes, for example, an ester bond, an ether bond, an alkylene bond and the like.

Specific examples of the alicyclic epoxy compound in which an epoxy group is bonded directly to a saturated carbocycle include those listed below.
3,4-epoxycyclohexylmethyl 3,4-epoxycyclohexanecarboxylate,
1,2-epoxy4-vinylcyclohexane,
1,2-epoxy4-epoxyethylcyclohexane,
1,2-epoxy-1-methyl-4-(1-methylepoxyethyl)cyclohexane,
3,4-epoxycyclohexylmethyl(meth)acrylate,
adduct of 2,2-bis(hydroxymethyl)-1-butanol with 4-epoxyethyl-1,2-epoxycyclohexane,
ethylene bis(3,4-epoxycyclohexanecarboxylate),
oxydiethylene bis(3,4-epoxycyclohexanecarboxylate),
1,4-cyclohexanedimethyl bis(3,4-epoxycyclohexanecarboxylate),
3-(3,4-epoxycyclohexylmethoxycarbonyl)propyl 3,4-epoxycyclohexanecarboxylate, and the like.

Also as the alicyclic epoxy compound in which an epoxy group is bonded directly to a saturated carbocycle explained above, commercially available products can be obtained easily, and examples thereof include "CELLOXIDE" series and "CYCLOMER" marketed from Daicel Corporation, "CYRACURE UVR" series marketed from The Dow Chemical Company, and the like, each being a trade name.

The curable adhesive containing an epoxy compound may further contain an active energy ray curable compound other than the epoxy compound. The active energy ray curable compound other than the epoxy compound includes, for example, an oxetane compound, an acryl compound and the like. Of them, an oxetane compound is preferably used in combination since the curing speed may possibly be promoted in cation polymerization.

The oxetane compound is a compound having a 4-membered ring ether in the molecule, and includes, for example, those as listed below.
1,4-bis[(3-ethyloxetan-3-yl)methoxy methyl]benzene,
3-ethyl-3-(2-ethylhexyloxymethyl)oxetane,
bis(3-ethyl-3-oxetanylmethyl) ether,
3-ethyl-3-(phenoxymethyl)oxetane,
3-ethyl-3-(cyclohexyloxymethyl)oxetane,
phenol novolak oxetane,
1,3-bis[(3-ethyloxetan-3-yl)methoxy]benzene, and the like.

Also as the oxetane compound, commercially available products can be obtained easily, and examples thereof include "ARON oxetane (registered trademark)" series marketed from Toagosei Co., Ltd., "ETERNACOLL (registered trademark)" series marketed from UBE Industries, Ltd., and the like, each being a trade name.

As the curable compound including epoxy compounds and oxetane compounds, those not diluted with an organic solvent or the like are preferably used, for adhesives blended with them to contain no solvent. Also regarding trace components including a cation polymerization initiator and a sensitizer described later as other components constituting the adhesive, a powder or liquid composed singly of the compound from which an organic solvent has been removed or dried is used more preferably than those dissolved in an organic solvent.

The cation polymerization initiator is a compound generating a cation species by undergoing irradiation with active energy ray, for example, ultraviolet. The initiator may advantageously be one which gives the adhesion strength and the curing speed required by an adhesive blended with it, and examples thereof include aromatic diazonium salts; onium salts such as an aromatic iodonium salt and an aromatic sulfonium salt; an iron-arene complex, and the like. These cation polymerization initiators may be used each singly or different several kinds of them may be used in combination.

The aromatic diazonium salt includes, for example, those as listed below.
benzenediazonium hexafluoroantimonate,
benzenediazonium hexafluorophosphate,
benzenediazonium hexafluoroborate, and the like.

The aromatic iodonium salt includes, for example, those as listed below.
diphenyliodonium tetrakis(pentafluorophenyl)borate,
diphenyliodonium hexafluorophosphate,
diphenyliodonium hexafluoroantimonate,
bis(4-nonylphenyl)iodonium hexafluorophosphate, and the like.

The aromatic sulfonium salt includes, for example, those as listed below.
triphenylsulfonium hexafluorophosphate,
triphenylsulfonium hexafluoroantimonate,
triphenylsulfonium tetrakis(pentafluorophenyl)borate,
diphenyl(4-phenylthiophenyl)sulfonium hexafluoroantimonate,
4,4'-bis(diphenyl sulfonio)diphenyl sulfide bishexafluorophosphate,
4,4'-bis[di(β-hydroxyethoxyphenyl)sulfonio]diphenyl sulfide bishexafluoroantimonate,
4,4'-bis[di(β-hydroxyethoxyphenyl)sulfonio]diphenyl sulfide bishexafluorophosphate,
7-[di(p-toluyl)sulfonio]-2-isopropylthioxanthone hexafluoroantimonate,
7-[di(p-toluyl)sulfonio]-2-isopropylthioxanthone tetrakis(pentafluorophenyl)borate,
4-phenylcarbonyl-4'-diphenyl sulfonio diphenyl sulfide hexafluorophosphate,
4-(p-tert-butylphenylcarbonyl)-4'-diphenyl sulfonio diphenyl sulfide hexafluoroantimonate,
4-(p-tert-butylphenylcarbonyl)-4'-di(p-toluyl)sulfonio diphenyl sulfide tetrakis(pentafluorophenyl)borate, and the like.

The iron-arene complex includes, for example, those as listed below.
xylenecyclopentadienyl iron(II) hexafluoroantimonate,
cumene-cyclopentadienyl iron(II) hexafluorophosphate,
xylenecyclopentadienyl iron(II)
tris(trifluoromethylsulfonyl) methanide, and the like.

Among cation polymerization initiators, aromatic sulfonium salts are preferably used since these salts show an ultraviolet absorbing property in a wavelength region of 300 nm or more, and resultantly, can give an adhesive layer excellent in curability and having good mechanical strength and adhesion strength.

Also as the cation polymerization initiator, commercially available products can be obtained easily, and examples thereof include "Kayarad (registered trademark)" series marketed from Nippon Kayaku Co., Ltd., "CYRACURE UVI" series marketed from The Dow Chemical Company, photo-acid generator "CPI" series marketed from San-Apro Ltd., photo-acid generator "TAZ", "BBI" and "DTS" marketed from Midori Kagaku Co., Ltd., "ADEKA OPTOMER" series marketed from ADEKA Corporation, "RHODORSIL (registered trademark) marketed from Rhodia Ltd.; and the like, each being a trade name.

In an active energy ray curable adhesive, the cation polymerization initiator is blended in a proportion of usually 0.5 to 20 parts by mass with respect to 100 parts by mass of the total amount of the active energy ray curable adhesive, and preferably 1 to 15 parts by mass. When the amount is too small, curing becomes insufficient, and the mechanical strength and the adhesion strength of an adhesive layer are lowered in some cases. When the amount is too large, the amount of ionic substances in an adhesive layer increases to raise the hygroscopicity of the adhesive layer, and durability of the resultant polarization plate is lowered in some cases.

When an active energy ray curable adhesive is used in the form of the electron beam curable type, it is not particularly necessary to allow a photopolymerization initiator to be contained in a composition, while when used in the ultraviolet curable type, it is preferable to use a photo-radical generator. The photo-radical generator includes a hydrogen abstraction type photo-radical generator and a cleavable photo-radical generator.

The hydrogen abstraction type photo-radical generator includes, for example, naphthalene derivatives such as 1-methylnaphthalene, 2-methylnaphthalene, 1-fluoronaphthalene, 1-chloronaphthalene, 2-chloronaphthalene, 1-bromonaphthalene, 2-bromonaphthalene, 1-iodonaphthalene, 2-iodonaphthalene, 1-naphthol, 2-naphthol, 1-methoxy naphthalene, 2-methoxy naphthalene, 1,4-dicyanonaphthalene and the like, anthracene derivatives such as anthracene, 1,2-benzanthracene, 9,10-dichloroanthracene, 9,10-dibromoanthracene, 9,10-diphenylanthracene, 9-cyanoanthracene, 9,10-dicyanoanthracene, 2,6,9,10-tetracyanoanthracene and the like, pyrene derivatives, carbazole derivatives such as carbazole, 9-methylcarbazole, 9-phenylcarbazole, 9-propen-2-yl-9H-carbazole, 9-propyl-9H-carbazole, 9-vinylcarbazole, 9H-carbazole-9-ethanol, 9-methyl-3-nitro-9H-carbazole, 9-methyl-3,6-dinitro-9H-carbazole, 9-octanoylcarbazole, 9-carbazolemethanol, 9-carbazolepropionic acid, 9-carbazolepropionitrile, 9-ethyl-3,6-dinitro-9H-carbazole, 9-ethyl-3-nitrocarbazole, 9-ethylcarbazole, 9-isopropylcarbazole, 9-(ethoxycarbonylmethyl)carbazole, 9-(morpholinomethyl)carbazole, 9-acetylcarbazole, 9-allylcarbazole, 9-benzyl-9H-carbazole, 9-carbazoleacetic acid, 9-(2-nitrophenyl)carbazole, 9-(4-methoxyphenyl)carbazole, 9-(1-ethoxy2-methylpropyl)-9H-carbazole, 3-nitrocarbazole, 4-hydroxycarbazole, 3,6-dinitro-9H-carbazole, 3,6-diphenyl-9H-carbazole, 2-hydroxycarbazole, 3,6-diacetyl-9-ethylcarbazole and the like, benzophenone derivatives such as benzophenone, 4-phenylbenzophenone, 4,4'-bis(dimethoxy)benzophenone, 4,4'-bis(dimethylamino)benzophenone, 4,4'-bis(diethylamino)benzophenone, methyl 2-benzoylbenzoate, 2-methylbenzophenone, 3-methylbenzophenone, 4-methylbenzophenone, 3,3'-dimethyl-4-methoxybenzophenone, 2,4,6-trimethylbenzophenone and the like, aromatic carbonyl compounds, [4-(4-methylphenylthio)phenyl]-phenylmethanone, xanthone, thioxanthone derivatives such as thioxanthone, 2-chlorothioxanthone, 4-chlorothioxanthone, 2-isopropylthioxanthone, 4-isopropylthioxanthone, 2,4-dimethylthioxanthone, 2,4-diethylthioxanthone, 1-chloro-4-propoxythioxanthone and the like, coumarin derivatives, and the like.

The cleavable photo-radical generator is a photo-radical generator of the type of being cleaved by irradiation with active energy ray to generate radicals, and specific examples thereof include, but not limited to, aryl alkyl ketones such as benzoin ether derivatives, acetophenone derivatives and the like, oxime ketones, acylhposphine oxides, S-phenyl thiobenzoates, titanocenes, and derivatives obtained by increasing the molecular weight of them. Commercially available cleavable photo-radical generators include, but not limited to, 1-(4-dodecylbenzoyl)-1-hydroxy-1-methylethane, 1-(4-isopropylbenzoyl)-1-hydroxy-1-methylethane, 1-benzoyl-1-hydroxy-1-methylethane, 1-[4-(2-hydroxyethoxy)-benzoyl]-1-hydroxy-1-methylethane, 1-[4-(acryloyloxyethoxy)-benzoyl]-1-hydroxy-1-methylethane, diphenyl ketone, phenyl-1-hydroxycyclohexyl ketone, benzyldimethyl ketal, bis(cyclopentadienyl)-bis(2,6-difluoro-3-pyrryl-phenyl)titanium, (η6-isopropylbenzene)-(η5-cyclopentadienyl)-iron (II) hexafluorophosphate, trimethylbenzoyl diphenylphosphine oxide, bis(2,6-dimethoxy-benzoyl)-(2,4,4-trimethylpentyl)-phosphineoxide, bis(2,4,6-trimethylbenzoyl)-2,4-dipentoxyphenylphosphineoxide or bis(2,4,6- trimethylbenzoyl)phenylphosphineoxide, (4-morpholinobenzoyl)-1-benzyl-1-dimethylaminopropane, 4-(methylthiobenzoyl)-1-methyl-1-morpholinoethane, and the like.

Regarding photo-radical generators contained in electron beam curable type adhesives among active energy ray curable adhesives used in the present invention, namely with respect to hydrogen abstraction type or cleavable photo-radical generators, any of them can be used singly, and additionally, several members of them may be used in combination, and more preferable is a combination with at least one cleavable photo-radical generator from the standpoint of stability of a single body of the photo-radical generator and curability thereof. Of cleavable photo-radical generators, acylphosphine oxides are preferable, and more specifically, trimethylbenzoyl diphenylphosphine oxide (trade name "DAROCURE TPO"; Ciba Japan K.K.), bis(2,6-dimethoxybenzoyl)-(2,4,4-trimethyl-pentyl)-phosphi neoxide (trade name "CGI 403"; Ciba Japan K.K.) or bis(2,4,6-trimethyl-benzoyl)-2,4-dipentoxyphenylphosphineoxi de (trade name "Irgaoure819"; Ciba Japan K.K.) is preferable.

The active energy ray curable adhesive can contain a sensitizer if necessary. By use of a sensitizer, reactivity improves, and the mechanical strength and the adhesion strength of an adhesive layer can be further improved. As the sensitizer, those described above can be appropriately used.

When a sensitizer is blended, the blending amount is preferably in the range of 0.1 to 20 parts by mass with respect to 100 parts by mass of the total amount of an active energy ray curable adhesive.

Various additives can be blended in an active energy ray curable adhesive in a range wherein its effect is not deteriorated. Additives which can be blended include, for example, an ion trapping agent, an antioxide, a chain transfer agent, a tackifier, a thermoplastic resin, a filler, a flow controlling agent, a plasticizer, a defoaming agent and the like.

These components constituting an active energy ray curable adhesive are used usually in the state of dissolution in a solvent. When an active energy ray curable adhesive contains a solvent, an adhesive layer is obtained by coating an active energy ray curable adhesive on a suitable base material and drying this. Components undissolvable in a solvent may be in the state of dispersion in the system.

The method of forming the above-described adhesive layer on the present optical film includes a method of coating the above-described adhesive composition directly on the surface of the present optical film to form an adhesive layer, and the like. The above-described adhesive layer has a thickness of usually about 0.001 to 5 μm, preferably 0.01 μm or more, and preferably 4 μm or less, further preferably 3 μm or less. When the adhesive layer is too thick, the appearance of a polarization plate tends to be poor.

An active energy ray curable adhesive can be coated on a film by coating methods described above. In this case, the viscosity of an active energy ray curable adhesive may be one at which the adhesive can be coated by various methods, and the viscosity at 25° C. is preferably in the range of 10 to 30000 mPa·sec, more preferably in the range of 50 to 6000 mPa·sec. When the viscosity is too low, there is a tendency that a uniform coated film having no unevenness is not obtained easily. In contrast, when the viscosity is too high, the adhesive does not flow easily, and there occurs a tendency that a uniform coated film having no unevenness is not obtained easily. The viscosity referred to here denotes a value measured at 60 rpm after adjusting the adhesive to 25° C. using a B-type viscometer.

The above-described active energy ray curable adhesive can be used in the mode of the electron beam curable type or the ultraviolet curable type. The active energy ray in the present invention is defined as energy ray capable of decomposing a compound generating active species, to cause generation of active species. Such active energy ray includes visible light, ultraviolet ray, infrared ray, X-ray, α ray, β ray, γ ray, electron beam and the like.

In the electron beam curable type, any suitable conditions can be adopted as the electron beam irradiation condition providing that the above-described active energy ray curable adhesive can be cured. In electron beam irradiation, for example, the accelerating voltage is preferably 5 kV to 300 kV, further preferably 10 kV to 250 kV. When the accelerating voltage is less than 5 kV, there is a possibility that an electron beam does not reach an adhesive to cause poor curing, while when the accelerating voltage is over 300 kV, there is a possibility that force penetrating through a sample is too high and an electron beam bounces around to damage a transparent protective film and a polarizer. The irradiation dose is 5 to 100 kGy, further preferably 10 to 75 kGy. When the irradiation dose is less than 5 kGy, an adhesive lacks curing, while when over 100 kGy, a transparent protective film and a polarizer are damaged, lowering of mechanical strength and yellowing occur, and the desired optical property cannot be obtained.

Electron beam irradiation is usually carried out in an inert gas, however, if necessary, may also be carried out in atmospheric air or under condition in which the oxygen content is increased slightly. Though varying depending on the material of a transparent protective film, damage to a transparent protective film can be prevented by intentionally causing oxygen block on the face of the transparent protective film initially hit by an electron beam by appropriate introduction of oxygen, and by this, only an adhesive can be irradiated with an electron beam efficiently.

In the ultraviolet curable type, the irradiation intensity of an active energy ray curable adhesive is determined depending on the composition of each adhesive and is not particularly restricted, however, it is preferably 10 to 5000 mW/cm². When the irradiation intensity on a resin composition is less than 10 mW/cm², the reaction times becomes too longer, while when over 5000 mW/cm², there is a possibility of occurrence of yellowing of the adhesive constituent material and deterioration of a polarizer by heat radiated from a light source and heat generation in polymerization of the composition. The irradiation intensity is preferably intensity in a wavelength region effective for activation of a photo-cation polymerization initiator, more preferably intensity in a wavelength region of 400 nm or less, further preferably intensity in a wavelength region of 280 to 320 nm. It is preferable that irradiation is conducted once or several times under such irradiation intensity to give the accumulated light quantity set at 10 mJ/cm² or more, preferably at 10 to 5000 mJ/cm². When the accumulated light quantity on the above-described adhesive is less than 10 mJ/cm², generation of active species derived from a polymerization initiator is not sufficient and curing of the adhesive becomes insufficient. In contrast, when the accumulated light quantity is over 5000 mJ/cm², the irradiation time becomes very long, generating a disadvantage for improvement of productivity. In this case, which wavelength region (UVA (320 to 390 nm), UVB (280 to 320 nm), and the like) is necessary to determine the accumulated light quantity varies depending on a film to be used and a combination of adhesive species.

The light source used for conducting polymerization and curing of an adhesive by irradiation with active energy ray in the present invention is not particularly restricted and includes, for example, a low pressure mercury lamp, a medium pressure mercury lamp, a high pressure mercury lamp, an ultrahigh pressure mercury lamp, a xenon lamp, a halogen lamp, a carbon arc lamp, a tungsten lamp, a gallium lamp, excimer laser, a LED light source emitting in the wavelength range of 380 to 440 nm, a chemical lamp, a black light lamp, a microwave excitation mercury lamp and a metal halide lamp. The light source is preferably an ultraviolet light source having emission distribution at wavelengths of 400 nm or less from the standpoint of stability of energy and simplicity of the apparatus.

FIG. 1 shows a schematic view of an optically anisotropic film in the present invention. FIG. 1(b) shows an optically anisotropic film 100 having a base material, a first optically anisotropic film and a second optically anisotropic film laminated in this order. FIG. 1(c) shows an optically anisotropic film 100 having a base material, a second optically anisotropic film and a first optically anisotropic film laminated in this order. FIG. 1(d) shows an optically anisotropic film 100 having a first optically anisotropic film, a base material and a second optically anisotropic film laminated in this order.

A base material can be removed from these optically anisotropic films to obtain optically anisotropic films having no base material. When the first optically anisotropic film is a drawn film, a second optically anisotropic film as a coating layer can be formed on the surface of the drawn film to produce an optically anisotropic film, and when the second optically anisotropic film is a drawn film, a first optically anisotropic film as a coating layer can be formed on the surface of the drawn film to produce an optically anisotropic film. A schematic view of the optically anisotropic film having no base material is shown in FIG. 1(a).

An optically anisotropic film can also be produced by pasting a base material having a first optically anisotropic film and a base material having a second optically anisotropic film. As specific examples, FIG. 1(e), FIG. 1(f) and FIG. 1(g) are listed. For pasting, adhesives described later can be used.

Constitutions of an optically anisotropic film when the first optically anisotropic film is constituted of a layer A and a layer B or when a third optically anisotropic film is present are shown in FIG. 2. FIG. 2(c) shows an optical film 100 having a base material, a layer A, a layer B and a second optically anisotropic film laminated in this order. FIG. 2(d) shows an optical film 100 having a base material, a first optically anisotropic film, a second optically anisotropic film and a third optically anisotropic film laminated in this order. FIG. 2(e) shows an optical film 100 having a base material, a layer B, a layer A and a second optically anisotropic film laminated in this order. FIG. 2(f) shows an optical film 100 having a base material, a third optically anisotropic film, a second phase difference layer and a first optically anisotropic film laminated in this order. FIG. 2(g) shows an optical film 100 having a base material, a second optically anisotropic film, a layer B and a layer A laminated in this order. FIG. 2(h) shows an optical film 100 having a base material, a second optically anisotropic film, a layer A and a layer B laminated in this order. Optically anisotropic films having no base material can also be obtained by peeling a base material from these optically anisotropic films, and schematic views of optically anisotropic films having no base material are shown in FIG. 2(a) and FIG. 2(b).

In the case of a constitution containing a first optically anisotropic film, a layer A and a layer B or in the case having a third optically anisotropic film, these layers may be laminated on both surfaces of a base material. Specifically, for example, FIG. 2(i) shows an optical film 100 having a second optically anisotropic film, a base material, a layer A and a layer B laminated in this order. FIG. 2(j) shows an optical film 100 having a second optically anisotropic film, a base material, a layer B and a layer A laminated in this order. FIG. 2(k) shows an optical film 100 having a first optically anisotropic film, a base material, a third optically anisotropic film and a second optically anisotropic film laminated in this order. FIG. 2(l) shows an optical film 100 having a first optically anisotropic film, a base material, a second optically anisotropic film and a third optically anisotropic film laminated in this order. FIG. 2(m) shows an optical film 100 having a third optically anisotropic film, a base material, a first optically anisotropic film and a second optically anisotropic film laminated in this order. FIG. 2(n) shows an optical film 100 having a third optically anisotropic film, a base material, a second optically anisotropic film and a first optically anisotropic film laminated in this order. A second optically anisotropic film, a layer A and a layer B may be formed by direct coating on each layer, or respective layers may be produced before pasting them with each other, or respective layers may be laminated sequentially by transfer.

The present elliptical polarization plate can be obtained by combining a polarizer with an optically anisotropic film. The polarizer and the optically anisotropic film are usually pasted with an adhesive. Preferably, these are pasted with an active energy ray curable adhesive.

When the optically anisotropic film is constituted of only one layer and only one slow axis exists, it is preferable that the transmission axis of the polarization plate is substantially 45° to the slow axis (optical axis) of the first optically anisotropic film of the optically anisotropic film. Substantially 45° usually denotes a range of 45±5°. FIG. 1 shows a schematic view of the present elliptical polarization plate 110.

Figure 3:
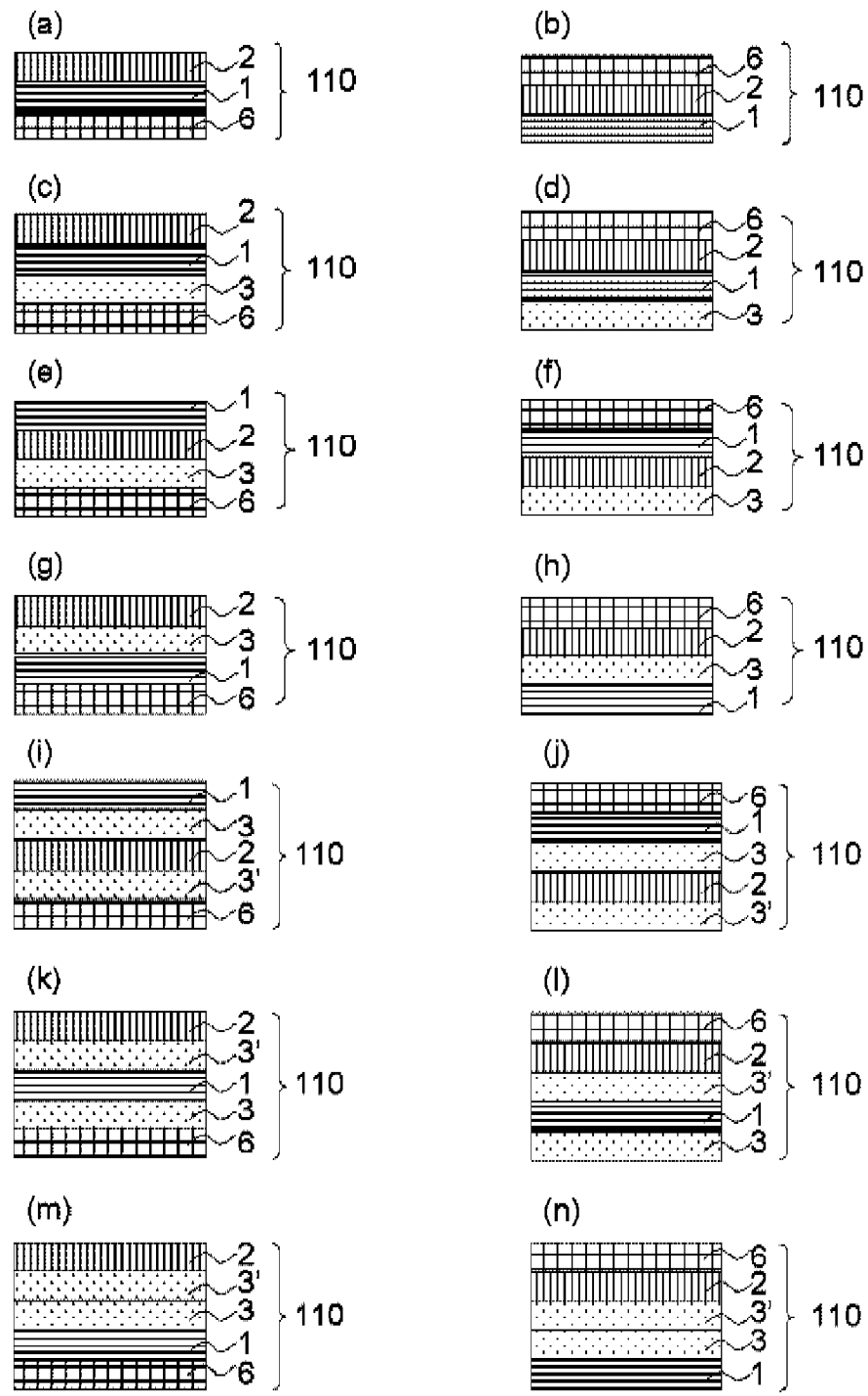
FIGS. 3(a)-3(n) are each a schematic cross-sectional view of an elliptical polarization plate of the present invention.

The polarizer used in the present elliptical polarization plate shown in FIG. 3 is one having a protective film on at least one surface. FIG. 3(c) to FIG. 3(h) show an elliptical polarization plate composed of an optically anisotropic film having a first optically anisotropic layer and a positive layer C formed on a base material, and these base materials can perform also a function as a protective film for the other surface in the case of use of a polarization plate having a protective film on one surface of a polarizer. In the constitutions shown in FIG. 3(a) and FIG. 3(b), an optically anisotropic layer has no base material, and a polymerizable liquid crystal composition may be coated directly on a polarization plate to form a phase difference layer, a phase difference layer may be pasted on the surface of a polarizer with an adhesive, or a phase difference layer may be pasted on a polarization plate with an adhesive.

The method of pasting the present optical film having no base material to other base materials such as the surface of a polarizer, a polarization plate and the like includes a method in which the present optical film having deprived of a base material is pasted to other base material with an adhesive, a method in which the present optical film is pasted to other base material with an adhesive, then, a base material is removed, and the like. In this case, an adhesive may be coated on the side of a phase difference layer of the present optical film or may be coated on the side of other base material. When an orientation film is present between a base material and a phase difference layer, also the orientation film may be removed together with the base material.

A base material having on the surface a functional group forming a chemical bond to a phase difference layer, an orientation film or the like forms a chemical bond to the phase difference layer, the orientation film or the like, that is, there is a tendency that the base material is not easily removed. Therefore, when a base material is removed by peeling, base materials having few functional group on the surface are preferable, and base materials not undergone a surface treatment for forming functional groups on the surface are preferable.

In the case of an orientation film having a functional group forming a chemical bond to a base material, close adherence between the base material and the orientation film tends to be large, therefore, orientation films having few functional groups forming a chemical bond to a base material are preferable when the base material is removed by peeling. It is preferable that a reagent cross-linking a base material and an orientation film is not contained, and further, it is preferable that components such as a solvent and the like dissolving a base material are not contained in a solution of an orienting polymer composition, a photo-orientation film forming composition or the like.

In the case of an orientation film having a functional group forming a chemical bond to a phase difference layer, close adherence between the phase difference layer and the orientation film tends to increase. Therefore, orientation films having few functional groups forming a chemical bond to a phase difference layer are preferable when the orientation film is removed together with a base material. It is preferable that a reagent cross-linking a phase difference layer and an orientation film is not contained in the phase difference layer and the orientation film.

In the case of a phase difference layer having a functional group forming a chemical bond to an orientation film, close adherence between the orientation film and the phase difference layer tends to increase. Therefore, phase difference layers having few functional groups forming a chemical bond to a base material or an orientation film are preferable when the base material is removed or when the orientation film is removed together with the base material. It is preferable that a reagent cross-linking a base material or an orientation film and a phase difference layer is not contained in a polymerizable liquid crystal composition.

For example, if an adhesive is coated on the surface of a first phase difference layer of the present optical film having a base material, a second phase difference layer and a first phase difference layer laminated in this order and a polarization plate is pasted to this before removing the base material of the present optical film, a circular polarization plate having a constitution shown in FIG. 3(a) having the polarization plate, the first phase difference layer and the second phase difference layer laminated in this order can be produced. Further, if an adhesive is coated on the surface of a second phase difference layer of the present optical film having a base material, a first phase difference layer and a second phase difference layer laminated in this order and a polarization plate is pasted to this before removing the base material of the present optical film, a circular polarization plate having a constitution shown in FIG. 3(b) having the polarization plate, the second phase difference layer and the first phase difference layer laminated in this order can be produced.

The constitutions shown in FIG. 3(i) to FIG. 3(n) are elliptical polarization plates obtained by laminating an optically anisotropic film having two base materials.

Figure 4:
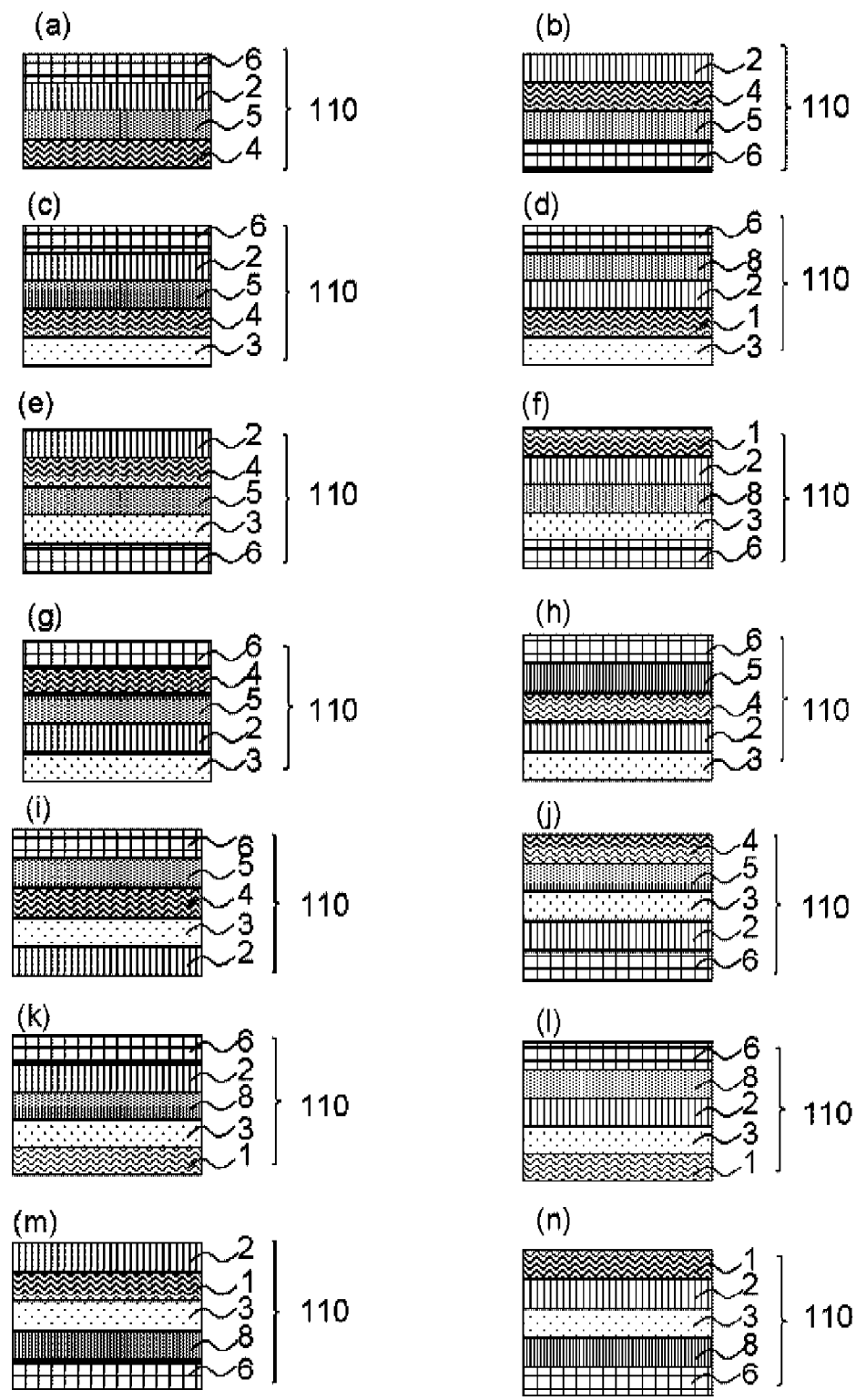
FIGS. 4(a)-4(n) are each a schematic cross-sectional view of an elliptical polarization plate of the present invention.

The constitution of the present elliptical polarization plate when the optically anisotropic film contains a layer A and a layer B is shown in FIG. 4. In the case of the constitution containing a layer A and a layer B, the position of lamination of a polarizer is limited.

Specifically, in the case of lamination of a layer A having a phase difference of $\lambda/4$ and a layer B having a phase difference of $\lambda/2$, first, the layer B is formed so that the slow axis of the layer B makes an angle of 75° and then, the layer A is formed so that the slow axis of the layer A makes an angle of 15° to the absorption axis of a polarization plate. Though the position of the second optically anisotropic film is not limited, it is necessary that a polarization plate, a layer B and a layer A are laminated in this order. By this lamination, the resultant elliptical polarization plate can manifest a function as a wide band $\lambda/4$ plate. Here, the angle of the axis forming a layer A and a layer B is not restricted and layers can be laminated by a desired method since it is known, as described, for example, in JP-A No. 2004-126538, that if the angles of the slow axes of a layer A and a layer B are 300 and −30 or 45° and −45° to the absorption axis of a polarization plate, a function as a wide band $\lambda/4$ plate can be manifested.

Though the present optical film having no base material is laminated in constitutions shown in FIG. 4(a) and FIG. 4(b), a circular polarization plate having these constitutions can be produced by the same method as the production method of a circular polarization plate having the constitution shown in FIG. 3(a) and FIG. 3(b).

The present elliptical polarization plate can be used in various displays

The display is an apparatus having a display element, and contains a light emitting device or light emitting apparatus as a light emitting source. The display includes a liquid crystal display, an organic electroluminescence (EL) display, an inorganic electroluminescenoe (EL) display, a touch panel display, an electron emission display (for example, field emission display (FED), surface field emission display (SED)), an electron paper (a display using an electron ink and an electrophoresis element), a plasma display, a projection type display (for example, a grating light valve (GLV) display, a display having a digital micro mirror device (DMD)), an piezoelectric ceramic display, and the like. The liquid crystal display includes any of a transmission type liquid crystal display, a semi-transmission type liquid crystal display, a reflective liquid crystal display, a direct view liquid crystal display, a projection liquid crystal display and the like. These displays may be a display displaying a two dimensional image or a stereo display displaying a three dimensional image. Particularly, the present elliptical polarization plate can be effectively used in an organic electroluminescence (EL) display and an inorganic electroluminescence (EL) display and an organic EL display equipped with touch panel.

Figure 5:
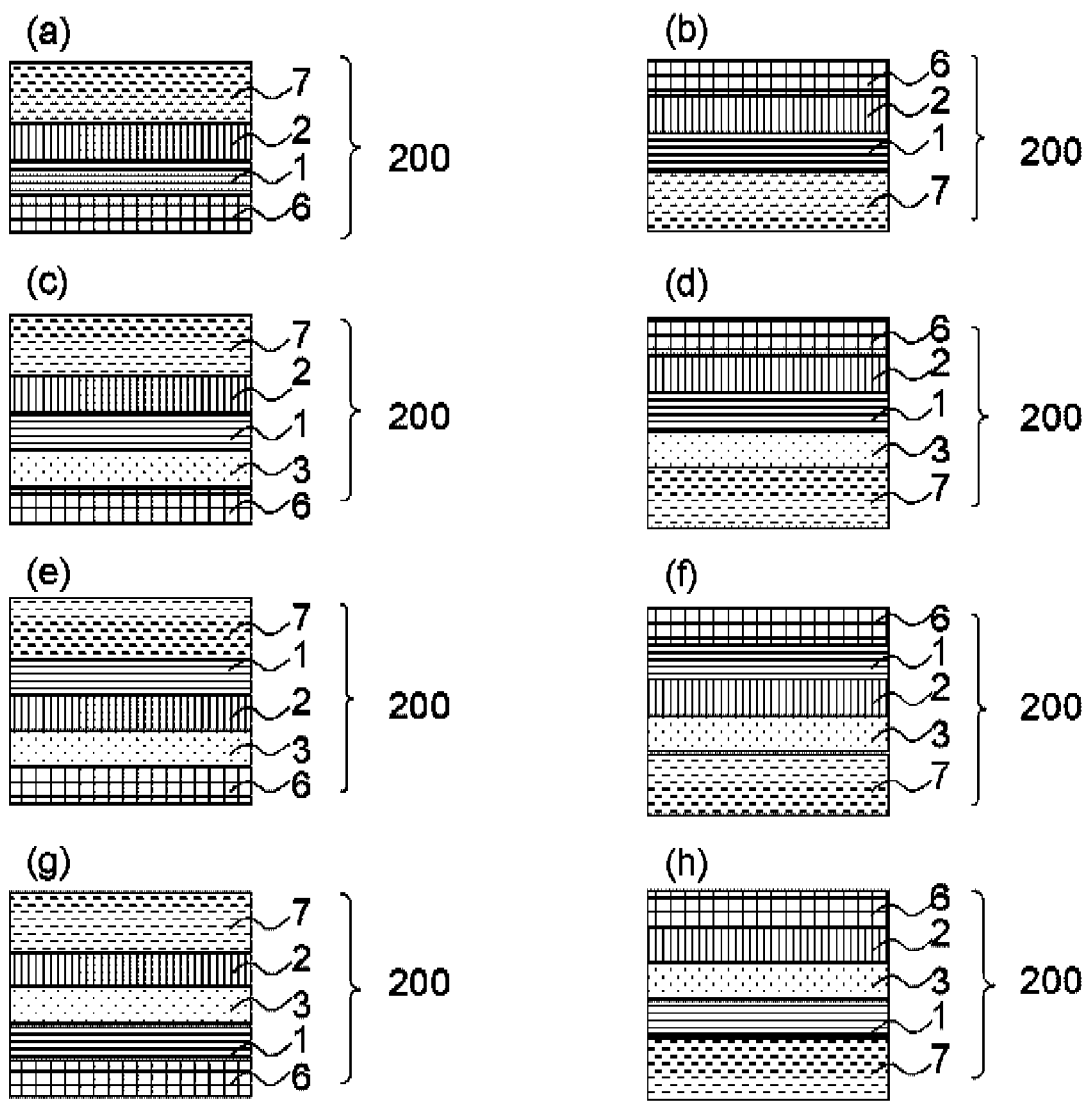
FIGS. 5(a)-5(h) are each a schematic cross-sectional view of an organic EL display containing an elliptical polarization plate of the present invention.

FIG. 5 is a schematic view of an organic EL display 200 having the present elliptical polarization plate.

FIG. 5(a) shows an organic EL display 200 having a polarization plate 6, a first optically anisotropic layer 1, a positive layer C and an organic EL panel 7 laminated in this order. FIG. 5(c) shows an organic EL display 200 having a polarization plate 6, a base material 3, a first optically anisotropic layer 1, a positive layer C2 and an organic EL panel 7 laminated in this order. In FIGS. 5 (b), (d) to (h), the lamination order is different from FIGS. 5(a) and (c).

The method of laminating a polarization plate, the present optical film and an organic EL panel includes a method of pasting the present circular polarization plate prepared by laminating a polarization plate and the present optical film to an organic EL panel, a method of pasting the present optical film to an organic EL panel and further pasting a polarization plate on the surface of the present optical film, and the like. For pasting, an adhesive is usually used.

For example, an organic EL display 200 shown in FIG. 5(a) can be produced by coating an adhesive on the surface of a second phase difference layer 2 of the present circular polarization plate shown in FIG. 3(a) and pasting an organic EL panel 7 to this. Further, an organic EL display 200 shown in FIG. 5(a) can also be produced by coating an adhesive on the surface of a second phase difference layer 2 of the present optical film shown in FIG. 1(b), pasting an organic EL panel 7 to this, removing a base material 3 of the present optical film, coating an adhesive on the surface of a first phase difference layer 1 emerged by removal of the base material, and pasting a polarization plate 6 to this.

FIG. 6 is a schematic view showing an organic EL display 30. The organic EL display 30 shown in FIG. (6) has the present elliptical polarization plate 31, and in this display, a light emitting layer 35 and a cathode electrode 36 are laminated on a base plate 32 carrying a pixel electrode 34 formed via an interlayer insulation film 33. The present elliptical polarization plate 31 is disposed on the side opposite to the light emitting layer 35 sandwiching the base plate 32. The light emitting layer 35 emits light when plus voltage is applied to the pixel electrode 34, minus voltage is applied to the cathode electrode 36, and direct current is applied between the pixel electrode 34 and the cathode electrode 36. The light emitting layer 35 is composed of an electron transporting layer, a light emitting layer, a hole transporting layer and the like. Light emitted from the light emitting layer 35 penetrates the pixel electrode 34, the interlayer insulation film 33, the base plate 32 and the present elliptical polarization plate 31.

For producing the organic EL display 30, first, a thin film transistor 38 is formed in the desired shape on the base material 32. Then, the interlayer insulation film 33 is formed, then, the pixel electrode 34 is formed is formed by a sputtering method, and patterned. Thereafter, the light emitting layer 35 is laminated.

Then, the present elliptical polarization plate 31 is provided on the surface opposite to the surface of the base plate 32 on which the thin film transistor 38 is provided. In this case, the present elliptical polarization plate 31 is disposed so that the polarization plate thereof faces the outside (side opposite to the base plate 32).

The base plate 32 includes ceramic base plates such as a sapphire glass base plate, a quartz glass base plate, soda glass base plate and alumina and the like; metal base plates such as copper and the like; plastic base plates, and the like. Though not illustrated, a heat conductive film may be formed on the base plate 32. The heat conductive film includes a diamond thin film (DLC, etc.) and the like. When the pixel electrode 34 is of reflective type, light emits to a direction opposite to the base plate 32. Therefore, not only transparent materials, but also nonpermeable materials such as stainless and the like can be used. The base plate may be formed of a single body, or a plurality of base plates may be pasted with an adhesive to form a laminated base plate. These base plates are not limited to those in the form of a plate, and may also be in the form of a film.

As the thin film transistor 38, for example, a polycrystalline silicon transistor and the like may be used. The thin film transistor 38 is provided at the end of the pixel electrode 34, and its size is about 10 to 30 µm. The size of the pixel electrode 34 is about 20 µm×20 µm to 300 µm×300 µm.

On the base plate 32, a wiring electrode of the thin film transistor 38 is provided. The wiring electrode has low resistance and has a function of electrically connecting to the pixel electrode 34 to suppress the resistance value low, and in general, one containing one or more of Al, transition metals (excluding Ti), Ti and titanium nitride (TiN) is used as the wiring electrode.

The interlayer insulation film 33 is provided between the thin film transistor 38 and the pixel electrode 34. The interlayer insulation film 33 may be any film having an insulating property such as films of inorganic materials such as silicon oxide like $SiO_2$ or the like, silicon nitride and the like formed by sputtering and vacuum vapor deposition, silicon oxide layers formed by SOG (spin on glass), photoresists, coated films of resin materials such as polyimide and acrylic resins and the like.

A rib 39 is formed on the interlayer insulation film 33. The rib 39 is disposed on peripheral parts of the pixel electrode 34 (between adjacent pixels). The material of the rib 39 includes acrylic resins, polyimide resins and the like. The thickness of the rib 39 is preferably 1.0 µm or more and 3.5 µm or less, more preferably 1.5 µm or more and 2.5 µm or less.

Next, an EL device composed of the pixel electrode 34, the light emitting layer 35 and the cathode electrode 36 will be explained. The light emitting layer 35 has at least one hole transporting layer and at least one light emitting layer, and has, for example, an electron injection transporting layer, a light emitting layer, a hole transporting layer and a hole injection layer in aeries.

The pixel electrode 34 includes, for example, ITO (tin-doped indium oxide), IZO (zinc-doped indium oxide), IGZO, ZnO, $SnO_2$ and $In_2O_3$ and the like, and particularly, ITO and IZO are preferable. The pixel electrode 35 may have a thickness not lower than a certain level at which hole injection can be conducted sufficiently, and the thickness is preferably about 10 to 500 nm.

The pixel electrode 34 can be formed by a vapor deposition method (preferably, a sputtering method). The sputtering gas is not particularly restricted, and inert gases such as Ar, He, Ne, Kr, Xe and the like or a mixed gas thereof may be used.

As the constituent material of the cathode electrode 36, for example, metal elements such as K, Li, Na, Mg, La, Ce, Ca, Sr, Ba, Al, Ag, In, Sn, Zn, Zr and the like may be used, and for improving operating stability of an electrode, it is preferable to use an alloy system composed of two components or three components selected from the exemplified metal elements. The alloy system preferably includes, for example, Ag.Mg (Ag:1 to 20 at %), Al.Li(Li:0.3 to 14 at %), In.Mg(Mg:50 to 80 at %), Al.Ca(Ca:5 to 20 at %) and the like.

The cathode electrode 36 is formed by a vapor deposition method, a sputtering method and the like. It is preferable that the thickness of the cathode electrode 37 is 0.1 nm or more, preferably 1 to 500 nm or more.

The hole injection layer has a function of making injection of holes from the pixel electrode 34 easy, the hole transporting layer has a function of transporting holes and a function of preventing electrons, and these are also called a charge injection layer or a charge transporting layer.

The thickness of a light emitting layer, the total thickness of a hole injection layer and a hole transporting layer, and the thickness of an electron injection transporting layer are not particularly restricted, and preferably about 5 to 100 nm, though varying depending on the formation method. In a hole injection layer and a hole transporting layer, various organic compounds can be used. For formation of a hole injection transporting layer, a light emitting layer and an electron injection transporting layer, a vacuum vapor deposition method can be used since a homogeneous thin film can be formed.

As the light emitting layer 35, use can be made of one utilizing light emission (fluorescence) from a singlet exciton, one utilizing light emission (phosphorescence) from a triple exciton, one containing one utilizing light emission (fluorescence) from a single exciton and one utilizing light emission (phosphorescence) from a triplet exciton, one formed of an organic substance, one containing one formed of an organic substance and one formed of an inorganic substance, one containing a high molecular weight material, one containing a low molecular weight material, one containing a high molecular weight material and a low molecular weight material, and the like. The layer is not limited to them, and light emitting layers 35 formed by using various materials known for an EL device can be used in the organic EL display 30.

A desiccant (not shown) is disposed in a space between the cathode electrode 36 and a sealing layer 37. This is because the light emitting layer 35 is vulnerable to humidity. Moisture is absorbed by the desiccant to prevent deterioration of the light emitting layer 35.

The organic ELC display 30 of the present invention shown in FIG. 6(b) has the present elliptical polarization plate 31, and in this apparatus, a light emitting layer 35 and a cathode electrode 36 are laminated on a base plate 32 carrying a pixel electrode 34 formed via an interlayer insulation film 33. A sealing layer 37 is formed on the cathode electrode, and the present elliptical polarization plate 31 is disposed on the side opposite to base plate 32. Light emitted from the light emitting layer 35 penetrates the cathode electrode 36, the sealing layer 37 and the present elliptical polarization plate 31.

EXAMPLES

The present invention will be illustrated further in detail by examples below. "%" and "parts" in examples are % by mass and parts by mass, unless otherwise stated.

Example 1

[Preparation of Photo-orientation Film Forming Composition]

The following components were mixed and the resultant mixture was stirred at 80° C. for 1 hour, to obtain a photo-orientation film forming composition (1). photo-orienting material (5 parts):

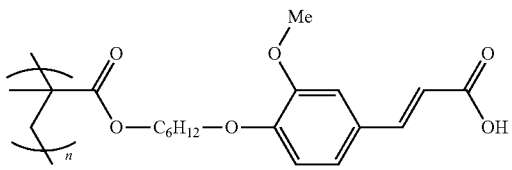

solvent (95 parts): cyclopentanone
[Preparation of Orienting Polymer Composition]

To a commercially available orienting polymer SUNEVER SE-610 (manufactured by Nissan Chemical Industries, Ltd.) was added 2-butoxyethanol, to obtain an orienting polymer composition having a composition shown in Table 1. Regarding the content proportion of each component with respect to the total amount of the prepared composition, the solid content in the orienting polymer composition was 1.0%, and the solvent was 99.0%. For SE-610, the solid content was converted from the concentration described in the delivery specification.

TABLE 1

|  | solid content | solvent |
|---|---|---|
| orienting polymer composition | 1% | 99% |

[Preparation of Phase Difference Layer Forming Composition]
[Preparation of Composition (A-1)]

The following components were mixed and the resultant mixture was stirred at 80° C. for 1 hour, to obtain a composition (A-1).

A polymerizable liquid crystal A1 and a polymerizable liquid crystal A2 were synthesized by a method described in JP-A No. 2010-31223.
polymerizable liquid crystal A1 (80 parts):

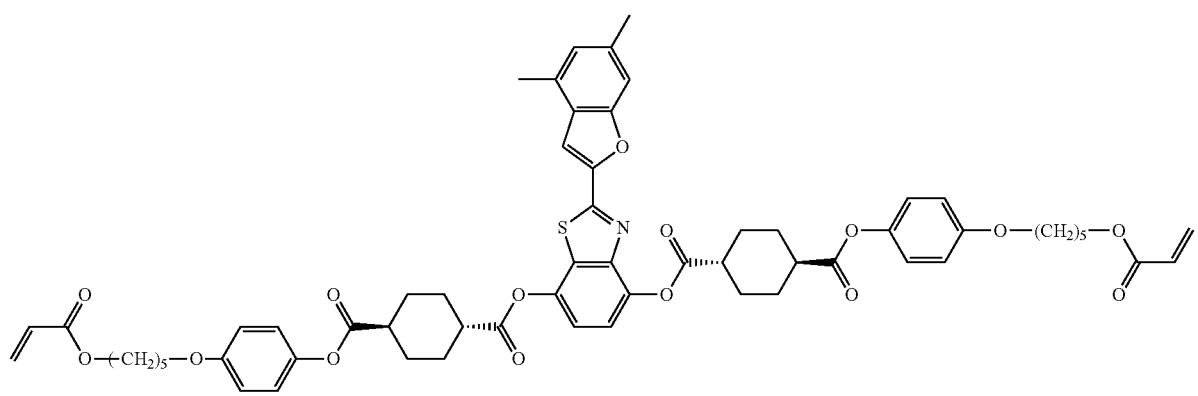

polymerizable liquid crystal A2 (20 parts):

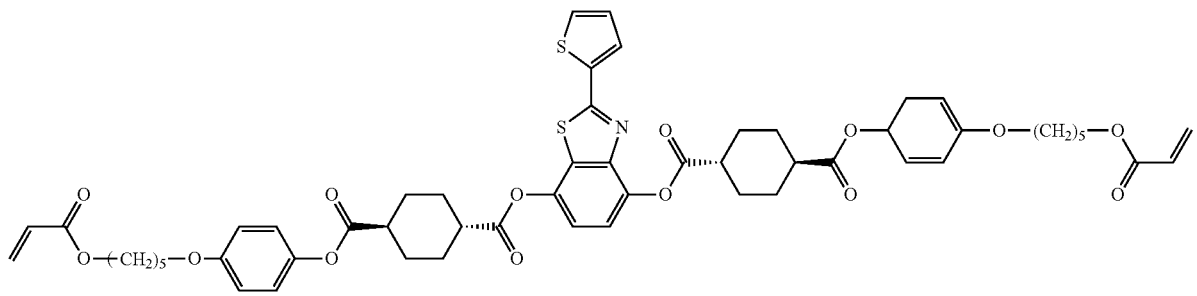

polymerization initiator (6 parts):
2-dimethylamino-2-benzyl-1-(4-morpholinophenyl)butan-1-one (Irgacure 369; manufactured by Ciba Specialty Chemicals) leveling agent (0.1 part): polyacrylate compound (BYK-361N; manufactured by BYK-Chemie)
solvent: cyclopentanone (400 parts)
[Preparation of Composition (B-1)]

The composition of a composition (B-1) is shown in Table 2. Components were mixed and the resultant solution was stirred at 80° C. for 1 hour, then, cooled down to room temperature, to obtain a composition (B-1).

TABLE 2

|  | polymerizable liquid crystal (B) | polymerization initiator | leveling agent | additive | solvent |
|---|---|---|---|---|---|
| composition (B-1) | LC242 (19.2%) | Irg907 (0.5%) | BYK-361N (0.1%) | LR9000 (1.1%) | PGMEA (79.1%) |

The value in parentheses in Table 2 represents the content proportion of each component with respect to the total amount of the prepared composition. In Table 2, LR9000 represents Laromer (registered trademark) LR-9000 manufactured by BASF Japan, Irg907 represents Irgacure (registered trademark) 907 manufactured by BASF Japan, BYK361N represents a leveling agent manufactured by BYK Chemie Japan, LC242 represents a polymerizable liquid crystal represented by the following formula manufactured by BASF, and PGMEA represents propylene glycol 1-monomethyl ether 2-acetate.

[Production of Polarizer (1)]

A polyvinyl alcohol film having an average degree of polymerization of about 2400, a degree of saponification of 99.9 mol % or more and a thickness of 75 μm was uniaxially drawn about 5 times in dry mode, further, immersed in pure water of 60° C. for 1 minute while keeping tensed condition, then, immersed in an aqueous solution containing iodine/potassium iodide/water at a weight ratio of 0.05/5/100 at 28° C. for 60 seconds. Then, it was immersed in an aqueous solution containing potassium iodide/boric acid/water at a weight ratio of 10.5/7.5/100 at 72° C. for 300 seconds. Subsequently, it was washed with pure water of 10° C. for 5 seconds, then, dried at 95° C. for 152 seconds, to fabricate a polarizer (1) in which iodine was adsorbed and oriented in polyvinyl alcohol.
[Production of Polarizer (2)]

A polyvinyl alcohol film having an average degree of polymerization of about 2400, a degree of saponification of 99.9 mol % or more and a thickness of 75 μm was uniaxially drawn about 5 times in dry mode, further, immersed in pure water of 60° C. for 1 minute while keeping tensed condition, then, immersed in an aqueous solution containing iodine/potassium iodide/water at a weight ratio of 0.06/5/100 at 28° C. for 75 seconds. Then, it was immersed in an aqueous solution containing potassium iodide/boric acid/water at a weight ratio of 10.5/7.5/100 at 72° C. for 300 seconds. Subsequently, it was washed with pure water of 10° C. for 5 seconds, then, dried at 95° C. for 152 seconds, to fabricate a polarizer (2) in which iodine was adsorbed and oriented in polyvinyl alcohol.
[Production of Polarizer (3)]

A polyvinyl alcohol film having an average degree of polymerization of about 2400, a degree of saponification of 99.9

LC242

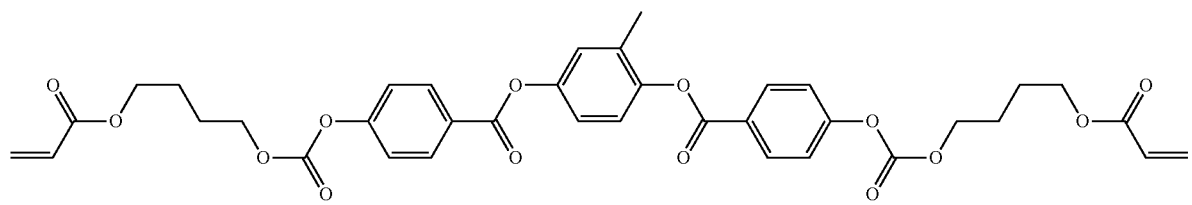

mol % or more and a thickness of 75 μm was uniaxially drawn about 5 times in dry mode, further, immersed in pure water of 60° C. for 1 minute while keeping tensed condition, then, immersed in an aqueous solution containing iodine/potassium iodide/water at a weight ratio of 0.07/5/100 at 28° C. for 75 seconds. Then, it was immersed in an aqueous solution containing potassium iodide/boric acid/water at a weight ratio of 10.5/7.5/100 at 72° C. for 300 seconds. Subsequently, it was washed with pure water of 10° C. for 5 seconds, then, dried at 95° C. for 152 seconds, to fabricate a polarizer (3) in which iodine was adsorbed and oriented in polyvinyl alcohol.

[Production of Optically Anisotropic Film (1)]

The surface of a cycloolefin polymer film (ZF-14 manufactured by ZEON Corporation, thickness 23 μm) not subjected to a drawing treatment was treated once under conditions of an output of 0.3 kW and a treating speed of 3 m/min using a corona treatment apparatus (AGF-B10, manufactured by Kasuga Electric Works Ltd.). On the surface having undergone the corona treatment, a photo-orientation film forming composition (1) was coated by a bar coater and dried at 80° C. for 1 minute, and subjected to polarization UV exposure using a polarization UV irradiation apparatus (SPOT CURE SP-7; manufactured by Ushio Inc.) at an accumulated light quantity of 100 mJ/cm$^2$. The thickness of the resultant orientation film was measured by a laser microscope (LEXT, manufactured by Olympus Corporation) to find a value of 100 nm. Subsequently, a phase difference layer forming composition (A-1) was coated on the orientation film using a bar coater and dried at 120° C. for 1 minute, then, irradiated with ultraviolet (under nitrogen atmosphere, wavelength: 365 nm, accumulated light quantity at a wavelength of 365 nm: 1000 mJ/cm$^2$) using a high pressure mercury lamp (UNICURE VB-15201BY-A, manufactured by Ushio Inc.) to form a first coating layer. The thickness of thus obtained first coating layer was measured by a laser microscope to find a value of 2.2 μm. The phase difference values of this film were measured at wavelengths of 450 nm, 550 nm and 650 nm, to find that Re(450)=124 nm, Re(550)=142 nm, Re(650)=148 nm. Calculation was carried out according to the above-described formulae (1), (2) and (3) using these measured values, to obtain the results as described below.

$Re(450)/Re(550)=0.88$ $Re(650)/Re(550)=1.03$

[Production of Optically Anisotropic Film (2)]

The surface of a cycloolefin polymer film (COP) was treated once under conditions of an output of 0.3 kW and a treating speed of 3 m/min using a corona treatment apparatus. On the surface having undergone the corona treatment, an orienting polymer composition (1) was coated by a bar coater and dried at 90° C. for 1 minute. The thickness of the resultant orientation film was measured by a laser microscope (LEXT, manufactured by Olympus Corporation) to find a value of 34 nm. Subsequently, a composition (B-1) was coated on the orientation film using a bar coater and dried at 90° C. for 1 minute, then, irradiated with ultraviolet (under nitrogen atmosphere, wavelength: 365 nm, accumulated light quantity at a wavelength of 365 nm: 1000 mJ/cm$^2$) using a high pressure mercury lamp (UNICURE VB-15201BY-A, manufactured by Ushio Inc.) to form a coating layer. The thickness of the resultant coating layer was measured by a laser microscope, to find a value of 450 nm. The phase difference value of the resultant optically anisotropic film (2) at a wavelength of 550 nm was measured, to find that Re(550)=1 nm, Rth (550)=−70 nm. That is, the coating layer has an optical property represented by the following formula (4). Since the phase difference value at a wavelength of 550 nm of COP is approximately 0, it does not affect the optical property.

$nx \approx ny < nz$ (4)

[Production of Optically Anisotropic Film (3)]

On COP of the optically anisotropic film (1), a second coating layer was formed in the same manner as in Example 3. The phase difference values of the resultant optically anisotropic film (3) at wavelengths of 450 nm, 550 nm and 650 nm were measured, to find that Re(450)=122 nm, Re(550)=138 nm, Re(650)=141 nm, Rth(450)=16.9 nm, Rth(550)=1.2 nm, Rth(650)=4.8 nm (For Rth, phase difference value when inclined 40° around the fast axis of the coating layer).

[Production of Optically Anisotropic Film (4)]

On a triacetylcellulose film (manufactured by Konica Minolta Inc., KC4UY TAC, 40 μm), a first coating layer was formed in the same manner as in Example 1 excepting that a phase difference layer forming composition (B-1) was used. The thickness of thus obtained first coating layer was measured by a laser microscope, to find a value of 2.0 μm. Further, on the first coating layer, a corona treatment and an orienting treatment were performed in the same manner as described above, and a phase difference layer forming composition (B-1) was used to form a second coating layer. The thickness of thus obtained first coating layer was measured by a laser microscope, to find a value of 1.0 μm. In this procedure, the polarization direction of the second polarization UV irradiation was set to make an angle of 60° to the optical axis (slow axis) of the first coating layer, and the slow axis of the first coating layer and the slow axis of the second coating layer were adjusted to cross at an angle of 60°. The phase difference values of thus obtained optical film (3) were measured at wavelengths of 450 nm, 550 nm and 650 nm, to find that Re(450)=102 nm, Re(550)=138 nm, Re(650)=161 nm. Calculation was carried out according to the above-described formulae (1), (2) and (3) using these measured values, to find the results as described below.

$Re(450)/Re(550)=0.74$ $Re(650)/Re(550)=1.17$

[Production of Optically Anisotropic Film (5)]

A third coating layer 3 was formed in the same manner as in Example 3 on the TAC film of the optically anisotropic film (4). The phase difference values of the resultant optically anisotropic film (5) at wavelengths of 450 nm, 550 nm and 650 nm were measured, to find that Re(450)=100 nm, Re(550)=137 nm, Re(650)=160 nm.

[Production of Optically Anisotropic Film (6)]

A coating layer was formed in the same manner as in Example 3 excepting that PURE-ACE (registered trademark) WR-S film (manufactured by Teijin Limited) was used. The phase difference values of the resultant optically anisotropic film (6) were measured at wavelengths of 450 nm, 550 nm and 650 nm, to find that Re(450)=127 nm, Re(550)=142 nm, Re(650)=145 nm, Rth(450)=18.5 nm, Rth(550)=3.7 nm, Rth (650)=4.1 nm. (For Rth, phase difference value when inclined 40° around the fast axis of WR-S film).

[Production of Elliptical Polarization Plate (1)]

The polarizer (1) obtained as described above and the saponified triacetylcellulose film (manufactured by Konica Minolta Inc. KC4UY TAC, 40 μm) as a transparent protective film were pasted together via an aqueous adhesive by nip rolls. In this operation, the COP surface of the optically anisotropic film (1) was previously treated once with corona under conditions of an output of 0.3 kW and a treating speed of 3 m/min. The resultant pasted material was dried at 60° C. for 2 minutes while keeping the tension thereof at 430 N/m, to obtain an elliptical polarization plate (1) having a transparent film pasted to one surface of the polarizer and the optically anisotropic film 1 pasted to the other surface. The aqueous adhesive was prepared by adding 3 parts of a carboxyl group-modified polyvinyl alcohol (manufactured by Kuraray Co., Ltd., Kuraray POVAL KL318) and 1.5 parts of a water-soluble polyamide epoxy resin (manufactured by Sumika Chemtex Co., Ltd., Sumirez Resin 650, aqueous solution having a solid concentration of 30%) to 100 parts of water. Lamination was so carried out that the slow axis of the coating layer of the optically anisotropic film (1) and the absorption axis of the polarizer 1 crossed at 45°.

The visibility corrected single body transmittance, the visibility corrected polarization degree, the single body hue a* and the single body hue value b* of the resultant elliptical polarization plate (1) were measured. These results are shown in Table 3. Further, the coating layer side was pasted to a mirror via a sticky agent, and the reflectance and the reflection hue value a* and the reflection hue value b* were measured. These results are shown in Table 4.

[Measurement of Visibility Corrected Single Body Transmittance, Visibility Corrected Polarization Degree, Single Body Hue, Reflectance, Reflection Hue]

Linear polarization from a prism was rendered incident on the elliptical polarization plate from the side of the transparent protective film, and the visibility corrected single body transmittance, the visibility corrected polarization degree and the single body hues of the elliptical polarization plate were measured by a spectrophotometer equipped with integrating sphere (manufactured by JASCO Corporation, V7100). The MD transmittance and the TD transmittance were determined in the range of wavelengths of 380 nm to 780 nm, and the single body transmittance and the polarization degree at respective wavelengths were calculated according to the formula (A) and the formula (B). Further, the visibility was corrected by the two-degree field (C light source) of JISZ8701, and the visibility corrected single body transmittance (Ty) and the visibility corrected polarization degree (Py) were determined. Further, according to JIS-Z8729J, the single body hue a* and the single body hue b* were calculated. Here, "MD transmittance" means transmittance when the direction of polarization from the Glan-Thompson prism and the transmission axis of a polarization plate sample are made parallel. In the formula (A) and the formula (B), "MD transmittance" is described as "MD". Further, "TD transmittance" means transmittance when the direction of polarization from the Glan-Thompson prism and the transmission axis of a polarization plate sample cross orthogonally, and in the formula (A) and the formula (B), "TD transmittance" is described as "TD".

$$\text{single body transmittance (1)} = (MD + TD)/2 \quad \text{formula (A)}$$

$$\text{polarization degree (\%)} = \{(MD - TD)/(MD + TD)\} \times 100 \quad \text{formula (B)}$$

Further, hues a* and b* are obtained as follows: Values in the XYZ color system are obtained by applying the data of a light source spectrum to the following formulae (C) to (F) prescribed in JIS standard Z8701, further, three stimulation values X, Y and Z are applied to the following formulae (G) and (H) prescribed in JIS standard Z8729 and the single body hue a* and the single body hue b* are calculated.

$$X = K \int_{380}^{780} S(\lambda)\bar{x}(\lambda)T(\lambda)d\lambda \quad (C)$$

$$Y = K \int_{380}^{780} S(\lambda)\bar{y}(\lambda)T(\lambda)d\lambda \quad (D)$$

$$Z = K \int_{380}^{780} S(\lambda)\bar{z}(\lambda)T(\lambda)d\lambda \quad (E)$$

$$K = \frac{100}{\int_{380}^{780} S(\lambda)\bar{y}(\lambda)d\lambda} \quad (F)$$

$$a^* = 500\{f(X/Xn) - f(Y/Yn)\} \quad (G)$$

$$b^* = 200\{f(Y/Yn) - f(Z/Zn)\} \quad (H)$$

If $X/Xn > 0.008856$, then, $f(X/Xn) = (X/Xn)1/3$
If $X/Xn \leq 0.008856$, then, $f(X/Xn) = 7.787 \times (X/Xn) + 16/116$
If $Y/Yn > 0.008856$, then, $f(Y/Yn) = (Y/Yn)1/3$
If $Y/Yn \leq 0.008856$, then, $f(Y/Yn) = 7.787 \times (Y/Yn) + 16/116$
If $Z/Zn > 0.008856$, then, $f(Z/Zn) = (Z/Zn)1/3$
If $Z/Zn \leq 0.008856$, then, $f(Z/Zn) = 7.787 \times (Z/Zn) + 16/116$ Here, $S(\lambda)$ represents spectral distribution of a light source (C light source).

$$\bar{x}(\lambda), \bar{y}(\lambda), \bar{z}(\lambda)$$

are the color-matching functions in the XYZ color system, and $T(\lambda)$ is the spectral solid angle transmittance. Further, X, Y and Z are XYZ three stimulation values of the subject film. Xn, Yn and Zn are XYZ three stimulation values of a spectrophotometer light source (C light source).

An elliptical polarization plate is pasted to a mirror, and under this state, light is rendered incident from the direction of 12° at the side of the transparent protective film, and the reflectance and the reflection hue of the elliptical polarization plate were measured by a spectrophotometer (manufactured by Shimadzu Corp., UV3150). Calculation of the hue was carried out in the same manner as described above from the above-described spectrum.

Example 2

[Production of Elliptical Polarization Plate (2)]

An elliptical polarization plate (2) was produced in the same manner as in Example 1 excepting that the polarizer (2) is used instead of the polarizer (1). The visibility corrected single body transmittance, the visibility corrected polarization degree, the single body hue value a* and the single body hue value b* of the resultant elliptical polarization plate (2) were measured. The results are shown in Table 3. Further, the coating layer side was pasted to a mirror via a sticky agent, and the reflectance and the reflection hue value a* and the reflection hue value b* were measured. The results are shown in Table 4.

Example 3

[Production of Elliptical Polarization Plate (3)]

An elliptical polarization plate (3) was produced in the same manner as in Example 1 excepting that the polarizer (3) is used instead of the polarizer (1). The visibility corrected single body transmittance, the visibility corrected polarization degree, the single body hue value a* and the single body hue value b* of the resultant elliptical polarization plate (3) were measured. The results are shown in Table 3. Further, the coating layer side was pasted to a mirror via a sticky agent, and the reflectance and the reflection hue value a* and the reflection hue value b* were measured. The results are shown in Table 4.

Example 4

[Production of Elliptical Polarization Plate (4)]

The COP surface of the optically anisotropic film (2) was pasted via a sticky agent to the coating layer of the elliptical polarization plate (3) obtained in Example 3, to fabricate an elliptical polarization plate (4). The visibility corrected single body transmittance, the visibility corrected polarization degree, the single body hue value a* and the single body hue value b* of the resultant elliptical polarization plate (4) were measured. The results are shown in Table 3. Further, the coating layer side was pasted to a mirror via a sticky agent, and the reflectance and the reflection hue value a* and the reflection hue value b* were measured. The results are shown in Table 4.

Example 5

[Production of Elliptical Polarization Plate (5)]

A first coating layer and a polarizer were adhered to fabricate an elliptical polarization plate (5) in the same manner as in Example 3 excepting that the optically anisotropic film (3) was used instead of the optically anisotropic film (1). The visibility corrected single body transmittance, the visibility corrected polarization degree, the single body hue value a* and the single body hue value b* of the elliptical polarization plate (5) were measured. The results are shown in Table 3. Further, the coating layer side was pasted to a mirror via a sticky agent, and the reflectance and the reflection hue value a* and the reflection hue value b* were measured. The results are shown in Table 4.

Example 6

[Production of Elliptical Polarization Plate (6)]

An elliptical polarization plate (6) was fabricated in the same manner as in Example 3 excepting that the optically anisotropic film (4) was used instead of the optically anisotropic film (1). The slow axis of the first coating layer of the optically anisotropic film (4) and the absorption axis of the polarizer (3) were controlled to cross at an angle of 15°. The visibility corrected single body transmittance, the visibility corrected polarization degree, the single body hue value a* and the single body hue value b* of the elliptical polarization plate (6) were measured. The results are shown in Table 3. Further, the coating layer side was pasted to a mirror via a sticky agent, and the reflectance and the reflection hue value a* and the reflection hue value b* were measured. The results are shown in Table 4.

Example 7

[Production of Elliptical Polarization Plate (7)]

The COP surface of the optically anisotropic film (2) was pasted via a sticky agent onto the second coating layer of the elliptical polarization plate (6) obtained in Example 5, to fabricate an elliptical polarization plate (7). The visibility corrected single body transmittance, the visibility corrected polarization degree, the single body hue value a* and the single body hue value b* of the resultant elliptical polarization plate (7) were measured. The results are shown in Table 2. Further, the coating layer side was pasted to a mirror via a sticky agent, and the reflectance and the reflection hue value a* and the reflection hue value b* were measured. The results are shown in Table 4.

Example 8

[Production of Elliptical Polarization Plate (8)]

A third coating layer and a polarizer were adhered to fabricate an elliptical polarization plate (8) in the same manner as in Example 3 excepting that the optically anisotropic film (5) was used instead of the optically anisotropic film (1). The slow axis of the first coating layer of the optically anisotropic film (5) and the absorption axis of the polarizer (3) were controlled so as to cross at an angle of 15°. The visibility corrected single body transmittance, the visibility corrected polarization degree, the single body hue value a* and the single body hue value b* of the elliptical polarization plate (8) were measured. The results are shown in Table 3. Further, the coating layer side was pasted to a mirror via a sticky agent, and the reflectance and the reflection hue value a* and the reflection hue value b* were measured. The results are shown in Table 4.

Example 9

[Production of Elliptical Polarization Plate (9)]

A triacetylcellulose film and a polarizer were adhered to fabricate an elliptical polarization plate (9) in the same manner as in Example 3 excepting that the resultant optically anisotropic film (6) was used. The visibility corrected single body transmittance, the visibility corrected polarization degree, the single body hue value a* and the single body hue value b* of the elliptical polarization plate (9) were measured. The results are shown in Table 3. Further, the coating layer side was pasted to a mirror via a sticky agent, and the reflectance and the reflection hue value a* and the reflection hue value b* were measured. The results are shown in Table 4.

Reference Example

[Production of Elliptical Polarization Plate (10)]

An elliptical polarization plate (10) was fabricated in the same manner as in Example 1 excepting that a uniaxially drawn cycloolefin film (manufactured by ZEON Corporation, Zeonor film, Ro=137 nm) and the polarizer (3) were used. The visibility corrected single body transmittance, the visibility corrected polarization degree, the single body hue value a* and the single body hue value b* of the elliptical polarization plate (10) were measured. The results are shown in Table 3. Further, the cycloolefin film side was pasted to a mirror via a sticky agent, and the reflectance and the reflection hue value a* and the reflection hue value b* were measured. The results are shown in Table 4.

TABLE 3

| | | polarizer | optically anisotropic film | visibility correcting transmittance | visibility correcting polarization degree | single body hue a* | single body hue b* |
|---|---|---|---|---|---|---|---|
| example 1 | elliptical polarization plate 1 | polarizer 1 | optically anisotropic film 1 | 45.1% | 96.60% | −1.2 | 2.3 |

TABLE 3-continued

| | polarizer | optically anisotropic film | visibility correcting transmittance | visibility correcting polarization degree | single body hue a* | single body hue b* |
|---|---|---|---|---|---|---|
| example 2 | elliptical polarization plate 2 | polarizer 2 | optically anisotropic film 1 | 44.0% | 98.50% | −1.3 | 2.5 |
| example 3 | elliptical polarization plate 3 | polarizer 3 | optically anisotropic film1 | 43.5% | 99.95% | −1.5 | 4.5 |
| example 4 | elliptical polarization plate 4 | polarizer 3 | optically anisotropic film 1 optically anisotropic film 2 | 43.7% | 99.95% | −1.6 | 4.7 |
| example 5 | elliptical polarization plate 5 | polarizer 3 | optically anisotropic film 3 | 43.6% | 99.95% | −1.7 | 4.7 |
| example 6 | elliptical polarization plate 6 | polarizer 3 | optically anisotropic film 4 | 43.5% | 99.85% | −1.6 | 4.3 |
| example 7 | elliptical polarization plate 7 | polarizer 3 | optically anisotropic film 4 optically anisotropic film 2 | 43.6% | 99.87% | −1.5 | 4.5 |
| example 8 | elliptical polarization plate 8 | polarizer 3 | optically anisotropic film 5 | 43.5% | 99.81% | −1.5 | 4.3 |
| example 9 | elliptical polarization plate 9 | polarizer 3 | optically anisotropic film 6 | 43.5% | 99.84% | −1.3 | 4.1 |
| reference Example | elliptical polarization plate 10 | polarizer 3 | uniaxially drawn COP | 43.5% | 99.99% | −1.5 | 4.1 |

TABLE 4

| | polarizer | optically anisotropic film | 450 nm reflection transmittance | 550 nm reflection transmittance | 650 nm reflection transmittance | reflection hue a* | reflection hue b* |
|---|---|---|---|---|---|---|---|
| example 1 | elliptical polarization plate 1 | polarizer 1 | optically anisotropic film 1 | 6.4% | 5.4% | 7.9% | 2.8 | −2.8 |
| example 2 | elliptical polarization plate 2 | polarizer 2 | optically anisotropic film 1 | 6.1% | 4.7% | 6.0% | 0.9 | −4.5 |
| example 3 | elliptical polarization plate 3 | polarizer 3 | optically anisotropic film1 | 5.4% | 4.5% | 5.4% | 0.9 | −3.4 |
| example 4 | elliptical polarization plate 4 | polarizer 3 | optically anisotropic film 1 optically anisotropic film 2 | 4.9% | 4.4% | 5.8% | 2.6 | −1.4 |
| example 5 | elliptical polarization plate 5 | polarizer 3 | optically anisotropic film 3 | 4.8% | 4.4% | 5.7% | 2.4 | −1.2 |
| example 6 | elliptical polarization plate 6 | polarizer 3 | optically anisotropic film 4 | 8.8% | 4.6% | 4.5% | 8.6 | −16.5 |
| example 7 | elliptical polarization plate 7 | polarizer 3 | optically anisotropic film 4 optically anisotropic film 2 | 7.6% | 4.3% | 4.2% | 8.0 | −14.7 |
| example 8 | elliptical polarization plate 8 | polarizer 3 | optically anisotropic film 5 | 7.7% | 4.4% | 4.3% | 8.1 | −14.8 |

TABLE 4-continued

| | polarizer | optically anisotropic film | 450 nm reflection transmittance | 550 nm reflection transmittance | 650 nm reflection transmittance | reflection hue a* | reflection hue b* |
|---|---|---|---|---|---|---|---|
| example 9 | elliptical polarization plate 9 | polarizer 3 | optically anisotropic film 6 | 6.7% | 5.1% | 5.8% | 1.3 | −5.2 |
| reference Example | elliptical polarization plate 10 | polarizer 3 | uniaxially drawn COP | 10.9% | 4.5% | 5.6% | 9.7 | −20.2 |

INDUSTRIAL APPLICABILITY

The laminate produced according to the present invention can be used for fabricating a thin elliptical polarization plate simply and easily, and is excellent in an anti-reflection property in bright place when observed from any directions, and useful.

EXPLANATION OF REFERENCES 1 first optically anisotropic layer
2 positive layer C
3, 3' base plate
4 layer A
5 layer B
6 polarizer
7 organic EL panel
110 present elliptical polarization plate
200 organic EL display
30 organic EL display
31 present elliptical polarization plate
32 base plate
33 interlayer insulation film
34 pixel electrode
35 light emitting layer
36 cathode electrode
37 sealing layer
38 thin film transistor
39 rib

The invention claimed is:

1. An elliptical polarization plate having a transparent protective film pasted to one surface of a polarizer and an optically anisotropic film pasted to the other surface, wherein, when measured under condition of incident polarization in the film normal direction from the side of the transparent protective film,
the visibility corrected single body transmittance is 43.0% or more,
the visibility corrected polarization degree is 95.0% or more,
the single body hue value a* is −2.0 to 1.0,
the single body hue value b* is −1.0 to 5.0,
and the optically anisotropic film satisfies the formulae (1), (2) and (3):

$$Re(450)/Re(550) \leq 1.00 \quad (1)$$

$$1.00 \leq Re(650)/Re(550) \quad (2)$$

$$100 < Re(550) < 160 \quad (3)$$

wherein Re(450) represents the in-plane phase difference value at a wavelength of 450 nm, Re(550) represents the in-plane phase difference value at a wavelength of 550 nm, and Re(650) represents the in-plane phase difference value at a wavelength of 650 nm.

2. The elliptical polarization plate according to claim 1, wherein the optically anisotropic film has a coating layer formed by polymerizing a polymerizable liquid crystal.

3. The elliptical polarization plate according to claim 2, wherein the thickness of the coating layer is 5 μm or less.

4. The elliptical polarization plate according to claim 1, wherein the optically anisotropic film has two coating layers.

5. The elliptical polarization plate according to claim 1, wherein the optically anisotropic film has a coating layer satisfying the following formula (4):

$$nx \approx ny < nz \quad (4)$$

wherein, nx represents the principal refractive index in a direction parallel to the film plane in an index ellipsoid formed by a phase difference layer, ny represents the refractive index in a direction parallel to the film plane and orthogonally crossing the direction of nx in an index ellipsoid formed by a phase difference layer, and nz represents the refractive index in a direction vertical to the film plane in an index ellipsoid formed by a phase difference layer.

6. The elliptical polarization plate according to claim 5, wherein the thickness of the coating layer satisfying the formula (4) is 2 μm or less.

7. The elliptical polarization plate according to claim 1, wherein the optically anisotropic film has three or more coating layers.

8. The elliptical polarization plate according to claim 1, wherein the optically anisotropic film has a coating layer formed by polymerizing a polymerizable liquid crystal on a drawn film.

9. A method of producing the elliptical polarization plate according to claim 1, wherein a long polarizer, a long transparent protective film and a long optically anisotropic film are pasted continuously.

10. An organic EL display having the elliptical polarization plate according to claim 1.

11. An organic EL display equipped with touch panel, having the elliptical polarization plate according to claim 1.

* * * * *